US012782611B2

(12) United States Patent
Hatsumi et al.

(10) Patent No.: US 12,782,611 B2
(45) Date of Patent: Nov. 3, 2026

(54) DISPLAY DEVICE, DISPLAY MODULE, AND ELECTRONIC DEVICE

(71) Applicant: SEMICONDUCTOR ENERGY LABORATORY CO., LTD., Atsugi (JP)

(72) Inventors: Ryo Hatsumi, Hadano (JP); Taisuke Kamada, Niiza (JP); Daisuke Kubota, Atsugi (JP); Rai Sato, Tochigi (JP); Hiroki Adachi, Tochigi (JP); Ryo Yamauchi, Atsugi (JP); Kazunori Watanabe, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 328 days.

(21) Appl. No.: 18/672,210

(22) Filed: May 23, 2024

(65) Prior Publication Data

US 2024/0315108 A1 Sep. 19, 2024

Related U.S. Application Data

(63) Continuation of application No. 17/428,736, filed as application No. PCT/IB2020/050823 on Feb. 3, 2020, now Pat. No. 12,048,227.

(30) Foreign Application Priority Data

Feb. 15, 2019 (JP) ................................ 2019-025779
May 10, 2019 (JP) ................................ 2019-089525
(Continued)

(51) Int. Cl.
*G02B 5/00* (2006.01)
*G09G 3/30* (2006.01)
(Continued)

(52) U.S. Cl.
CPC ............... *G02B 5/003* (2013.01); *G09G 3/30* (2013.01); *G09G 3/3208* (2013.01); *H10K 59/30* (2023.02);
(Continued)

(58) Field of Classification Search
CPC ........ G02B 5/003; H10K 59/65; H10K 59/30; H10K 59/60; H10K 59/8792
(Continued)

(56) References Cited

U.S. PATENT DOCUMENTS 8,994,891 B2 * 3/2015 Yamazaki ............ G02F 1/1368 349/69
9,082,861 B2 * 7/2015 Yamazaki .......... H10D 30/6755
(Continued)

FOREIGN PATENT DOCUMENTS

CN 101753861 A 6/2010
CN 104751155 A 7/2015
(Continued)

OTHER PUBLICATIONS

International Search Report (Application No. PCT/IB2020/050823) Dated Mar. 31, 2020.
(Continued)

*Primary Examiner* — Jami Valentine Miller
(74) *Attorney, Agent, or Firm* — Fish & Richardson P.C.

(57) ABSTRACT

A display device having a function of sensing light is provided. The display device includes a first substrate, a second substrate, a light-receiving element, a light-emitting element, a resin layer, and a light shielding layer. The light-receiving element, the light-emitting element, the resin layer, and the light shielding layer are each positioned between the first substrate and the second substrate. The light-receiving element includes a first pixel electrode over the first substrate, an active layer over the first pixel elec-
(Continued)

trode, and a common electrode over the active layer. The light-emitting element includes a second pixel electrode over the first substrate, a first light-emitting layer over the first substrate, a first light-emitting layer over the second pixel electrode, and the common electrode over the first light-emitting layer. The resin layer and the light shielding layer are each positioned between the common electrode and the second substrate. The resin layer includes a portion overlapping with the light-emitting element. The light shielding layer includes a portion positioned between the common electrode and the resin layer. The resin layer includes a portion overlapping with the light-receiving element or is provided in an island shape. At least part of light passing through the second substrate enters the light-receiving element without through the resin layer.

18 Claims, 41 Drawing Sheets

(30) Foreign Application Priority Data

Sep. 26, 2019 (JP) ................................ 2019-174866
Nov. 13, 2019 (JP) ................................ 2019-205430
Nov. 26, 2019 (JP) ................................ 2019-213694

(51) Int. Cl.
*G09G 3/3208* (2016.01)
*H10K 59/30* (2023.01)
*H10K 59/60* (2023.01)
*H10K 59/65* (2023.01)
*H10K 59/80* (2023.01)

(52) U.S. Cl.
CPC ............. *H10K 59/60* (2023.02); *H10K 59/65* (2023.02); *H10K 59/8792* (2023.02); *G09G 2360/142* (2013.01); *H10K 59/875* (2023.02)

(58) Field of Classification Search
USPC ............................................................ 257/40
See application file for complete search history.

(56) References Cited

U.S. PATENT DOCUMENTS 9,088,006 B2 7/2015 Yamazaki et al.
9,155,498 B2 10/2015 Akiyama
9,293,589 B2 * 3/2016 Yamazaki .......... H10D 30/6704
9,450,133 B2 9/2016 Nakamura et al.
9,559,239 B2 1/2017 Yamamoto
9,858,028 B2 1/2018 Ikeda et al.
9,965,669 B2 5/2018 Yamamoto
10,096,720 B2 * 10/2018 Ando ................. H10D 30/6734
10,115,777 B2 10/2018 Tanaka et al.
10,159,135 B2 * 12/2018 Ikeda ..................... H05B 33/12
10,248,261 B2 4/2019 Liu et al.
10,592,193 B2 3/2020 Ikeda et al.
11,232,277 B2 * 1/2022 Zeng .................. G06V 40/1318
11,861,125 B2 * 1/2024 An ........................ G06F 3/0412
11,887,400 B2 1/2024 Niu et al.
2004/0042707 A1 3/2004 Imai et al.
2005/0253790 A1 11/2005 Uchida
2006/0262242 A1 11/2006 Koma
2008/0252223 A1 10/2008 Toyoda et al.
2008/0309850 A1 12/2008 Tanase et al.
2009/0141004 A1 6/2009 Yamazaki
2010/0033450 A1 2/2010 Koyama et al.
2010/0085331 A1 4/2010 Kurokawa et al.
2010/0117991 A1 5/2010 Koyama et al.
2010/0134735 A1 6/2010 Nakamura et al.
2010/0156850 A1 6/2010 Kurokawa
2010/0182282 A1 7/2010 Kurokawa et al.
2010/0220041 A1 9/2010 Smith
2010/0225615 A1 9/2010 Kurokawa
2011/0001725 A1 1/2011 Kurokawa
2011/0043464 A1 2/2011 Lee et al.
2011/0043473 A1 2/2011 Kozuma
2011/0096009 A1 4/2011 Kurokawa et al.
2011/0148835 A1 6/2011 Yamazaki
2012/0085890 A1 4/2012 Kurokawa
2012/0119073 A1 5/2012 Kurokawa et al.
2013/0119373 A1 * 5/2013 Yamazaki .......... H10D 30/6755 257/E29.296
2013/0187153 A1 * 7/2013 Yamazaki .......... H10D 30/6704 257/43
2013/0240873 A1 * 9/2013 Yamazaki .......... H10D 30/6706 257/43
2013/0300714 A1 * 11/2013 Goh ...................... G06F 3/0421 345/175
2013/0308073 A1 * 11/2013 Yamazaki ............ G02F 1/1368 257/40
2014/0085277 A1 3/2014 Iwaki
2014/0340363 A1 11/2014 Ikeda et al.
2015/0187980 A1 7/2015 Yamamoto
2015/0346897 A1 12/2015 Irri et al.
2016/0093678 A1 3/2016 Seo et al.
2016/0103649 A1 * 4/2016 Yoshitani ............. G06F 3/0412 345/694
2016/0174847 A1 6/2016 Tsuchiya
2016/0190055 A1 * 6/2016 Jinbo ...................... G06F 3/012 257/750
2017/0025444 A1 1/2017 Hirakata
2017/0032728 A1 2/2017 Shima et al.
2017/0098689 A1 4/2017 Ikeda et al.
2017/0125506 A1 5/2017 Kim
2017/0235381 A1 8/2017 Katagiri
2017/0278973 A1 * 9/2017 Ando ................. H10D 30/6734
2017/0288001 A1 10/2017 Ito
2017/0330920 A1 11/2017 Tanaka et al.
2017/0365224 A1 12/2017 Okamoto
2017/0373036 A1 12/2017 Yamazaki et al.
2018/0012943 A1 1/2018 Ikeda et al.
2018/0247981 A1 8/2018 Yamaoka et al.
2018/0299982 A1 10/2018 Liu et al.
2019/0013368 A1 1/2019 Chung et al.
2019/0123120 A1 4/2019 Oh et al.
2020/0357863 A1 11/2020 Nakamura et al.
2021/0174049 A1 * 6/2021 Hai .................... G06V 40/1318

FOREIGN PATENT DOCUMENTS

CN 107045628 A 8/2017
CN 108598111 A 9/2018
CN 108962951 A 12/2018
CN 109216421 A 1/2019
EP 3425670 A 1/2019
JP 2003-330383 A 11/2003
JP 2006-251201 A 9/2006
JP 2007-081203 A 3/2007
JP 2008-194949 A 8/2008
JP 2010-153834 A 7/2010
JP 2014-197522 A 10/2014
JP 2015-125663 A 7/2015
JP 2017-208173 A 11/2017
JP 2018-037356 A 3/2018
JP 2019-033071 A 2/2019
KR 2010-0061393 A 6/2010
KR 2016-0010356 A 1/2016
KR 2019-0004678 A 1/2019
TW 201036151 10/2010
TW 201603262 1/2016
TW 201947290 12/2019
WO WO-2015/144298 10/2015
WO WO-2019/205592 10/2019

OTHER PUBLICATIONS

Written Opinion (Application No. PCT/IB2020/050823) Dated Mar. 31, 2020.

(56) References Cited

OTHER PUBLICATIONS

Akkerman.H et al., “Printed Organic Photodetector Arrays and their use in Palmprint Scanners”, SID Digest ’18 : SID International Symposium Digest of Technical Papers, May 22, 2018, vol. 49, No. 1, pp. 494-497.
Taiwanese Office Action (Application No. 109103683) Dated Dec. 27, 2023.

* cited by examiner

FIG. 14A
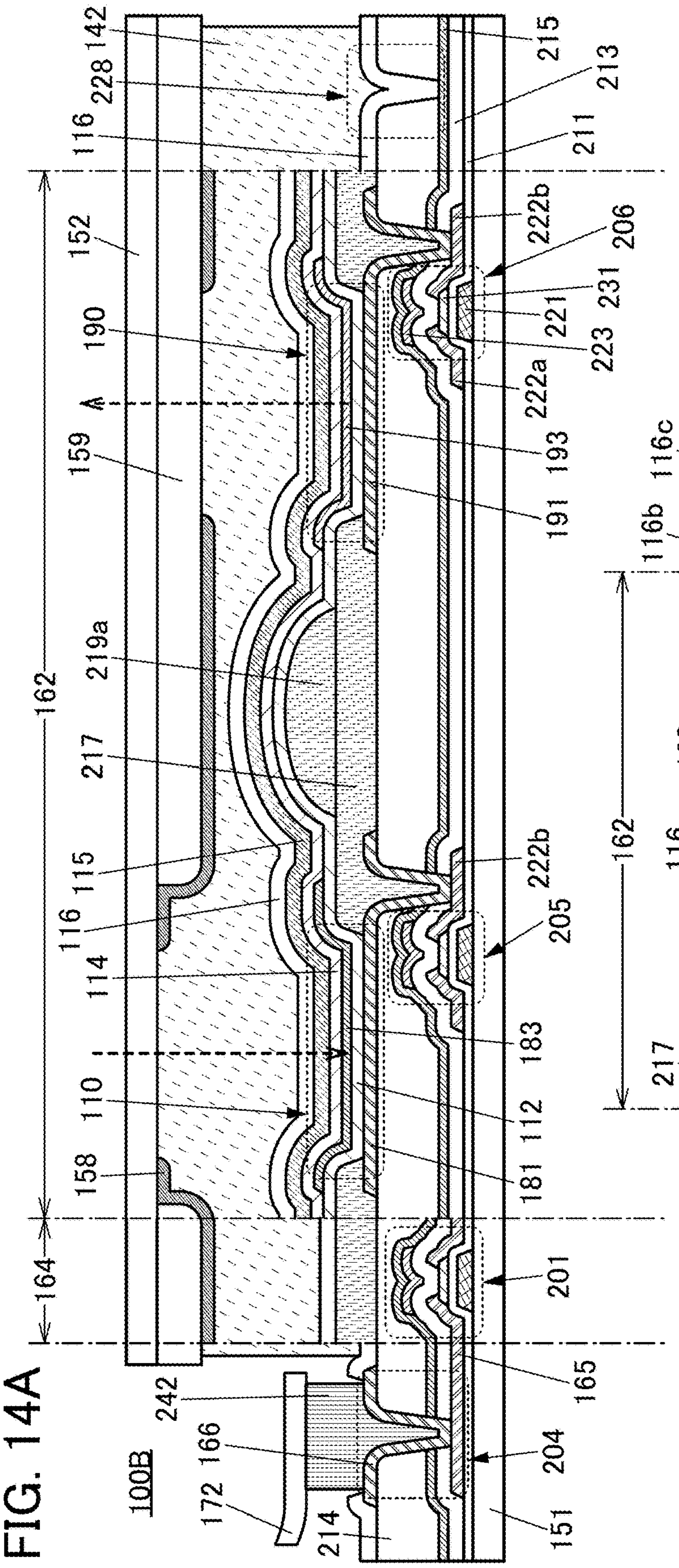
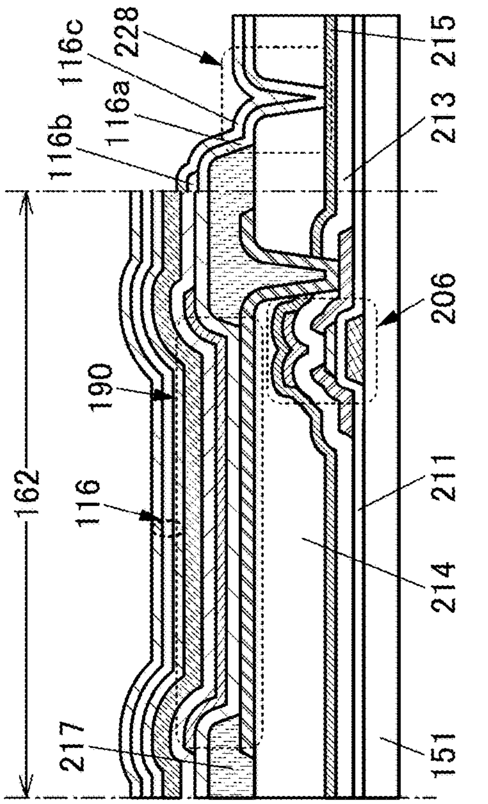
FIG. 14B

100C

DISPLAY DEVICE, DISPLAY MODULE, AND ELECTRONIC DEVICE

CROSS REFERENCE TO RELATED APPLICATIONS

This application is a continuation of U.S. application Ser. No. 17/428,736, filed Aug. 5, 2021, now allowed, which is incorporated by reference and is a U.S. National Phase Application under 35 U.S.C. § 371 of International Application PCT/IB2020/050823, filed on Feb. 3, 2020, which is incorporated by reference and claims the benefit of foreign priority applications filed in Japan on Feb. 15, 2019, as Application No. 2019-025779, on May 10, 2019, as Application No. 2019-089525, on Sep. 26, 2019, as Application No. 2019-174866, on Nov. 13, 2019, as Application No. 2019-205430, and on Nov. 26, 2019, as Application No. 2019-213694.

TECHNICAL FIELD

One embodiment of the present invention relates to a display device, a display module, and an electronic device. One embodiment of the present invention relates to a display device including a light-receiving element and a light-emitting element.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, or a manufacturing method thereof.

BACKGROUND ART

In recent years, application of display devices to a variety of uses has been expected. Examples of uses for a large display device include a television device for home use (also referred to as a TV or a television receiver), digital signage, and a PID (Public Information Display). In addition, a smartphone and a tablet terminal including a touch panel are being developed as portable information terminals.

Light-emitting devices including light-emitting elements have been developed, for example, as display devices. Light-emitting elements (also referred to as EL elements) utilizing an electroluminescence (hereinafter referred to as EL) phenomenon have features such as ease of reduction in thickness and weight, high-speed response to an input signal, and driving with a direct-current low voltage source, and have been used in display devices. For example, Patent Document 1 discloses a flexible light-emitting device including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display device having a function of sensing light. An object of one embodiment of the present invention is to provide a highly convenient display device. An object of one embodiment of the present invention is to provide a multifunctional display device. An object of one embodiment of the present invention is to provide a display device with high display quality. An object of one embodiment of the present invention is to provide a display device with high light sensitivity. An object of one embodiment of the present invention is to provide a novel display device.

Note that the description of these objects does not preclude the existence of other objects. One embodiment of the present invention does not need to achieve all the objects. Other objects can be derived from the descriptions of the specification, the drawings, and the claims.

Means for Solving the Problems

One embodiment of the present invention is a display device including a first substrate, a second substrate, a light-receiving element, a first light-emitting element, a resin layer, and a first light shielding layer. The light-receiving element, the first light-emitting element, the resin layer, and the first light shielding layer are each positioned between the first substrate and the second substrate. The light-receiving element includes a first pixel electrode over the first substrate, an active layer over the first pixel electrode, and a common electrode over the active layer. The first light-emitting element includes a second pixel electrode over the first substrate, a first light-emitting layer over the second pixel electrode, and the common electrode over the first light-emitting layer. The resin layer and the first light shielding layer are each positioned between the common electrode and the second substrate. The resin layer includes an opening overlapping with the light-receiving element. The resin layer includes a portion overlapping with the first light-emitting element. The first light shielding layer includes a portion positioned between the common electrode and the resin layer. The first light shielding layer covers at least part of the opening and at least part of a side surface of the resin layer exposed in the opening.

One embodiment of the present invention is a display device including a first substrate, a second substrate, a light-receiving element, a first light-emitting element, a resin layer, and a first light shielding layer. The light-receiving element, the first light-emitting element, the resin layer, and the first light shielding layer are each positioned between the first substrate and the second substrate. The light-receiving element includes a first pixel electrode over the first substrate, an active layer over the first pixel electrode, and a common electrode over the active layer. The first light-emitting element includes a second pixel electrode over the first substrate, a first light-emitting layer over the second pixel electrode, and the common electrode over the first light-emitting layer. The resin layer and the first light shielding layer are each positioned between the common electrode and the second substrate. The resin layer is provided in an island shape and includes a portion overlapping with the first light-emitting element. The first light shielding layer includes a portion positioned between the common electrode and the resin layer. At least part of light passing through the second substrate enters the light-receiving element without through the resin layer. The first light shielding layer preferably covers at least part of a side surface of the resin layer.

The display device of one embodiment of the present invention preferably further includes an adhesive layer. The adhesive layer is preferably positioned between the common electrode and the second substrate. The resin layer and the first light shielding layer are preferably each positioned between the adhesive layer and the second substrate. The adhesive layer preferably includes a first portion overlapping with the light-receiving element and a second portion overlapping with the first light-emitting element. The first portion is preferably thicker than the second portion.

The display device of one embodiment of the present invention preferably further includes a common layer. The common layer preferably includes a portion positioned between the first pixel electrode and the common electrode, and a portion positioned between the second pixel electrode and the common electrode.

The display device of one embodiment of the present invention preferably further includes a partition wall. The partition wall preferably covers an end portion of the first pixel electrode and an end portion of the second pixel electrode. The partition wall preferably has a function of absorbing at least part of light emitted from the first light-emitting element. Alternatively, the display device of one embodiment of the present invention preferably further includes a partition wall and a second light shielding layer. The partition wall preferably covers an end portion of the first pixel electrode and an end portion of the second pixel electrode. The second light shielding layer preferably includes a portion positioned between the partition wall and the first light shielding layer, and has a function of absorbing at least part of light emitted from the first light-emitting element. The partition wall preferably includes an opening between the light-receiving element and the first light-emitting element in the top view. The second light shielding layer preferably covers the opening of the partition wall. The light-receiving element is preferably surrounded by the second light shielding layer in the top view.

The display device of one embodiment of the present invention preferably further includes a second light-emitting element. The second light-emitting element is preferably positioned between the first substrate and the second substrate. The second light-emitting element preferably includes a third pixel electrode over the first substrate, a second light-emitting layer over the third pixel electrode, and the common electrode over the second light-emitting layer. The first light-emitting element preferably emits light emitted from the first light-emitting layer. The second light-emitting element preferably emits light emitted from the second light-emitting layer.

Alternatively, the display device of one embodiment of the present invention preferably further includes a second light-emitting element, a first coloring layer, and a second coloring layer. The second light-emitting element is preferably positioned between the first substrate and the second substrate. The second light-emitting element preferably includes a third pixel electrode over the first substrate, the first light-emitting layer over the third pixel electrode, and the common electrode over the first light-emitting layer. The first coloring layer and the second coloring layer are preferably each positioned between the common electrode and the second substrate. The light emitted from the first light-emitting element is preferably extracted as light of a first color through the first coloring layer. The light emitted from the second light-emitting element is preferably extracted as light of a second color through the second coloring layer therebetween.

Alternatively, the display device of one embodiment of the present invention preferably further includes a second light-emitting element, a partition wall, a second light shielding layer, and a spacer. The second light-emitting element is preferably positioned between the first substrate and the second substrate. The second light-emitting element preferably includes a third pixel electrode over the first substrate and the common electrode over the third pixel electrode. The partition wall preferably covers an end portion of the first pixel electrode, an end portion of the second pixel electrode, and an end portion of the third pixel electrode. The second light shielding layer preferably includes a portion positioned between the partition wall and the first light shielding layer, and has a function of absorbing at least part of light emitted from the first light-emitting element. The spacer preferably includes a portion positioned between the partition wall and the first light shielding layer. In the top view, the second light shielding layer is preferably positioned between the light-receiving element and the first light-emitting element, and the spacer is preferably positioned between the first light-emitting element and the second light-emitting element. A top surface of the spacer is preferably closer to the second substrate than a top surface of the second light shielding layer is.

The active layer preferably contains an organic compound.

The display device of one embodiment of the present invention preferably further includes a lens. The lens preferably includes a portion overlapping with the light-receiving element.

The display device of one embodiment of the present invention preferably includes the first substrate, the second substrate, the light-receiving element, the first light-emitting element, the resin layer, and the first light shielding layer in a display portion. The display portion preferably has flexibility.

One embodiment of the present invention is a module including the display device having any of the above structures. Examples of the module includes a module provided with a connector such as a flexible printed circuit (hereinafter referred to FPC) or a TCP (Tape Carrier Package), or a module on which an integrated circuit (IC) is implemented by a COG (Chip On Glass) method, a COF (Chip On Film) method, or the like.

One embodiment of the present invention is an electronic device including the above module and at least one of an antenna, a battery, a housing, a camera, a speaker, a microphone, and an operation button.

Effect of the Invention

According to one embodiment of the present invention, a display device having a function of sensing light can be provided. According to one embodiment of the present invention, a highly convenient display device can be provided. According to one embodiment of the present invention, a multifunction display device can be provided. According to one embodiment of the present invention, a display device with high display quality can be provided. According to one embodiment of the present invention, a display device with high light sensitivity can be provided. According to one embodiment of the present invention, a novel display device can be provided.

Note that the description of these effects does not preclude the existence of other effects. One embodiment of the present invention does not need to have all the effects. Other effects can be derived from the descriptions of the specification, the drawings, and the claims.

BRIEF DESCRIPTION OF THE DRAWINGS

FIG. 14A and FIG. 14B are cross-sectional views illustrating examples of a display device.

MODE FOR CARRYING OUT THE INVENTION

Figure 1A:
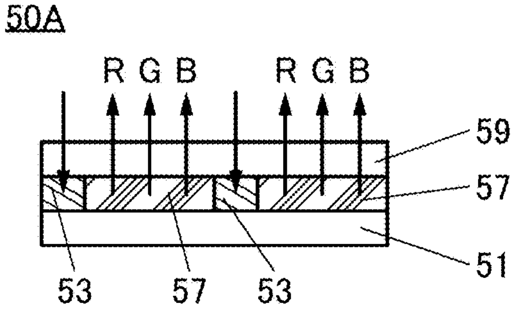
FIG. 1A to FIG. 1D are cross-sectional views illustrating examples of display devices.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term “film” and the term “layer” can be interchanged with each other depending on the case or circumstances. For example, the term “conductive layer” can be changed into the term “conductive film”. As another example, the term “insulating film” can be changed into the term “insulating layer”.

Note that in this specification and the like, the term “light-emitting element” can be changed into the term “light-emitting device”. Similarly, the term “light-receiving element” can be changed into the term “light-receiving device”.

Embodiment 1

In this embodiment, a display device of one embodiment of the present invention will be described with reference to FIG. 1 to FIG. 16.

The display device of this embodiment includes light-receiving elements and light-emitting elements in its display portion. In the display device of this embodiment, the light-emitting elements are arranged in a matrix in the display portion, and an image can be displayed on the display portion. Moreover, the light-receiving elements are arranged in a matrix in the display portion, so that the display portion also has a function of a light-receiving portion. The light-receiving portion can be used as an image sensor or a touch sensor. That is, by sensing light with the light-receiving portion, an image can be captured and the approach or contact of an object (e.g., a finger or a stylus) can be detected. Furthermore, in the display device of this embodiment, the light-emitting elements can be used as a light source of the sensor. Accordingly, a light-receiving portion and a light source do not need to be provided separately from the display device; hence, the number of components of an electronic device can be reduced.

In the display device of this embodiment, when an object reflects light emitted from the light-emitting element included in the display portion, the light-receiving element can sense the reflected light; thus, imaging and touch (and approach) detection are possible even in a dark place.

The display device of this embodiment has a function of displaying an image with the use of a light-emitting element. That is, the light-emitting element functions as a display element.

As the light-emitting element, an EL element such as an OLED (Organic Light Emitting Diode) or a QLED (Quantum-dot Light Emitting Diode) is preferably used. As a light-emitting substance contained in the EL element, a substance emitting fluorescence (a fluorescent material), a substance emitting phosphorescence (a phosphorescent material), an inorganic compound (such as a quantum dot material), a substance exhibiting thermally activated delayed fluorescence (a thermally activated delayed fluorescence (TADF) material), or the like can be given. Alternatively, a light-emitting diode (LED) such as a micro-LED can be used as the light-emitting element.

The display device of this embodiment has a function of sensing light with the use of a light-receiving element.

When the light-receiving element is used as an image sensor, the display device of this embodiment can capture an image using the light-receiving element.

For example, data on a fingerprint, a palm print, an iris, or the like can be acquired with the image sensor. That is, a biological authentication sensor can be incorporated into the display device of this embodiment. When the display device incorporates a biological authentication sensor, the number of components of an electronic device can be reduced as compared to the case where a biological authentication sensor is provided separately from the display device; thus, the size and weight of the electronic device can be reduced.

In addition, data on facial expression, eye movement, change of the pupil diameter, or the like of the user can be acquired with the image sensor. By analysis of the data, data on the user's physical and mental state can be acquired. Changing the output contents of one or both of display and sound on the basis of the data allows the user to safely use a device for VR (Virtual Reality), AR (Augmented Reality), or MR (Mixed Reality), for example.

When the light-receiving element is used as the touch sensor, the display device of this embodiment can detect the approach or contact of an object with the use of the light-receiving element.

As the light-receiving element, a pn photodiode or a pin photodiode can be used, for example. The light-receiving element functions as a photoelectric conversion element that senses light incident on the light-receiving element and generates charge. The amount of generated charge depends on the amount of incident light.

It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

In one embodiment of the present invention, organic EL elements are used as the light-emitting elements, and organic photodiodes are used as the light-receiving elements. The organic EL elements and the organic photodiodes can be formed over one substrate. Thus, the organic photodiodes can be incorporated in the display device including the organic EL elements.

In the display device of one embodiment of the present invention, light emitted from the light-emitting element is extracted through a display surface, and light with which the light-receiving element is irradiated passes through the display surface. The display device preferably includes a light shielding layer closer to the display surface side than a surface on which the light-emitting element and the light-receiving element are provided. Light emitted from the light-emitting element is preferably extracted to the outside of the display device through an opening in the light shielding layer (or a region where the light shielding layer is not provided), and the light-receiving element is preferably irradiated with light passing through an opening in the light shielding layer (or a region where the light shielding layer is not provided).

The light-receiving element senses light that is emitted from the light-emitting element and then reflected by an object. However, in some cases, light emitted from the light-emitting element is reflected inside the display device and enters the light-receiving element without through an object. Such stray light ends up as noise in light detection, causing a reduction in a signal-to-noise ratio (S/N ratio). Providing the light shielding layer closer to the display surface side than the surface on which the light-emitting element and the light-receiving element are provided can inhibit the influence of stray light. Consequently, noise can be reduced, and the sensitivity of a sensor using the light-receiving element can be increased.

As the light shielding layer is positioned closer to the light-emitting element, stray light from the light-emitting element inside the display device can be inhibited and the sensitivity of the sensor can be increased. Furthermore, as the light shielding layer is positioned closer to the light-emitting element, a reduction in contrast and a change in chromaticity at the time when the display device is seen from the oblique direction can be inhibited, and viewing angle characteristics of display can be more favorable. On the other hand, as the light shielding layer is positioned further from the light-emitting element, the area of the image-capturing range of the light-receiving element can be smaller, and the image-capturing resolution can be higher.

In view of the above, in one embodiment of the present invention, a component (e.g., a resin layer) is provided on a surface where the light shielding layer is formed, to cause a difference between the distance from the light shielding layer to the light-receiving element and the distance from the light shielding layer to the light-emitting element. Adjusting the layout and thickness of the component can increase the distance from the light shielding layer to the light-receiving element and reduce the distance from the light shielding layer to the light-emitting element. Accordingly, noise of the sensor can be reduced, the imaging resolution can be increased, and viewing angle dependence of display can be inhibited. Thus, both the display quality and imaging quality of the display device can be increased.

Specifically, one embodiment of the present invention is a display device including a first substrate, a second substrate, a light-receiving element, a light-emitting element, a resin layer, and a light shielding layer. The light-receiving element, the light-emitting element, the resin layer, and the light shielding layer are each positioned between the first substrate and the second substrate. The light-receiving element includes a first pixel electrode over the first substrate, an active layer over the first pixel electrode, and a common electrode over the active layer. The light-emitting element includes a second pixel electrode over the first substrate, a light-emitting layer over the second pixel electrode, and the common electrode over the light-emitting layer. The resin layer and the light shielding layer are each positioned between the common electrode and the second substrate. The resin layer includes a portion overlapping with the light-emitting element. The light shielding layer includes a portion positioned between the common electrode and the resin layer.

At least part of light emitted from the light-emitting element is extracted to the outside of the second substrate through the resin layer. At least part of light passing through the second substrate enters the light-receiving element without passing through the resin layer. For example, the resin layer includes an opening overlapping with the light-receiving element. Alternatively, the resin layer is provided to have an island shape in a region overlapping with the light-emitting element.

The resin layer is provided in a position overlapping with the light-emitting element and is not provided in a position overlapping with the light-receiving element. Thus, the distance from the light shielding layer to the light-emitting element is shorter than the distance from the light shielding layer to the light-receiving element. Thus, both the display quality and imaging quality of the display device can be increased.

If all the layers of the organic EL elements and the organic photodiodes are formed separately, the number of film formation steps becomes extremely large. Since a large number of layers of the organic photodiodes can be shared with the organic EL elements, forming the common layers concurrently can inhibit the increase in the number of film formation steps. Even when the number of film formation steps is the same, reducing the number of layers formed only in either element can suppress the influence of deviation of a film formation pattern and the influence of dust (including small foreign substances called particles) attached to a deposition mask (e.g., a metal mask), for example. Thus, the yield in the manufacture of the display device can be increased.

For example, at least one of a hole-injection layer, a hole-transport layer, an electron-transport layer, and an electron-injection layer is preferably a layer shared by the light-receiving element and the light-emitting element. Accordingly, the number of film formation steps and the number of masks can be reduced, thereby reducing the number of manufacturing steps and the manufacturing cost of the display device. Note that a layer shared by the light-receiving element and the light-emitting element might have functions different in the light-receiving element and the light-emitting element. In this specification, the name of a component is based on its function in the light-emitting element. For example, a hole-injection layer functions as a hole-injection layer in the light-emitting element and functions as a hole-transport layer in the light-receiving element. Similarly, an electron-injection layer functions as an electron-injection layer in the light-emitting element and functions as an electron-transport layer in the light-receiving element.

FIG. 1A to FIG. 1D are cross-sectional views of display devices of one embodiment of the present invention.

A display device 50A illustrated in FIG. 1A includes a layer 53 including a light-receiving element and a layer 57 including a light-emitting element between a substrate 51 and a substrate 59.

Figure 1B:
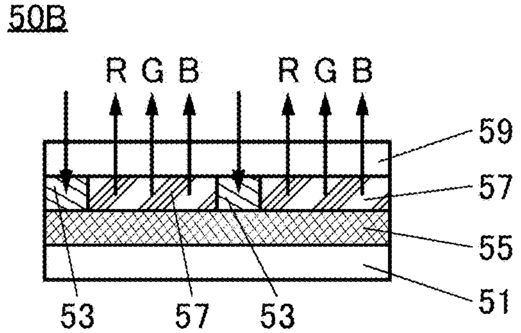

A display device 50B illustrated in FIG. 1B includes the layer 53 including a light-receiving element, a layer 55 including transistors, and the layer 57 including a light-emitting element between the substrate 51 and the substrate 59.

In the display device 50A and the display device 50B, red (R) light, green (G) light, and blue (B) light are emitted from the layer 57 including a light-emitting element.

The display device of one embodiment of the present invention includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes a light-receiving element. The light-receiving element may be provided in all the pixels or may be provided in some of the pixels. In addition, one pixel may include a plurality of light-receiving elements.

The layer 55 including transistors preferably includes a first transistor and a second transistor. The first transistor is electrically connected to the light-receiving element. The second transistor is electrically connected to the light-emitting element.

Figure 1C:
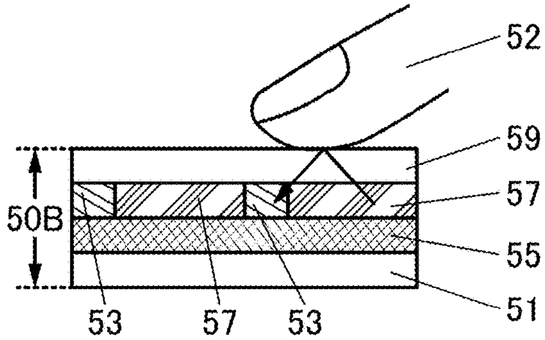

The display device of one embodiment of the present invention may have a function of detecting an object such as a finger that is touching the display device. For example, after light emitted from the light-emitting element in the layer 57 including a light-emitting element is reflected by a finger 52 that touches the display device 50B as illustrated in FIG. 1C, the light-receiving element in the layer 53 including a light-receiving element senses the reflected light. Thus, the touch of the finger 52 on the display device 50B can be detected.

Figure 1D:
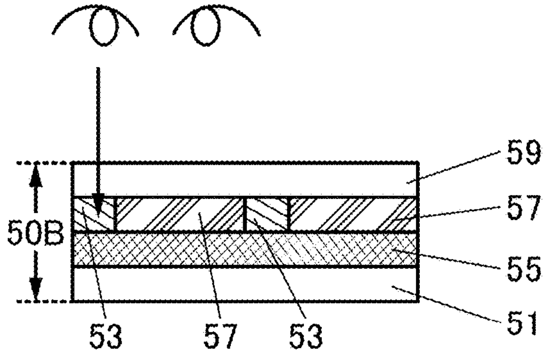

The display device of one embodiment of the present invention may have a function of detecting an object that is close to (but is not touching) the display device 50B as illustrated in FIG. 1D or capturing an image of such an object.

Pixel

FIG. 1E to FIG. 1I illustrate examples of pixels.

Figure 1E:
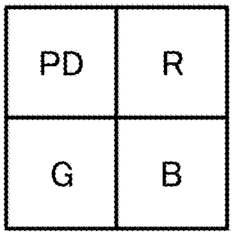
FIG. 1E to FIG. 1I are top views illustrating examples of a pixel.
Figure 1F:
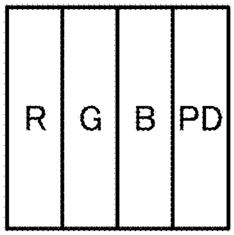
Figure 1G:
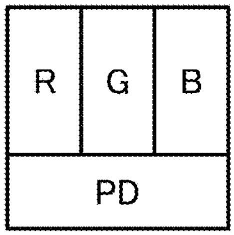

The pixel illustrated in each of FIG. 1E to FIG. 1G includes three subpixels (three light-emitting elements) of R, G, and B and a light-receiving element PD. FIG. 1E illustrates an example in which the three subpixels and the light-receiving element PD are arranged in a 2×2 matrix, and FIG. 1F illustrates an example in which the three subpixels and the light-receiving element PD are arranged horizontally in one line. FIG. 1G illustrates an example in which the three subpixels are arranged horizontally in one line and the light-receiving element PD is placed beneath the subpixels. Note that each of the pixels in FIG. 1E to FIG. 1G can be said to consist of four subpixels, in which three subpixels are used to perform display and one subpixel is used to sense light.

Figure 1H:
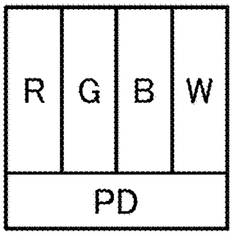

The pixel illustrated in FIG. 1H includes four subpixels (four light-emitting elements) of R, G, B, and W and the light-receiving element PD.

Figure 1I:
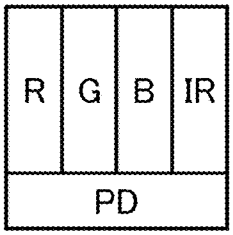

The pixel illustrated in FIG. 1I includes three subpixels of R, G, and B, a light-emitting element IR that emits infrared light, and the light-receiving element PD. Here, the light-receiving element PD preferably has a function of sensing infrared light. The light-emitting element PD may have a function of sensing both visible light and infrared light. The wavelength of light sensed by the light-receiving element PD can be determined depending on the application of the sensor.

A detailed structure of the light-emitting element and the light-receiving element included in the display device of one embodiment of the present invention will be described below with reference to FIG. 2 to FIG. 11.

The display device of one embodiment of the present invention can have any of the following structures: a top-emission structure in which light is emitted in a direction opposite to the substrate where the light-emitting element is formed, a bottom-emission structure in which light is emitted toward the substrate where the light-emitting element is formed, and a dual-emission structure in which light is emitted toward both surfaces.

FIG. 2 to FIG. 11 illustrate top-emission display devices as examples.

Although this embodiment mainly describes a display device including a light-emitting element that emits visible light and a light-receiving element that senses visible light, the display device may also include a light-emitting element that emits infrared light. Alternatively, the light-receiving element may be configured to sense infrared light or sense both visible light and infrared light.

Display Device 10A

Figure 2A:
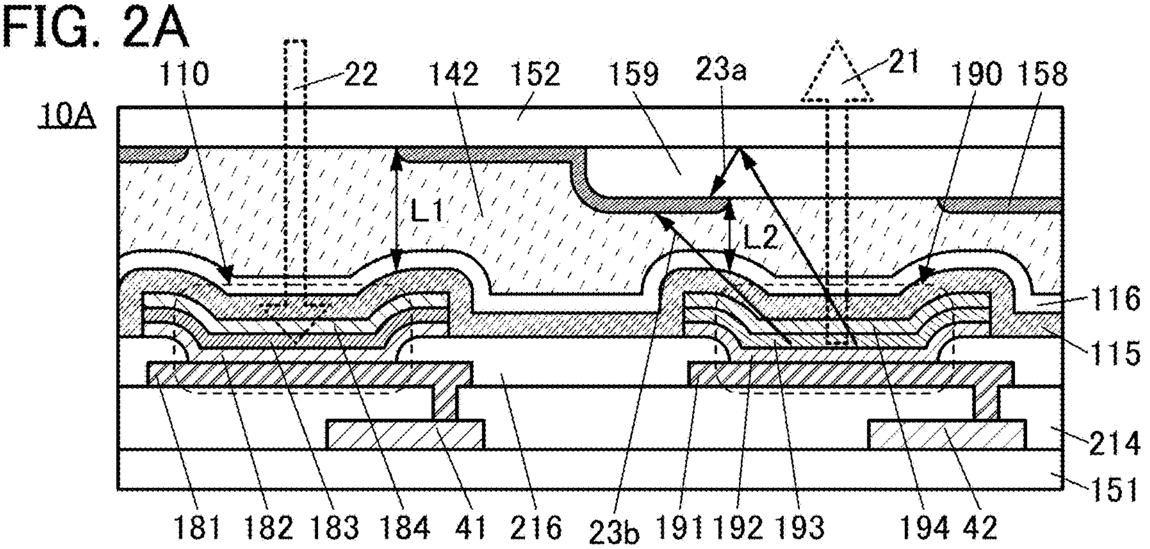
FIG. 2A is a cross-sectional view illustrating an example of a display device.

FIG. 2A illustrates a cross-sectional view of a display device 10A.

The display device 10A includes a light-receiving element 110 and a light-emitting element 190.

The light-emitting element 190 includes a pixel electrode 191, a buffer layer 192, a light-emitting layer 193, a buffer layer 194, and a common electrode 115. The light-emitting layer 193 contains an organic compound. The light-emitting element 190 has a function of emitting visible light. Note that the display device 10A may also include a light-emitting element having a function of emitting infrared light. In this embodiment, the case where the pixel electrode 191 functions as an anode and the common electrode 115 functions as a cathode is described as an example.

The light-receiving element 110 includes a pixel electrode 181, a buffer layer 182, an active layer 183, a buffer layer 184, and the common electrode 115. The active layer 183 contains an organic compound. The light-receiving element 110 has a function of sensing visible light. Note that the light-receiving element 110 may also have a function of sensing infrared light. The description in this embodiment is made so that the pixel electrode 181 functions as an anode and the common electrode 115 functions as a cathode to match the electrodes of the light-emitting element 190. In other words, the light-receiving element 110 is driven by application of reverse bias between the pixel electrode 181 and the common electrode 115, so that light incident on the light-receiving element 110 can be sensed and electric charge can be generated and extracted as current in the display device 10A.

The pixel electrode 181, the pixel electrode 191, the buffer layer 182, the buffer layer 192, the active layer 183, the light-emitting layer 193, the buffer layer 184, the buffer layer 194, and the common electrode 115 may each have a single-layer structure or a stacked-layer structure.

The pixel electrode 181 and the pixel electrode 191 are positioned over an insulating layer 214. The pixel electrode 181 and the pixel electrode 191 can be formed using the same material in the same step. An end portion of the pixel electrode 181 and an end portion of the pixel electrode 191 are covered with a partition wall 216. The pixel electrode 181 and the pixel electrode 191 are electrically insulated (also referred to as being electrically isolated) from each other by the partition wall 216.

An organic insulating film is suitable for the partition wall 216. Examples of materials which can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition wall 216 is a layer that transmits visible light. Although the details will be described later, a partition wall 217 that blocks visible light may be provided instead of the partition wall 216.

The buffer layer 182 is positioned over the pixel electrode 181. The active layer 183 overlaps with the pixel electrode 181 with the buffer layer 182 therebetween. The buffer layer 184 is positioned over the active layer 183. The active layer 183 overlaps with the common electrode 115 with the buffer layer 184 therebetween. The buffer layer 182 can include a hole-transport layer. The buffer layer 184 can include an electron-transport layer.

The buffer layer 192 is positioned over the pixel electrode 191. The light-emitting layer 193 overlaps with the pixel electrode 191 with the buffer layer 192 therebetween. The buffer layer 194 is positioned over the light-emitting layer 193. The light-emitting layer 193 overlaps with the common electrode 115 with the buffer layer 194 therebetween. The buffer layer 192 can include one or both of a hole-injection layer and a hole-transport layer. The buffer layer 194 can include one or both of an electron-injection layer and an electron-transport layer.

The common electrode 115 is a layer shared by the light-receiving element 110 and the light-emitting element 190.

The material, thickness, and the like of the pair of electrodes can be the same between the light-receiving element 110 and the light-emitting element 190. Accordingly, the manufacturing cost of the display device can be reduced and the manufacturing process of the display device can be simplified.

The display device 10A includes the light-receiving element 110, the light-emitting element 190, a transistor 41, a transistor 42, and the like between a pair of substrates (a substrate 151 and a substrate 152).

In the light-receiving element 110, the buffer layer 182, the active layer 183, and the buffer layer 184, which are positioned between the pixel electrode 181 and the common electrode 115, can each be referred to as an organic layer (a layer containing an organic compound). The pixel electrode 181 preferably has a function of reflecting visible light. The common electrode 115 has a function of transmitting visible light. Note that in the case where the light-receiving element 110 is configured to sense infrared light, the common electrode 115 has a function of transmitting infrared light. Furthermore, the pixel electrode 181 preferably has a function of reflecting infrared light.

The light-receiving element 110 has a function of sensing light. Specifically, the light-receiving element 110 is a photoelectric conversion element that receives light 22 incident from the outside of the display device 10A and converts it into an electric signal. The light 22 can also be expressed as light that is emitted from the light-emitting element 190 and then reflected by an object. The light 22 may enter the light-receiving element 110 through a lens described later. In the light-emitting element 190, the buffer layer 192, the light-emitting layer 193, and the buffer layer 194, which are positioned between the pixel electrode 191 and the common electrode 115, can each be referred to as an EL layer. The pixel electrode 191 preferably has a function of reflecting visible light. The common electrode 115 has a function of transmitting visible light. Note that in the case where the display device 10A includes a light-emitting element that emits infrared light, the common electrode 115 has a function of transmitting infrared light. Furthermore, the pixel electrode 191 preferably has a function of reflecting infrared light.

The light-emitting elements included in the display device of this embodiment preferably employ a micro optical resonator (microcavity) structure. Thus, one of the pair of electrodes of the light-emitting elements is preferably an electrode having properties of transmitting and reflecting visible light (a semi-transmissive and semi-reflective electrode), and the other is preferably an electrode having a property of reflecting visible light (a reflective electrode). When the light-emitting elements have a microcavity structure, light obtained from the light-emitting layers can be resonated between both of the electrodes, whereby light emitted from the light-emitting elements can be intensified.

Note that the semi-transmissive and semi-reflective electrode can have a stacked-layer structure of a reflective electrode and an electrode having a property of transmitting visible light (also referred to as a transparent electrode). In this specification and the like, the reflective electrode functioning as part of a semi-transmissive and semi-reflective electrode may be referred to as a pixel electrode or a common electrode, and the transparent electrode may be referred to as an optical adjustment layer; in some cases, the transparent electrode (an optical adjustment layer) can also be regarded as having a function of a pixel electrode or a common electrode.

The transparent electrode has a light transmittance of higher than or equal to 40%. For example, an electrode having a visible light (light at wavelengths greater than or equal to 400 nm and less than 750 nm) transmittance higher than or equal to 40% is preferably used in the light-emitting elements. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity less than or equal to $1\times10^{-2}$ Ωcm. Note that in the case where a light-emitting element that emits near-infrared light is used in the display device, the near-infrared light (light at wavelengths greater than or equal to 750 nm and less than or equal to 1300 nm) transmittance and reflectance of these electrodes are preferably in the above numeral ranges.

The buffer layer 192 or the buffer layer 194 may have a function as an optical adjustment layer. By changing the thickness of the buffer layer 192 or the buffer layer 194, light of a particular color can be intensified and taken out from each light-emitting element. Note that in the case where the semi-transmissive and semi-reflective electrode has a stacked-layer structure of a reflective electrode and a transparent electrode, the optical path length between the pair of electrodes represents the optical path length between a pair of reflective electrodes.

The light-emitting element 190 has a function of emitting visible light. Specifically, the light-emitting element 190 is an electroluminescent element that emits light to the substrate 152 side by applying voltage between the pixel electrode 191 and the common electrode 115 (see light emission 21).

It is preferable that the light-emitting layer 193 be formed not to overlap with the light-receiving element 110. Accordingly, it is possible to inhibit the light-emitting layer 193 from absorbing the light 22, so that the amount of light with which the light-receiving element 110 is irradiated can be increased.

The pixel electrode 181 is electrically connected to a source or a drain of the transistor 41 through an opening provided in the insulating layer 214.

The pixel electrode 191 is electrically connected to a source or a drain of the transistor 42 through an opening provided in the insulating layer 214. The transistor 42 has a function of controlling the driving of the light-emitting element 190.

The transistor 41 and the transistor 42 are on and in contact with the same layer (the substrate 151 in FIG. 2A).

At least part of a circuit electrically connected to the light-receiving element 110 is preferably formed using the same material in the same step as a circuit electrically connected to the light-emitting element 190. Accordingly, the thickness of the display device can be smaller and the manufacturing process can be simpler than those in the case where the two circuits are separately formed.

The light-receiving element 110 and the light-emitting element 190 are preferably covered with a protective layer 116. In FIG. 2A, the protective layer 116 is provided on and in contact with the common electrode 115. Providing the protective layer 116 can inhibit entry of impurities such as water into the light-receiving element 110 and the light-emitting element 190, so that the reliability of the light-receiving element 110 and the light-emitting element 190 can be increased. The protective layer 116 and the substrate 152 are bonded to each other with an adhesive layer 142.

A resin layer 159 is provided on a surface of the substrate 152 on the substrate 151 side. The resin layer 159 is provided in a position overlapping with the light-emitting element 190 and is not provided in a position overlapping with the light-receiving element 110. Note that in this specification and the like, the position overlapping with the light-emitting element 190 refers specifically to a position overlapping with a light-emitting region of the light-emitting element 190. Similarly, the position overlapping with the light-receiving element 110 refers specifically to a position overlapping with a light-receiving region of the light-receiving element 110.

Figure 2B:
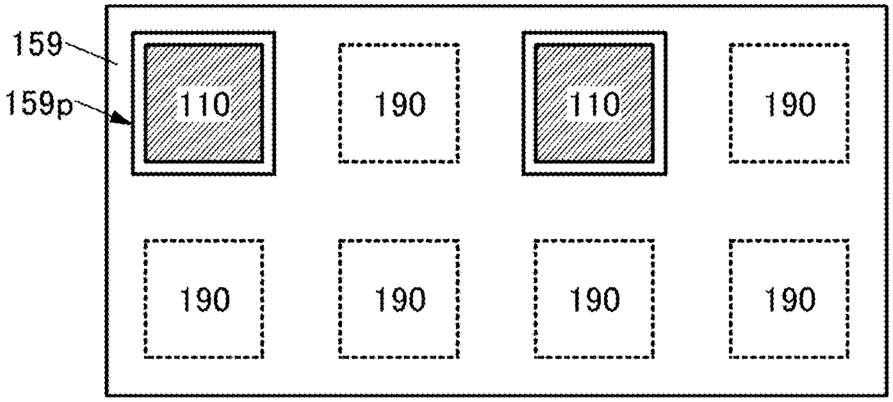
FIG. 2B and FIG. 2C illustrate top-view layout examples of a resin layer.
Figure 2C:
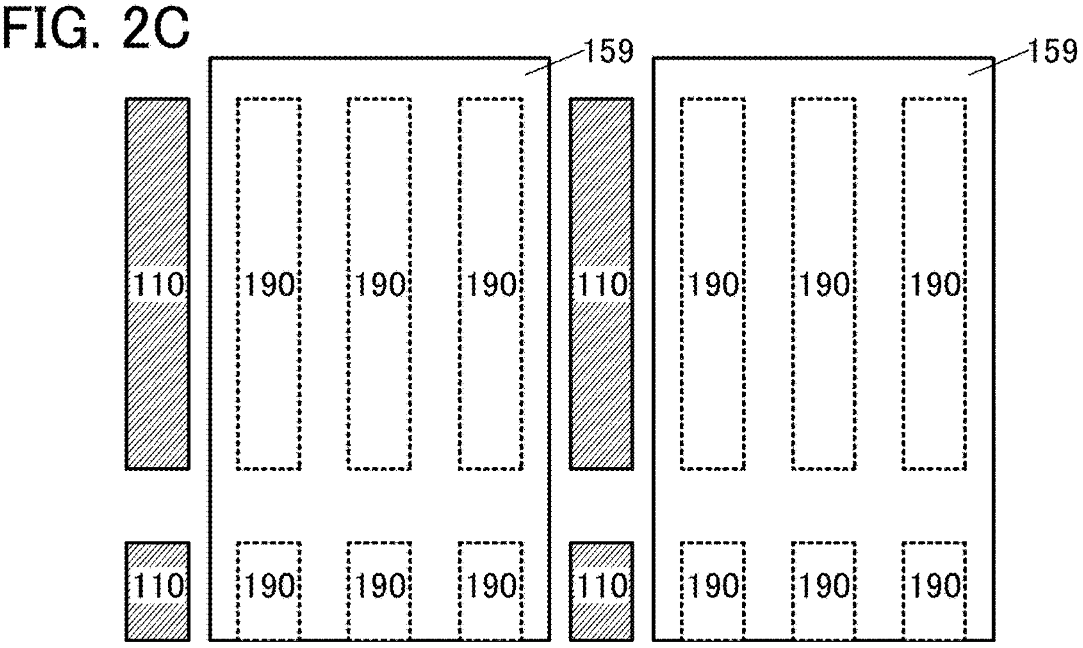

The resin layer 159 can be provided in the position overlapping with the light-emitting element 190 and have an opening 159*p* in the position overlapping with the light-receiving element 110, as illustrated in FIG. 2B, for example. Alternatively, as illustrated in FIG. 2C, the resin layer 159 can be provided to have an island shape in a position overlapping with the light-emitting element 190 but not in a position overlapping with the light-receiving element 110.

A light shielding layer 158 is provided on surface of the substrate 152 on the substrate 151 side and on surface of the resin layer 159 on the substrate 151 side. The light shielding layer 158 has openings in a position overlapping with the light-receiving element 190 and in a position overlapping with the light-emitting element 110.

Here, the light-receiving element 110 senses light that is emitted from the light-emitting element 190 and then reflected by an object. However, in some cases, light emitted from the light-emitting element 190 is reflected inside the display device 10A and enters the light-receiving element 110 without through an object. The light shielding layer 158 can absorb such stray light and thereby reduce entry of stray light into the light-receiving element 110. For example, the light shielding layer 158 can absorb stray light 23*a* that has passed through the resin layer 159 and has been reflected by the surface of the substrate 152 on the substrate 151 side. Moreover, the light shielding layer 158 can absorb stray light 23*b* before the stray light 23*b* reaches the resin layer 159. This can inhibit stray light from entering the light-receiving element 110. Consequently, noise can be reduced, and the sensitivity of a sensor using the light-receiving element 110 can be increased. It is particularly preferable that the light shielding layer 158 be positioned close to the light-emitting element 190, in which case stray light can be further reduced. This is preferable also in terms of improving display quality, because the light shielding layer 158 positioned close to the light-emitting element 190 can inhibit viewing angle dependence of display.

Providing the light shielding layer 158 can control the range where the light-receiving element 110 senses light. When the light shielding layer 158 is positioned apart from the light-receiving element 110, the image-capturing range is narrowed, and the image-capturing resolution can be increased.

In the case where the resin layer 159 has an opening, the light shielding layer 158 preferably covers at least part of the opening and at least part of a side surface of the resin layer 159 exposed in the opening.

In the case where the resin layer 159 is provided in an island shape, the light shielding layer 158 preferably covers at least part of a side surface of the resin layer 159.

Since the light shielding layer 158 is provided along the shape of the resin layer 159 in such a manner, the distance from the light shielding layer 158 to the light-emitting element 190 (specifically, the light-emitting region of the light-emitting element 190) is shorter than the distance from the light shielding layer 158 to the light-receiving element 110 (specifically, the light-receiving region of the light-receiving element 110). Accordingly, noise of the sensor can be reduced, the image-capturing resolution can be increased, and viewing angle dependence of display can be inhibited. Thus, both the display quality and imaging quality of the display device can be increased.

The resin layer 159 is a layer that transmits light emitted from the light-emitting element 190. Examples of materials for the resin layer 159 include an acrylic resin, a polyimide resin, an epoxy resin, a polyamide resin, a polyimide-amide resin, a siloxane resin, a benzocyclobutene-based resin, a phenol resin, and precursors of these resins. Note that a component provided between the substrate 152 and the light shielding layer 158 is not limited to the resin layer and may be an inorganic insulating film or the like. As the component becomes thicker, a larger difference occurs between the distance from the light shielding layer to the light-receiving element and the distance from the light shielding layer to the light-emitting element. An organic insulating film such as a resin or the like is suitable for the component because it is easily formed to have a large thickness.

For the light shielding layer 158, a material that blocks light emitted from the light-emitting element can be used. The light shielding layer 158 preferably absorbs visible light. As the light shielding layer 158, a black matrix can be formed using a metal material or a resin material containing pigment (e.g., carbon black) or dye, for example. The light shielding layer 158 may have a stacked-layer structure of a red color filter, a green color filter, and a blue color filter.

In order to compare the distance from the light shielding layer 158 to the light-receiving element 110 and the distance from the light shielding layer 158 to the light-emitting element 190, it is possible to use, for example, the shortest distance L1 from an end portion of the light shielding layer 158 on the light-receiving element 110 side to the common electrode 115 and the shortest distance L2 from an end portion of the light shielding layer 158 on the light-emitting element 190 side to the common electrode 115. With the shortest distance L2 smaller than the shortest distance L1, stray light from the light-emitting element 190 can be inhibited, and the sensitivity of the sensor using the light-receiving element 110 can be increased. Furthermore, viewing angle dependence of display can be inhibited. With the shortest distance L1 larger than the shortest distance L2, the image-capturing range of the light-receiving element 110 can be narrowed, and the image-capturing resolution can be increased.

In addition, when the adhesive layer 142 is provided such that a portion overlapping with the light-receiving element 110 is made thicker than a portion overlapping with the light-emitting element 190, a difference also can be made between the distance from the light shielding layer 158 to the light-receiving element 110 and the distance from the light shielding layer 158 to the light-emitting element 190.

Display Device 10B

Figure 3A:
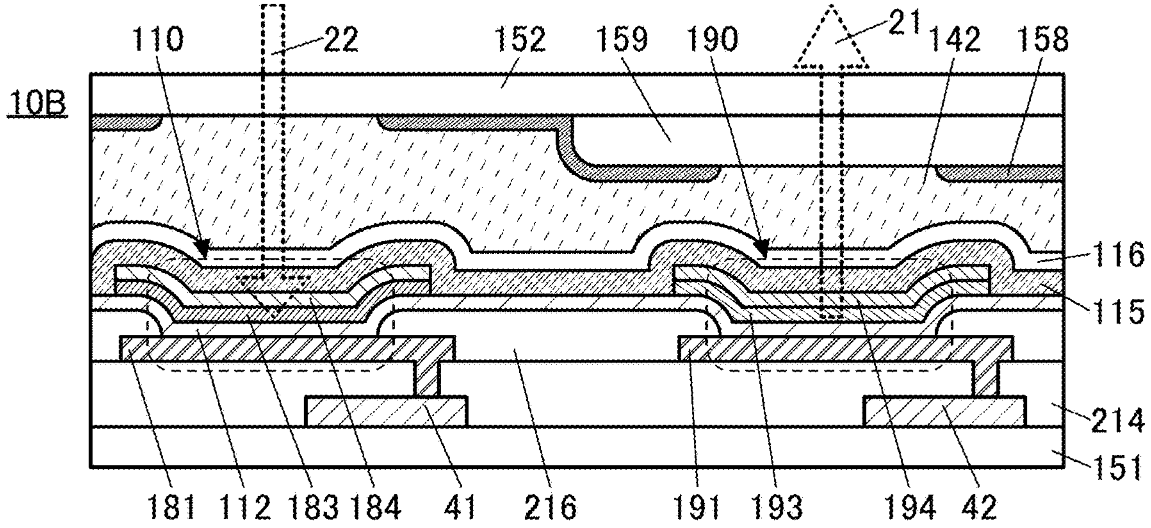
FIG. 3A and FIG. 3B are cross-sectional views illustrating examples of display devices.

FIG. 3A illustrates a cross-sectional view of a display device 10B. Note that in the description of the display device below, components similar to those of the above-described display device are not described in some cases.

The display device 10B is different from the display device 10A in that the buffer layer 182 and the buffer layer 192 are not included but a common layer 112 is included.

The common layer 112 is positioned over the partition wall 216, over the pixel electrode 181, and over the pixel electrode 191. The common layer 112 is a layer shared by the light-receiving element 110 and the light-emitting element 190. The common layer 112 may have a single-layer structure or a stacked-layer structure.

As the common layer 112, one or both of a hole-injection layer and a hole-transport layer can be formed, for example. The common layer 112 has functions different in the light-emitting element 190 and the light-receiving element 110 in some cases. For example, when the common layer 112 includes a hole-injection layer, the hole-injection layer functions as a hole-injection layer in the light-emitting element 190 and functions as a hole-transport layer in the light-receiving element 110. The common layer 112 may have a single-layer structure or a stacked-layer structure.

It is preferable that at least one of the layers other than the active layer and the light-emitting layer be shared by the light-receiving element and the light-emitting element, in which case the number of manufacturing steps of the display device can be reduced.

Display Device 10C

Figure 3B:
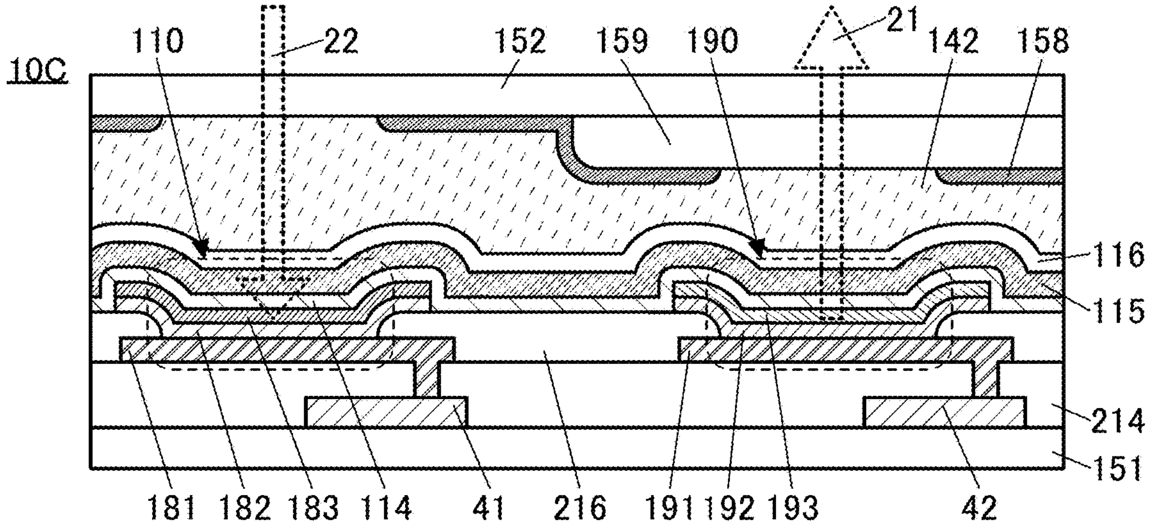

FIG. 3B illustrates a cross-sectional view of a display device 10C.

The display device 10C is different from the display device 10A in that the buffer layer 184 and the buffer layer 194 are not included but a common layer 114 is included.

The common layer 114 is positioned over the partition wall 216, over the active layer 183, and over the light-emitting layer 193. The common layer 114 is a layer shared by the light-receiving element 110 and the light-emitting element 190. The common layer 114 may have a single-layer structure or a stacked-layer structure.

As the common layer 114, one or both of an electron-injection layer and an electron-transport layer can be formed, for example. The common layer 114 has functions different in the light-emitting element 190 and the light-receiving element 110 in some cases. For example, when the common layer 114 includes an electron-injection layer, the electron-injection layer functions as an electron-injection layer in the light-emitting element 190 and functions as an electron-transport layer in the light-receiving element 110. The common layer 114 may have a single-layer structure or a stacked-layer structure.

It is preferable that at least one of the layers other than the active layer and the light-emitting layer be shared by the light-receiving element and the light-emitting element, in which case the number of manufacturing steps of the display device can be reduced.

Display Device 10D

Figure 4A:
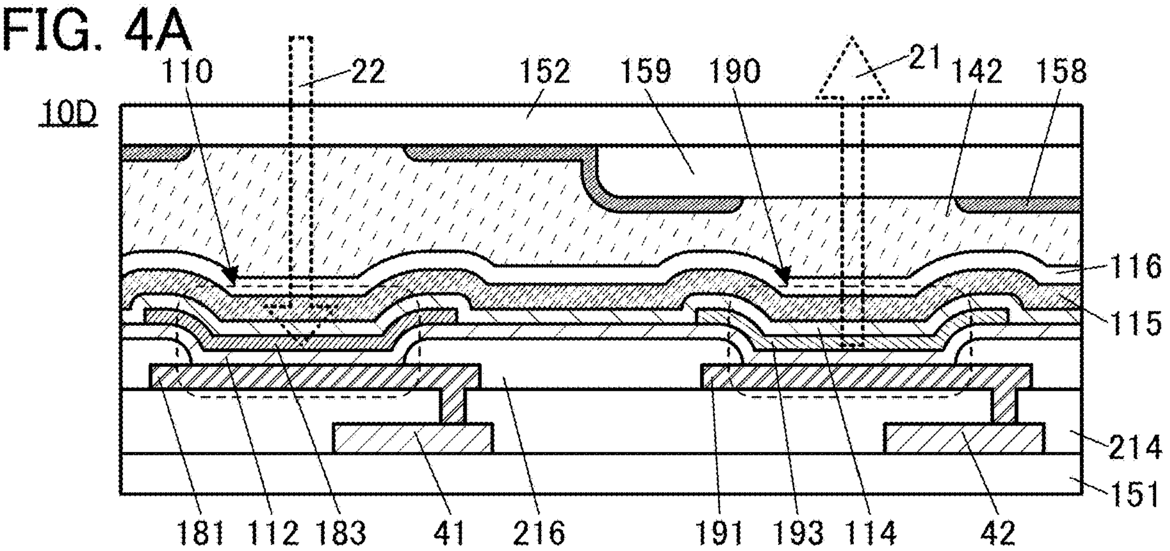
FIG. 4A to FIG. 4C are cross-sectional views illustrating examples of display devices.

FIG. 4A illustrates a cross-sectional view of a display device 10D.

The display device 10D is different from the display device 10A in that the buffer layer 182, the buffer layer 192, the buffer layer 184, and the buffer layer 194 are not included but the common layer 112 and the common layer 114 are included.

In the display device of this embodiment, an organic compound is used for the active layer 183 of the light-receiving element 110. The light-receiving element 110 can have such a structure that the layers other than the active layer 183 are shared with the light-emitting element 190 (EL element). Therefore, the light-receiving element 110 can be formed concurrently with the formation of the light-emitting element 190 only by adding a step of depositing the active layer 183 in the manufacturing process of the light-emitting element 190. The light-emitting element 190 and the light-receiving element 110 can be formed over one substrate. Accordingly, the light-receiving element 110 can be incorporated into the display device without a significant increase in the number of manufacturing steps.

The display device 10D illustrates an example in which the light-receiving element 110 and the light-emitting element 190 have a common structure except that the active layer 183 of the light-receiving element 110 and the light-emitting layer 193 of the light-emitting element 190 are separately formed. Note that the structures of the light-receiving element 110 and the light-emitting element 190 are not limited thereto. The light-receiving element 110 and the light-emitting element 190 may include separately formed layers other than the active layer 183 and the light-emitting layer 193 (see the display devices 10A, 10B, and 10C described above). The light-receiving element 110 and the light-emitting element 190 preferably include at least one layer used in common (common layer). Thus, the light-receiving element 110 can be incorporated into the display device without a significant increase in the number of manufacturing steps.

Display Device 10E

Figure 4B:
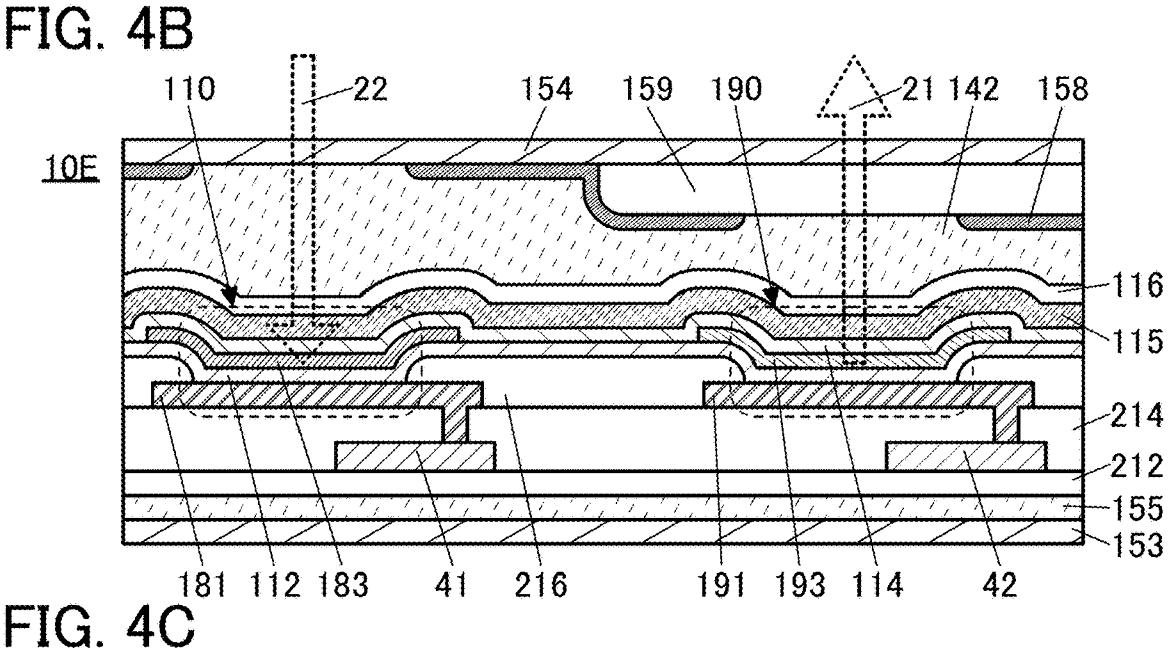

FIG. 4B illustrates a cross-sectional view of a display device 10E.

The display device 10E is different from the display device 10D in that the substrate 151 and the substrate 152 are not included but a substrate 153, a substrate 154, an adhesive layer 155, and an insulating layer 212 are included.

The substrate 153 and the insulating layer 212 are bonded to each other with the adhesive layer 155. The substrate 154 and the protective layer 116 are bonded to each other with the adhesive layer 142.

The display device 10E has a structure obtained in such a manner that the insulating layer 212, the transistor 41, the transistor 42, the light-receiving element 110, the light-emitting element 190, and the like are formed over a formation substrate and then transferred onto the substrate 153. The substrate 153 and the substrate 154 are preferably flexible. Accordingly, the flexibility of the display device 10E can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display device of this embodiment, a film having high optical isotropy may be used. Examples of a highly optically isotropic film include a triacetyl cellulose (TAC, also referred to as cellulose triacetate) film, a cycloolefin polymer (COP) film, a cycloolefin copolymer (COC) film, and an acrylic film.

Display Devices 10F, 10G, and 10H

Figure 4C:
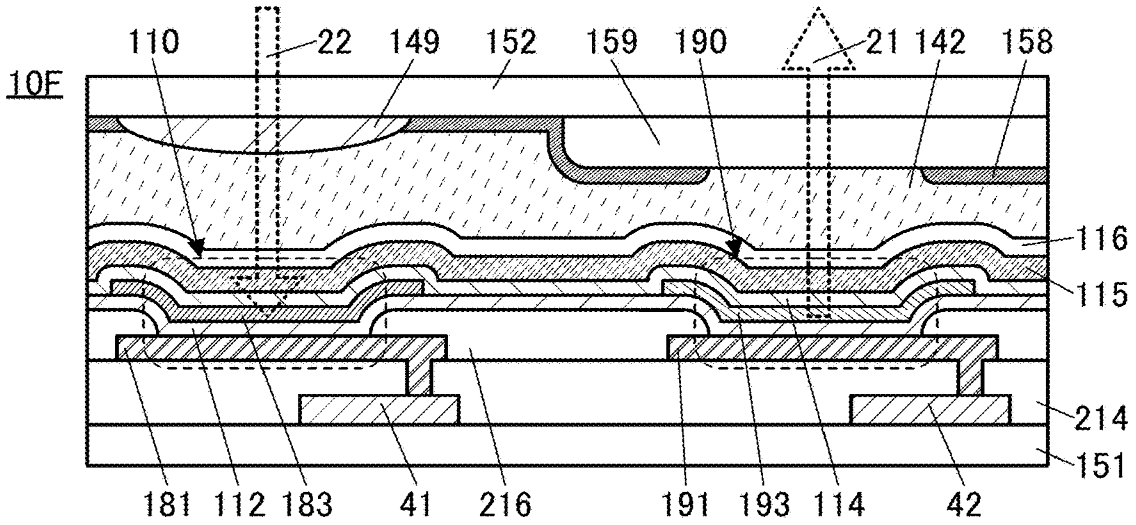
Figure 5A:
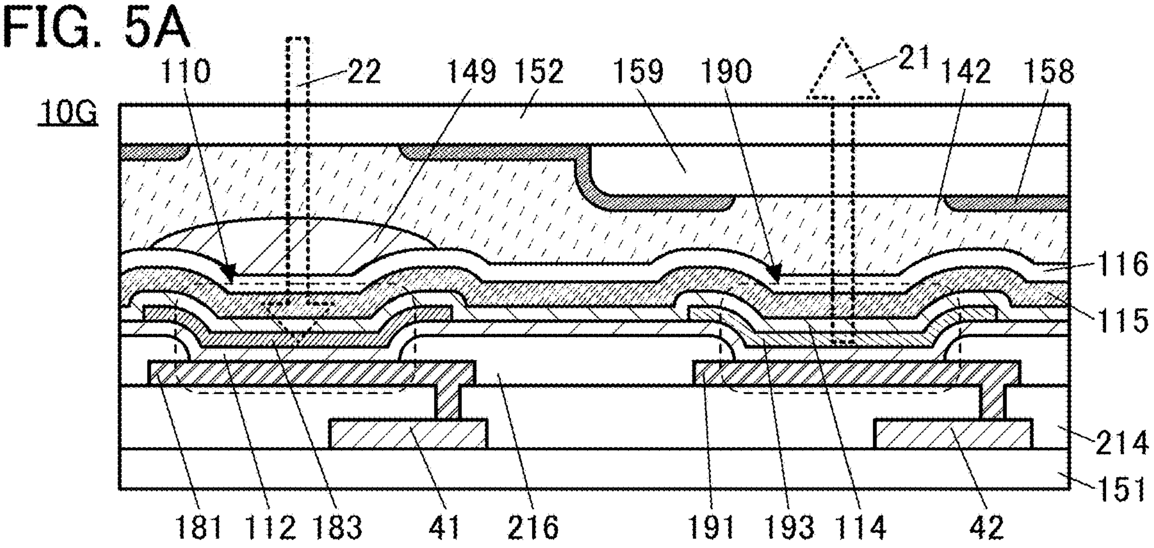
FIG. 5A to FIG. 5C are cross-sectional views illustrating examples of display devices.
Figure 5B:
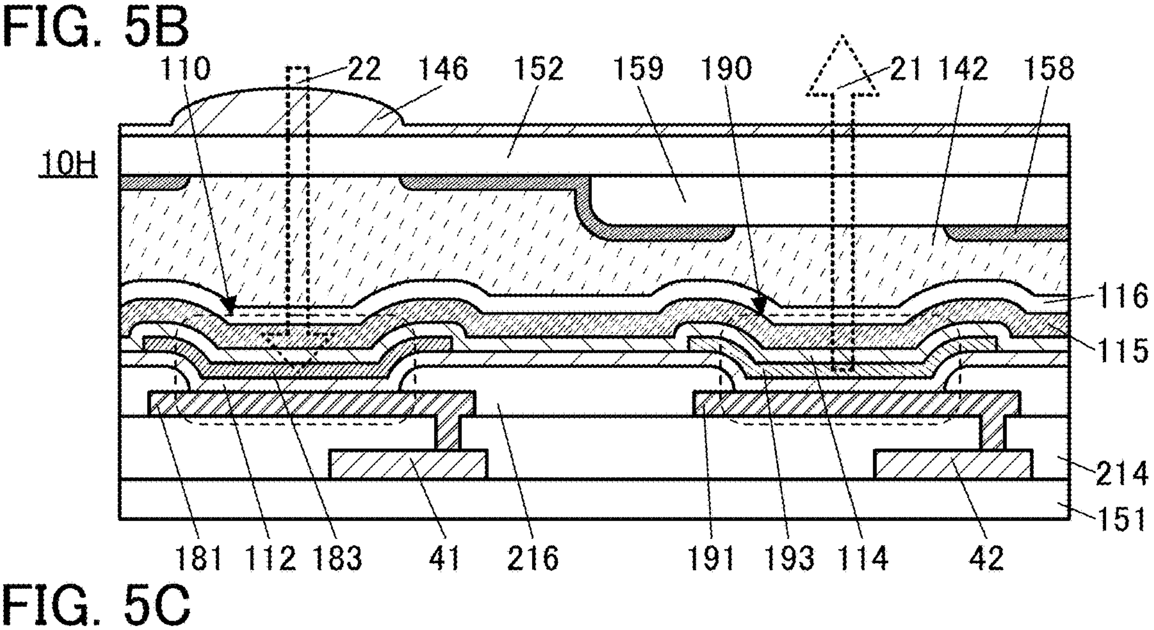

FIG. 4C illustrates a cross-sectional view of a display device 10F. FIG. 5A illustrates a cross-sectional view of a display device 10G. FIG. 5B illustrates a cross-sectional view of a display device 10H.

The display device 10F includes a lens 149 in addition to the components of the display device 10D.

The display device of this embodiment may include the lens 149. The lens 149 is provided in a position overlapping with the light-receiving element 110. In the display device 10F, the lens 149 is provided in contact with the substrate 152. The lens 149 included in the display device 10F has a convex surface on the substrate 151 side.

In the case where the light shielding layer 158 and the lens 149 are formed on the same plane of the substrate 152, their formation order is not limited. FIG. 4C illustrates an example in which the lens 149 is formed first; alternatively, the light shielding layer 158 may be formed first. In FIG. 4C, an end portion of the lens 149 is covered with the light shielding layer 158.

The display device 10F has a structure in which the light 22 enters the light-receiving element 110 through the lens 149. With the lens 149, the image-capturing range of the light-receiving element 110 can be narrowed as compared to the case where the lens 149 is not provided, thereby inhibiting overlap of the image-capturing ranges between the adjacent light-receiving elements 110. Thus, a clear image with little blurring can be captured. In the case where the image-capturing range of the light-receiving element 110 does not change, the lens 149 allows the size of a pinhole (corresponding to the size of an opening in the light shielding layer 158 which overlaps with the light-receiving element 110 in FIG. 4C) to be increased, compared to the case where the lens 149 is not provided. Hence, providing the lens 149 can increase the amount of light entering the light-receiving element 110.

Like the display device 10F, the display device 10G illustrated in FIG. 5A is one of display devices that has a structure in which the light 22 enters the light-receiving element 110 through the lens 149.

In the display device 10G, the lens 149 is provided in contact with a top surface of the protective layer 116. The lens 149 included in the display device 10G has a convex surface on the substrate 152 side.

In the display device 10H illustrated in FIG. 5B, a lens array 146 is provided on the display surface side of the substrate 152. A lens included in the lens array 146 is provided in a position overlapping with the light-receiving element 110. The light shielding layer 158 is preferably provided on a surface of the substrate 152 on the substrate 151 side.

As a method for forming the lens used in the display device of this embodiment, a lens such as a microlens may be formed directly over the substrate or the light-receiving element, or a lens array formed separately, such as a microlens array, may be bonded to the substrate.

The lens preferably has a refractive index of greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, or the like can be used for the lens. Alternatively, zinc sulfide or the like can be used for the lens.

Display Device 10J

Figure 5C:
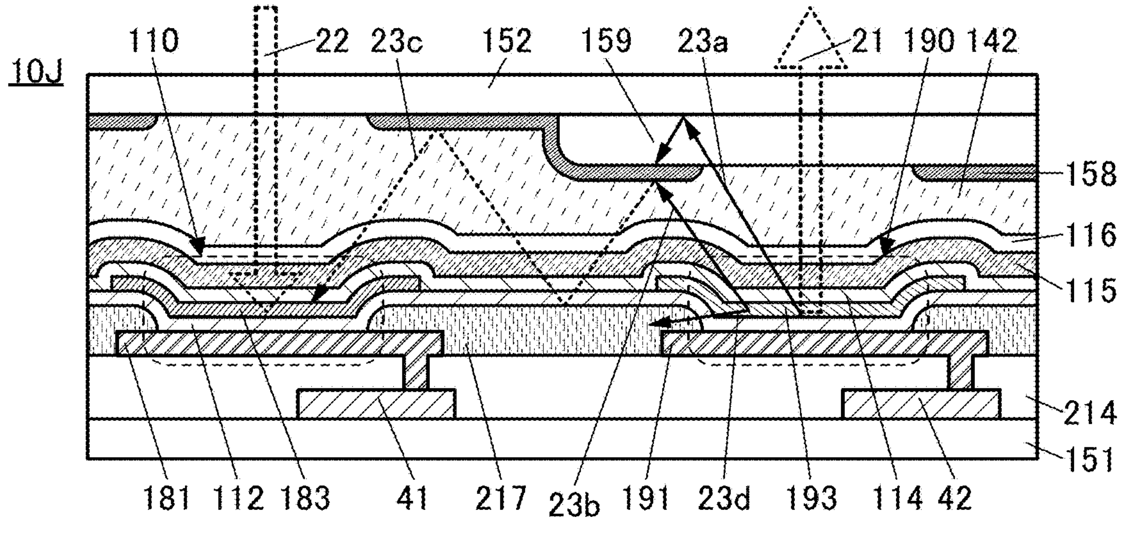

FIG. 5C illustrates a cross-sectional view of a display device 10J.

The display device 10J is different from the display device 10D in that the partition wall 216 that transmits visible light is not included but the partition wall 217 that blocks visible light is included.

The partition wall 217 preferably absorbs light emitted from the light-emitting element 190. As the partition wall 217, a black matrix can be formed using a resin material containing a pigment or dye, for example. Moreover, the partition wall 217 can be formed of a colored insulating layer by using a brown resist material.

In the display device 10D (FIG. 4A), in some cases, light emitted from the light-emitting element 190 is reflected by the substrate 152 and the partition wall 216, and the reflected light enters the light-receiving element 110. In other cases, light emitted from the light-emitting element 190 passes through the partition wall 216 and is reflected by a transistor, a wiring, or the like, and thus reflected light enters the light-receiving element 110. In the display device 10J, such reflected light can be inhibited from entering the light-receiving element 110 when light is absorbed by the partition wall 217. Consequently, noise can be reduced, and the sensitivity of a sensor using the light-receiving element 110 can be increased.

The partition wall 217 preferably absorbs at least light having a wavelength that is sensed by the light-receiving element 110. For example, in the case where the light-receiving element 110 senses green light emitted from the light-emitting element 190, the partition wall 217 preferably absorbs at least green light. For example, when the partition wall 217 includes a red color filter, the partition wall 217 can absorb the green light and thus the reflected light can be inhibited from being incident on the light-receiving element 110.

Although the light shielding layer 158 can absorb most of the stray light 23*b* before the stray light 23*b* reaches the resin layer 159, part of the stray light 23*b* is reflected and enters the partition wall 217 in some cases. When the partition wall 217 is configured to absorb the stray light 23*b*, the stray light 23*b* can be inhibited from entering the transistor, the wiring, or the like. Thus, stray light 23*c* can be inhibited from reaching the light-receiving element 110. With a larger number of times the stray light 23*b* strikes the light shielding layer 158 and the partition wall 217, the amount of absorbed light can be increased and the amount of the stray light 23*c* reaching the light-receiving element 110 can be extremely small. The resin layer 159 is preferably thick, in which case the number of times the stray light 23*b* strikes the light shielding layer 158 and the partition wall 217 can be increased.

Since the partition wall 217 absorbs light, stray light 23*d* that enters the partition wall 217 directly from the light-emitting element 190 can be absorbed by the partition wall 217. This also demonstrates that providing the partition wall 217 can reduce the amount of stray light incident on the light-receiving element 110.

Display Device 10K

Figure 6A:
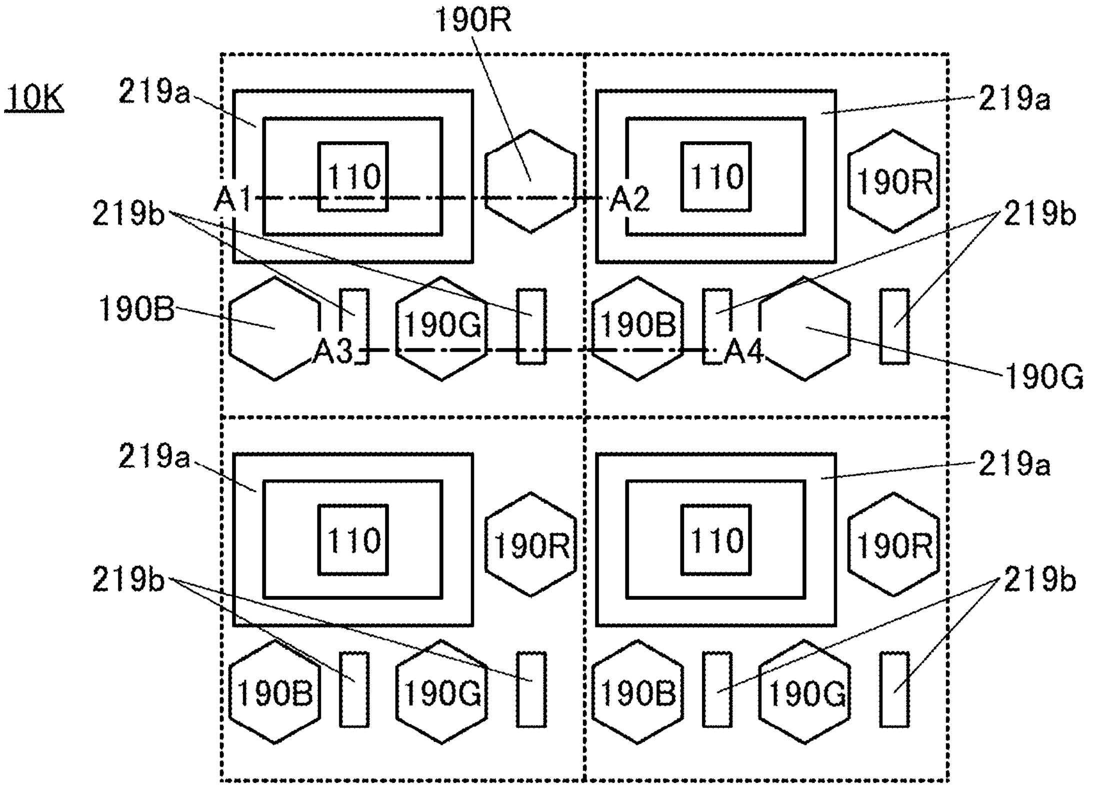
FIG. 6A is a top view illustrating an example of a display device.
Figure 6B:
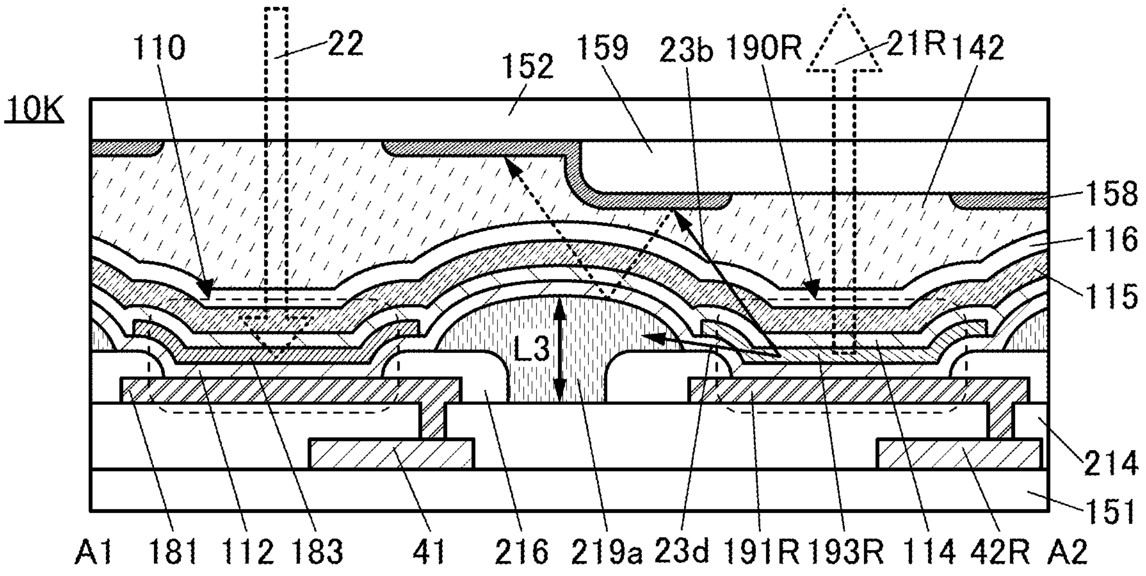
FIG. 6B is a cross-sectional view illustrating an example of the display device.
Figure 7A:
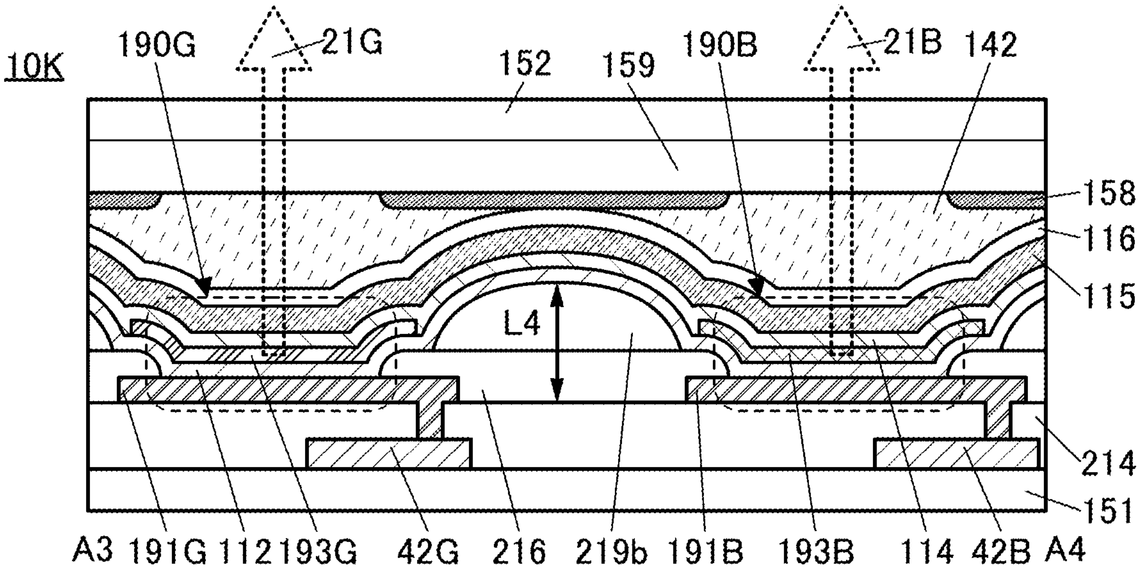
FIG. 7A and FIG. 7B are cross-sectional views illustrating examples of display devices.

FIG. 6A illustrates a top view of a display device 10K. FIG. 6B illustrates a cross-sectional view taken along a dashed-dotted line A1-A2 in FIG. 6A. FIG. 7A illustrates a cross-sectional view taken along a dashed-dotted line A3-A4 in FIG. 6A.

In FIG. 6A, a portion surrounded by a dotted frame corresponds to one pixel. One pixel includes the light-receiving element 110, a red light-emitting element 190R, a green light-emitting element 190G, and a blue light-emitting element 190B.

There is no particular limitation on the top surface shapes of the light-receiving element 110 and the light-emitting elements 190R, 190G, and 190B. In the pixel layout illustrated in FIG. 6A, a hexagonal close-packed arrangement is employed. The hexagonal close-packed arrangement is preferable because the aperture ratio of the light-receiving element 110 and the light-emitting elements 190R, 190G, and 190 can be increased. In the top view, the light-receiving region of the light-receiving element 110 is quadrilateral, and the light-emitting region of each of the light-emitting elements 190R, 190G, and 190B is hexagonal.

In the top view (also referred to as plan view), the light-receiving element 110 is provided on the inner side of a frame-shaped light shielding layer 219*a*. The four sides of the light-receiving element 110 are completely surrounded by the light shielding layer 219*a*, thereby inhibiting entry of stray light into the light-receiving element 110. Note that the frame-shaped light shielding layer 219*a* may have a gap (also referred to as a cut, a disconnected portion, or a missing portion).

In the top view, a spacer 219*b* is provided between the green light-emitting element 190G and the blue light-emitting element 190B.

As illustrated in FIG. 6B and FIG. 7A, the display device 10K includes the light-receiving element 110, the red light-emitting element 190R, the green light-emitting element 190G, and the blue light-emitting element 190B.

The light-emitting element 190R includes a pixel electrode 191R, the common layer 112, a light-emitting layer 193R, the common layer 114, and the common electrode 115. The light-emitting layer 193R contains an organic compound that emits red light 21R. The light-emitting element 190R has a function of emitting red light.

The light-emitting element 190G includes a pixel electrode 191G, the common layer 112, a light-emitting layer 193G, the common layer 114, and the common electrode 115. The light-emitting layer 193G contains an organic compound that emits green light 21G. The light-emitting element 190G has a function of emitting green light.

The light-emitting element 190B includes a pixel electrode 191B, the common layer 112, a light-emitting layer 193B, the common layer 114, and the common electrode 115. The light-emitting layer 193B contains an organic compound that emits blue light 21B. The light-emitting element 190B has a function of emitting blue light.

The light-receiving element 110 includes the pixel electrode 181, the common layer 112, the active layer 183, the common layer 114, and the common electrode 115. The active layer 183 contains an organic compound. The light-receiving element 110 has a function of sensing visible light.

In the display device 10K, the light-receiving element 110, the light-emitting element 190R, the light-emitting element 190G, the light-emitting element 190B, the transistor 41, a transistor 42R, a transistor 42G, a transistor 42B, and the like are provided between a pair of substrates (the substrate 151 and the substrate 152).

End portions of the pixel electrodes 181, 191R, 191G, and 191B are covered with the partition wall 216.

The pixel electrode 181 is electrically connected to a source or a drain of the transistor 41 through an opening provided in the insulating layer 214. The pixel electrode 191R is electrically connected to a source or a drain of the transistor 42R through an opening provided in the insulating layer 214. Similarly, the pixel electrode 191G is electrically connected to a source or a drain of the transistor 42G through an opening provided in the insulating layer 214. In addition, the pixel electrode 191B is electrically connected to a source or a drain of the transistor 42B through an opening provided in the insulating layer 214.

The light-receiving element 110 and the light-emitting elements 190R, 190G, and 190B are covered with the protective layer 116.

The resin layer 159 is provided on a surface of the substrate 152 on the substrate 151 side. The resin layer 159 is provided in positions overlapping with the light-emitting elements 190R, 190G, and 190B and is not provided in a position overlapping with the light-receiving element 110.

The light shielding layer 158 is provided on surface of the substrate 152 on the substrate 151 side and on surface of the resin layer 159 on the substrate 151 side. The light shielding layer 158 has openings in positions overlapping with the light-receiving elements 190R, 190G, and 190B and in a position overlapping with the light-emitting element 110.

In the top view, a frame-shaped opening is provided in the partition wall 216. In FIG. 6B, the partition wall 216 has an opening between the light-receiving element 110 and the light-emitting element 190R. The light shielding layer 219*a* is provided to cover the opening. The light shielding layer 219*a* preferably covers the opening of the partition wall 216 and a side surface of the partition wall 216 exposed in the opening. Furthermore, the light shielding layer 219*a* preferably covers at least part of a top surface of the partition wall 216.

Although the light shielding layer 219*a* can be provided over the partition wall 216 without providing the opening, there is a possibility that stray light passes through the partition wall 216 and enters the light-receiving element 110. When the partition wall 216 has the opening and the light shielding layer 219*a* is provided to fill the opening, stray light that passes through the partition wall 216 is absorbed by the light shielding layer 219*a* in the opening of the partition wall 216. This can inhibit entry of stray light into to the light-receiving element 110.

The light shielding layer 219*a* preferably has a forward tapered shape. This can improve the coverage with of films provided over the light shielding layer 219*a* (e.g., the common layer 112, the common layer 114, the common electrode 115, and the protective layer 116).

The light shielding layer 219*a* preferably absorbs at least light having a wavelength that is sensed by the light-receiving element 110. For example, in the case where the light-receiving element 110 senses green light emitted from the light-emitting element 190G, the light shielding layer 219*a* preferably absorbs at least green light. For example, when the light shielding layer 219*a* includes a red color filter, the light shielding layer 219*a* can absorb the green light and thus the reflected light can be inhibited from being incident on the light-receiving element 110. The light shielding layer 219*a* may be a black matrix formed using a resin material containing a pigment or dye, for example. The light shielding layer 219*a* may have a stacked-layer structure of a red color filter, a green color filter, and a blue color filter. Alternatively, as the light shielding layer 219*a*, a colored insulating layer may be formed using a brown resist material.

For example, in the case where the light-receiving element 110 senses green light emitted from the light-emitting element 190G, light emitted from the light-emitting element 190G is sometimes reflected by the substrate 152 and the partition wall 216, and the reflected light enters the light-receiving element 110. In other cases, light emitted from the light-emitting element 190G passes through the partition wall 216 and is reflected by a transistor, a wiring, or the like, and thus reflected light enters the light-receiving element 110. In the display device 10K, such reflected light can be inhibited from entering the light-receiving element 110 when light is absorbed by the light shielding layer 158 and the light shielding layer 219*a*. Consequently, noise can be reduced, and the sensitivity of a sensor using the light-receiving element 110 can be increased.

For example, the light shielding layer 158 can absorb most of the stray light 23*b* before the stray light 23*b* reaches the resin layer 159. Furthermore, even when part of the stray light 23*b* is reflected by the light shielding layer 158, the light shielding layer 219*a* absorbs the stray light 23*b*, thereby inhibiting entry of the stray light 23*b* into the transistor, the wiring, or the like. Thus, stray light can be inhibited from reaching the light-receiving element 110.

With a larger number of times the stray light 23*b* strikes the light shielding layer 158 and the light shielding layer 219*a*, the amount of absorbed light can be increased and the amount of stray light reaching the light-receiving element 110 can be extremely small. The resin layer 159 is preferably thick, in which case the number of times the stray light 23*b* strikes the light shielding layer 158 and the partition wall 217 can be increased. The thick resin layer 159 is preferable in terms of display quality, because a shorter distance from the light shielding layer 158 to the light-emitting elements of each color can inhibit viewing angle dependence of display.

Since the light shielding layer 219*a* absorbs light, the stray light 23*d* that enters the light shielding layer 219*a* directly from the light-emitting element can be absorbed by the light shielding layer 219*a*. This also demonstrates that providing the light shielding layer 219*a* can reduce the amount of stray light incident on the light-receiving element 110.

Providing the light shielding layer 158 can control the range where the light-receiving element 110 senses light. When the distance from the light shielding layer 158 to the light-receiving element 110 is long, the image-capturing range is narrowed, and the image-capturing resolution can be increased.

The spacer 219*b* is positioned over the partition wall 216, and is positioned between the light-emitting element 190G and the light-emitting element 190B in the top view. A top surface of the spacer 219*b* is preferably closer to the light shielding layer 158 than a top surface of the light shielding layer 219*a* is. When a thickness L3 of the light shielding layer 219*a* is greater than or equal to a total thickness L4 of the partition wall 216 and the spacer 219*b*, the inside of the frame-shaped light shielding layer 219*a* is not sufficiently filled with the adhesive layer 142 in some cases, which might reduce the reliability of the light-receiving element 110 or even the reliability of the display device 10K. Therefore, the total thickness L4 of the partition wall 216 and the spacer 219*b* is preferably larger than the thickness L3 of the light shielding layer 219*a*. Thus, filling with the adhesive layer 142 can be facilitated. As illustrated in FIG. 7A, the light shielding layer 158 may be in contact with the protective layer 116 (or the common electrode 115) in a portion where the spacer 219*b* and the light shielding layer 158 overlap with each other.

Display Device 10L

Figure 7B:
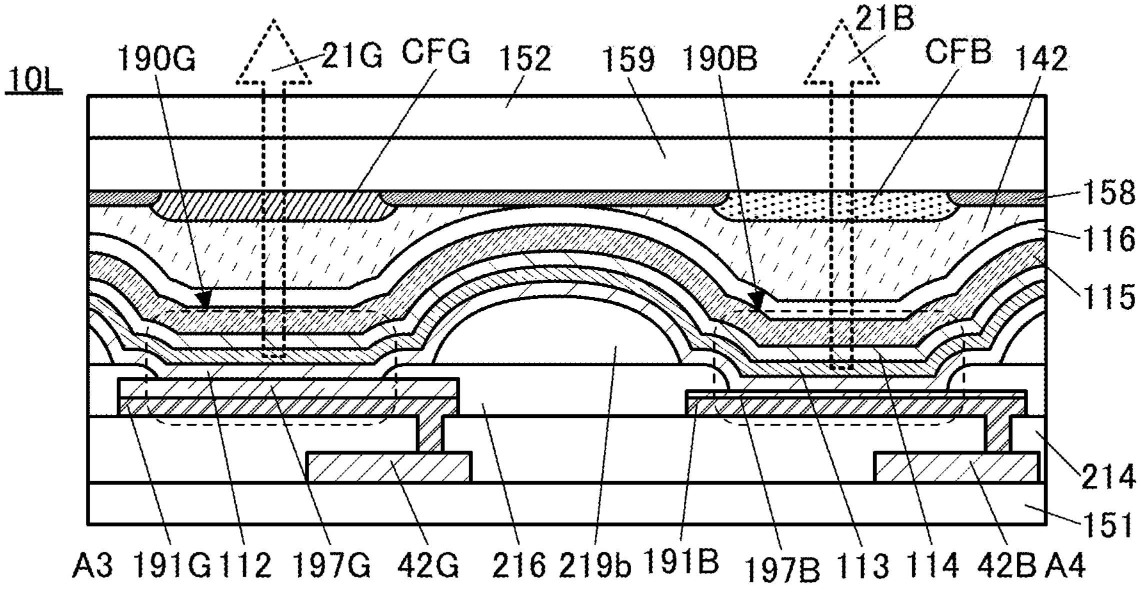

FIG. 7B illustrates a cross-sectional view of a display device 10L.

In the display device 10L, the light-emitting elements 190R, 190G, and 190B include the same light-emitting layer. FIG. 7B corresponds to a cross-sectional view taken along the dashed-dotted line A3-A4 in FIG. 6A.

The light-emitting element 190G illustrated in FIG. 7B includes the pixel electrode 191G, an optical adjustment layer 197G, the common layer 112, a light-emitting layer 113, the common layer 114, and the common electrode 115. The light-emitting element 190B illustrated in FIG. 7B includes the pixel electrode 191B, an optical adjustment layer 197B, the common layer 112, the light-emitting layer 113, the common layer 114, and the common electrode 115. The common layer 112, the light-emitting layer 113, and the common layer 114 are common components in the light-emitting elements 190R, 190G, and 190B. The light-emitting layer 113 includes, for example, the light-emitting layer 193R that emits red light, the light-emitting layer 193G that emits green light, and the light-emitting layer 193B that emits blue light.

Note that although the common layer 112, the light-emitting layer 113, and the common layer 114 are shown as the EL layer in FIG. 7B, this embodiment is not limited thereto. The light-emitting element may have a single structure in which one light-emitting unit is provided between the pixel electrode 191 and the common electrode 115, or a tandem structure in which a plurality of light-emitting units are provided between the electrodes.

The light-emitting layer 113 is shared by the light-emitting elements that emit light of different colors. Light emitted from the light-emitting element 190G is extracted as the green light 21G through a coloring layer CFG. Light emitted from the light-emitting element 190B is extracted as the blue light 21B through a coloring layer CFB.

The light-emitting element 190G and the light-emitting element 190B have the same structure except that they include optical adjustment layers with different thicknesses. A reflective electrode is used as the pixel electrode 191G and the pixel electrode 191B. As the optical adjustment layer, a transparent electrode over the reflective electrode can be used. The light-emitting elements of different colors preferably have the optical adjustment layer 197 with different thickness. The light-emitting element 190G illustrated in FIG. 7B has been optically adjusted using the optical adjustment layer 197G so that the optical path length between the pixel electrode 191G and the common electrode 115 intensifies green light. Similarly, the light-emitting element 190B has been optically adjusted using the optical adjustment layer 197B so that the optical path length between the pixel electrode 191B and the common electrode 115 intensifies blue light.

Display Device 10M

Figure 8A:
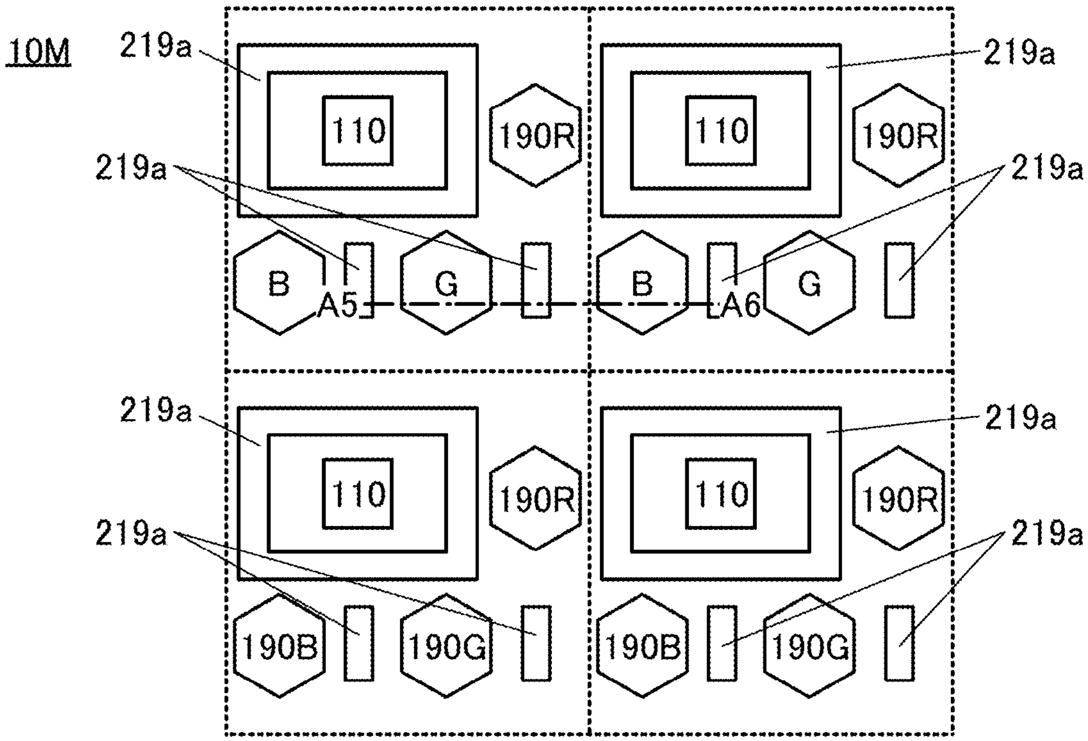
FIG. 8A is a top view illustrating an example of a display device.
Figure 8B:
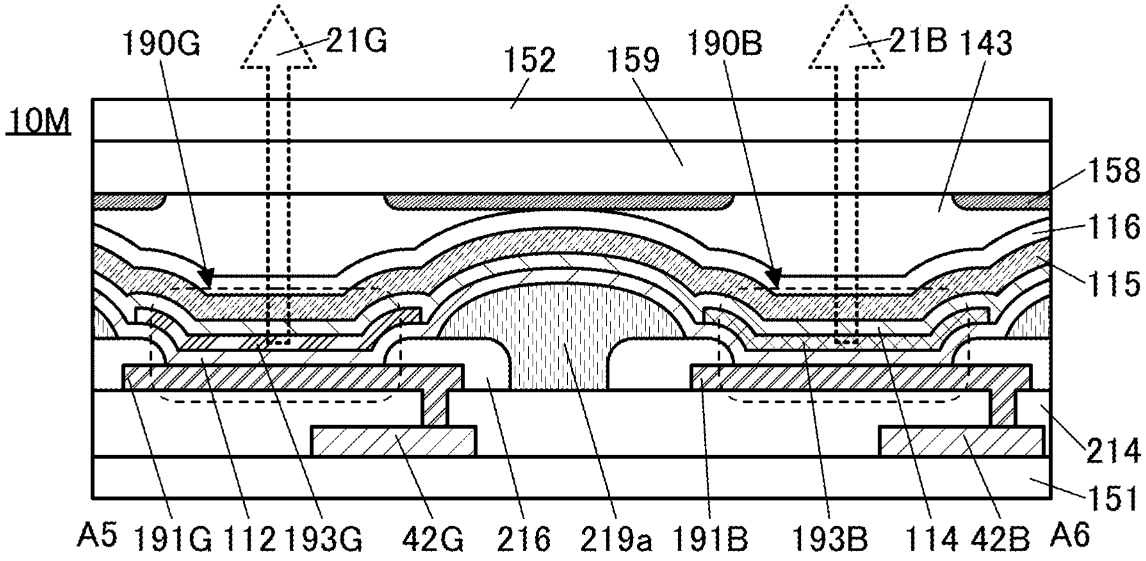
FIG. 8B is a cross-sectional view illustrating an example of the display device.

FIG. 8A illustrates a top view of a display device 10M. FIG. 8B illustrates a cross-sectional view taken along a dashed-dotted line A5-A6 in FIG. 8A.

The display device 10M illustrated in FIG. 8A and FIG. 8B is different from the display device 10K illustrated in FIG. 6A and FIG. 7A in including the light shielding layer 219*a* between the green light-emitting element 190G and the blue light-emitting element 190B and employing a hollow sealing structure in which a space 143 is filled with an inert gas.

As in the display device 10M, the light shielding layer 219*a* may be provided both between the light-emitting element 190R and the light-receiving element 110 and between the light-emitting element 190G and the light-emitting element 190B.

Display Device 10N

Figure 9A:
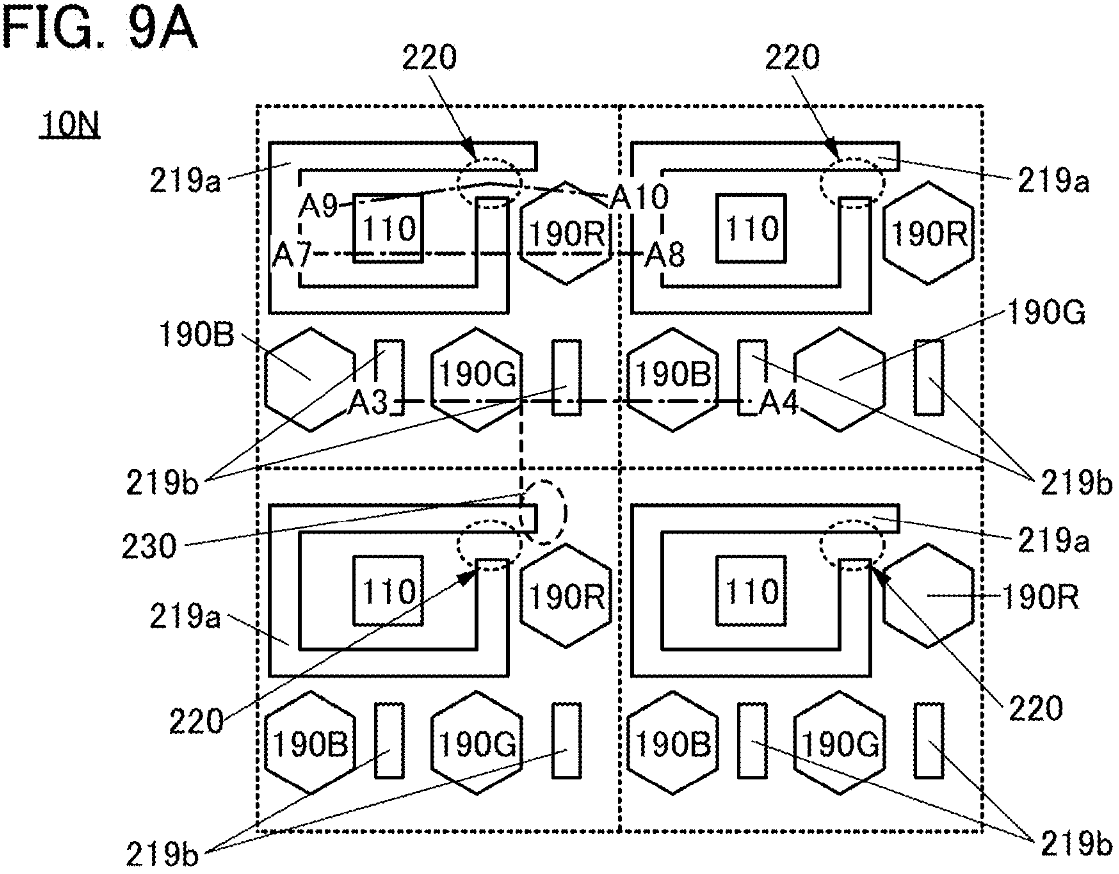
FIG. 9A is a top view illustrating an example of a display device.
Figure 9B:
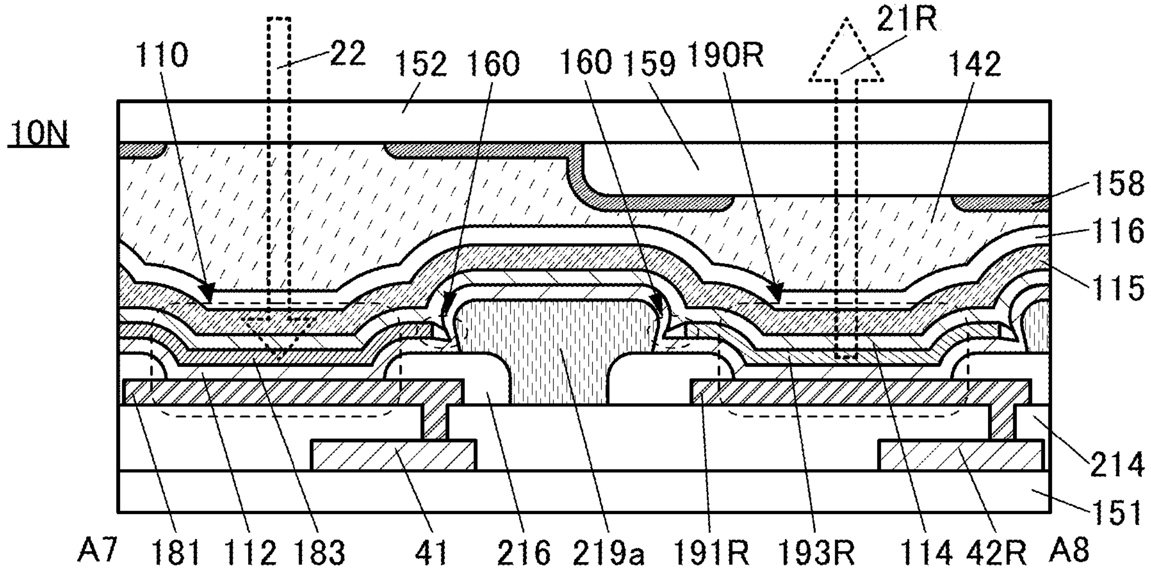
FIG. 9B is a cross-sectional view illustrating an example of the display device.
Figure 10A:
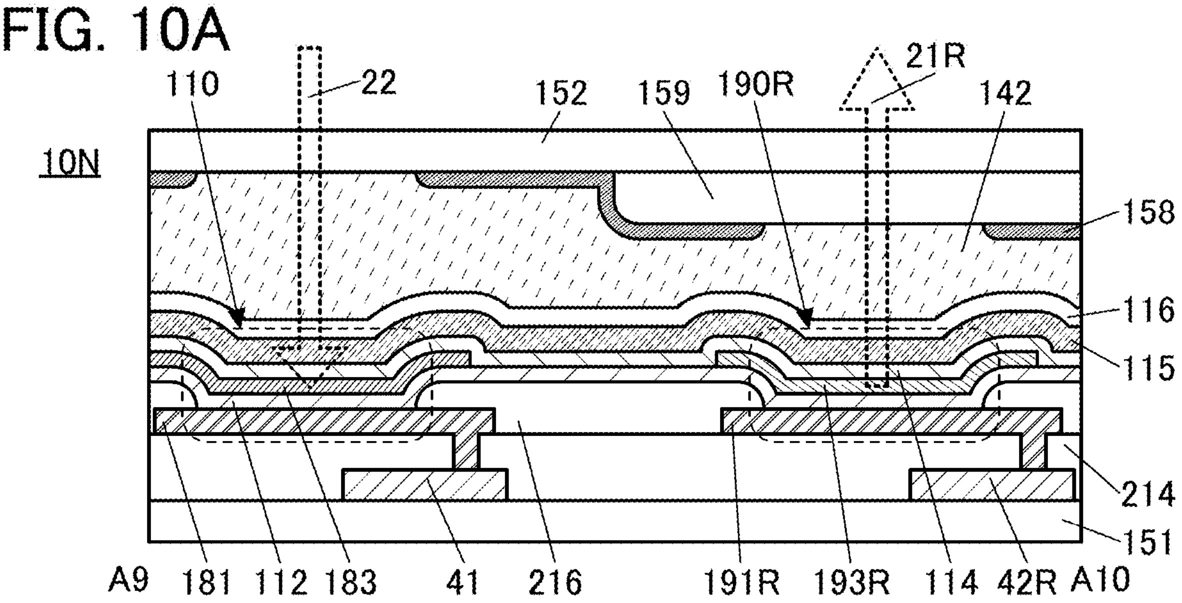
FIG. 10A and FIG. 10B are cross-sectional views illustrating examples of display devices.

FIG. 9A illustrates a top view of a display device 10N. FIG. 9B illustrates a cross-sectional view taken along a dashed-dotted line A7-A8 in FIG. 9A. FIG. 10A illustrates a cross-sectional view taken along a dashed-dotted line A9-A10 in FIG. 9A.

As a cross-sectional structure of the display device 10N (FIG. 9A) taken along the dashed-dotted line A3-A4, a structure similar to that of the display device 10K (FIG. 7A) can be employed. Alternatively, a structure similar to that of the display device 10M (FIG. 8B) may be employed.

The top surface shape and the cross-sectional shape of the light shielding layer 219*a* in the display device 10N are different from those in the display device 10K (FIG. 6A and FIG. 6B).

In the top view (also referred to as plan view), the light shielding layer 219*a* surrounds the four sides of the light-receiving element 110 and has one end and the other end apart from each other. A gap 220 (also referred to as a cut, a disconnected portion, or a missing portion) of the light shielding layer 219*a* is positioned on the red light-emitting element 190R side. Here, in the case where only a light-emitting element that emits light of a specific color is used as a light source for sensing, the gap 220 of the light shielding layer 219*a* is preferably positioned on a light-emitting element side that is different from the light-emitting element used for the sensing. For example, the display device 10N is preferably configured to perform sensing with the use of the green light-emitting element 190G or the blue light-emitting element 190B. Thus, an influence of noise in the sensing can be inhibited. Moreover, in the case where sensing is performed using the green light-emitting element 190G, it is preferred that one end of the light shielding layer 219*a* extend toward the red light-emitting element 190R more than toward the green light-emitting element 190G, as shown in a region 230. Accordingly, stray light from the green light-emitting element 190G can be inhibited from entering the light-receiving element 110 through the gap 220.

The partition wall 216 has an opening between the light-receiving element 110 and the light-emitting element 190R. The light shielding layer 219*a* is provided to cover the opening. The light shielding layer 219*a* preferably covers the opening of the partition wall 216 and a side surface of the partition wall 216 exposed in the opening. Furthermore, the light shielding layer 219*a* preferably covers at least part of the top surface of the partition wall 216.

The light shielding layer 219*a* may have an inverse tapered shape. An organic film and the common electrode 115 that are provided over the inverse tapered light shielding layer 219*a* may be thin around a side surface of the light shielding layer 219*a*. Furthermore, a space 160 is sometimes generated around the side surface of the light shielding layer 219*a*.

Here, if the light shielding layer 219*a* surrounds all the four sides of the light-receiving element 110 in the top view, the common electrode 115 might be broken by the light shielding layer 219*a* and the common electrode 115 might be separated into a portion on the inner side of the light shielding layer 219*a* and a portion on the outer side thereof. In view of this, the gap 220 is provided by making the light shielding layer 219*a* have a top surface shape such that the light shielding layer 219*a* surrounds the four sides of the light-receiving element 110 and its one end is apart from the other end; hence, separation of the common electrode 115 can be inhibited. Consequently, a display defect in the display device 10N can be inhibited.

FIG. 10A is a cross-sectional view including the gap 220 of the light shielding layer 219*a*. In the top view, the partition wall 216 has an opening that surrounds the four sides of the light-receiving element 110 and has one end and the other end apart from each other in a manner similar to the top surface shape of the light shielding layer 219*a*. In the gap 220 of the light shielding layer 219*a*, the common layer 112, the common layer 114, the common electrode 115, and the protective layer 116 are provided in this order over the partition wall 216.

Display Device 10P

Figure 10B:
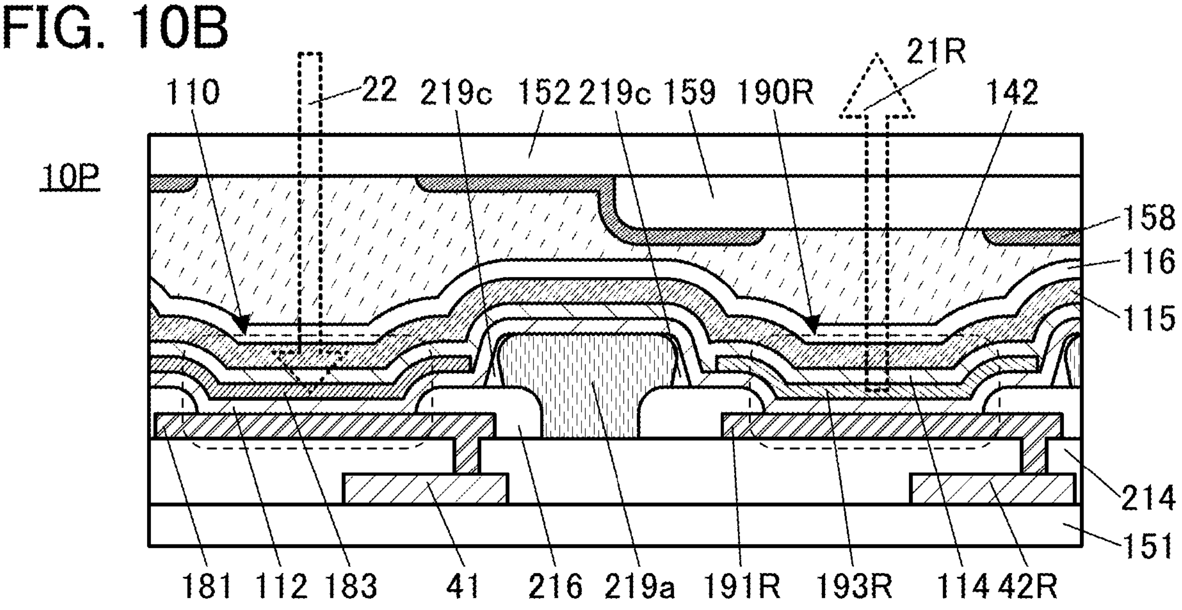

FIG. 10B illustrates a cross-sectional view of a display device 10P.

The display device 10P is different from the display device 10N in including a sidewall 219*c* in contact with a side surface of the light shielding layer 219*a*.

In the display device 10P, the top surface of the light shielding layer 219*a* may have a frame shape as illustrated in FIG. 6A or may have the gap 220 as illustrated in FIG. 9A.

Providing the sidewall 219*c* in contact with the side surface of the inverse tapered light shielding layer 219*a* makes it possible to improve the coverage with the organic film, the common electrode 115, and the like and increase the display quality of the display device. Improvement of the coverage with the common electrode 115 can inhibit breakage and even thickness reduction of the common electrode 115, thereby inhibiting display luminance unevenness due to a voltage drop of the common electrode 115.

The sidewall 219*c* can be formed using a material that can be used for the partition wall 216.

Display Device 10Q

Figure 11A:
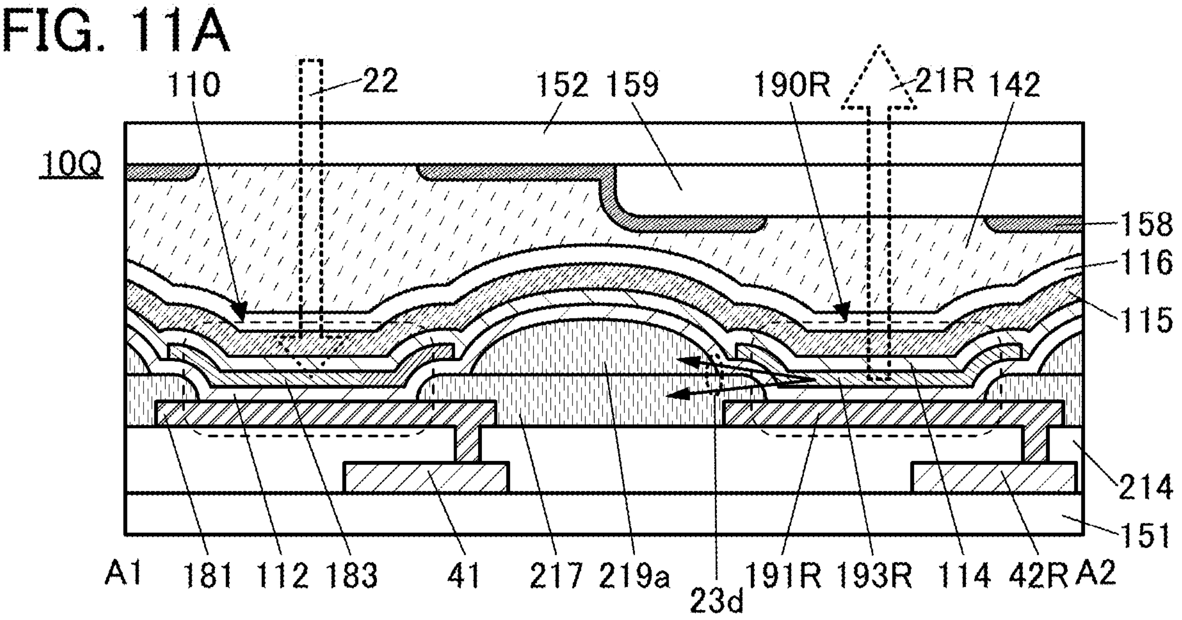
FIG. 11A and FIG. 11B are cross-sectional views illustrating examples of a display device.
Figure 11B:
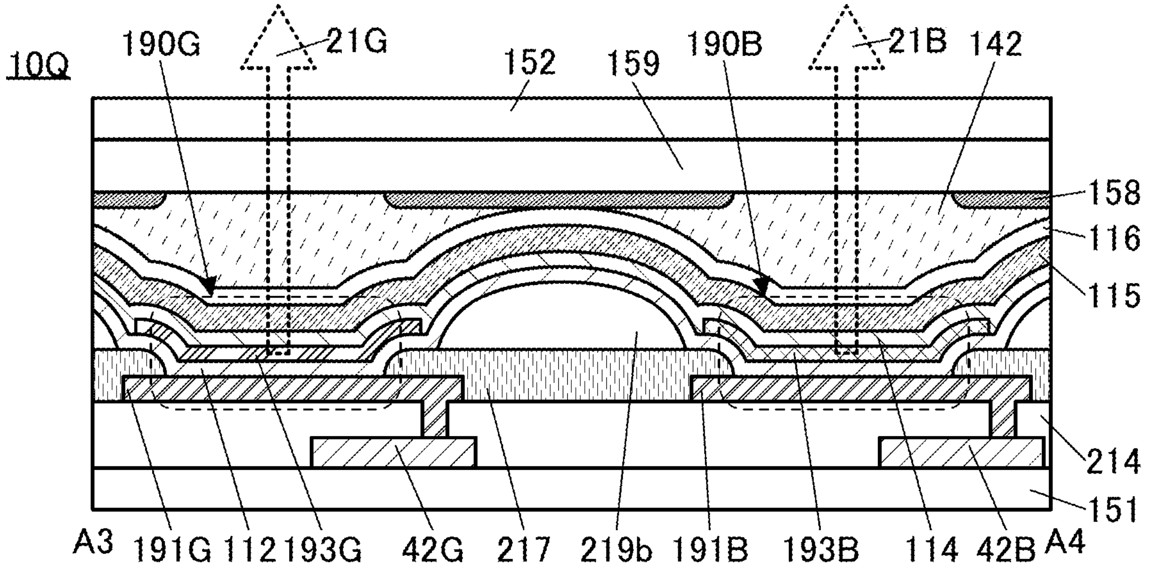

FIG. 11A and FIG. 11B illustrate cross-sectional views of a display device 10Q. The display device 10Q can have a top surface structure similar to that of the display device 10K (FIG. 6A). FIG. 11A illustrates a cross-sectional view taken along the dashed-dotted line A1-A2 in FIG. 6A. FIG. 11B illustrates a cross-sectional view taken along the dashed-dotted line A3-A4 in FIG. 6A.

The display device 10Q is different from the display device 10K mainly in that the partition wall 216 is not included but a partition wall 217 is included.

The light shielding layer 219*a* is positioned over the partition wall 217. Unlike the partition wall 216, the partition wall 217 can absorb light emitted from the light-emitting element; hence, an opening does not need to be provided in the partition wall 217. The stray light 23*d* that enters the partition wall 217 from the light-emitting element is absorbed by the partition wall 217. The stray light 23*d* that enters the light shielding layer 219*a* from the light-emitting element is absorbed by the light shielding layer 219*a*.

The spacer 219*b* is positioned between the light-emitting element 190G and the light-emitting element 190B. The top surface of the spacer 219*b* is preferably closer to the light shielding layer 158 than the top surface of the light shielding layer 219*a* is. When the spacer 219*b* is thinner than the light shielding layer 219*a*, the inside of the frame-shaped light shielding layer 219*a* is not sufficiently filled with the adhesive layer 142 in some cases, which might reduce the reliability of the light-receiving element 110 or even the reliability of the display device 10Q. Therefore, the spacer 219*b* is preferably thicker than the light shielding layer 219*a*. Thus, filling with the adhesive layer 142 can be facilitated. As illustrated in FIG. 11B, the light shielding layer 158 may be in contact with the protective layer 116 (or the common electrode 115) in a portion where the spacer 219*b* and the light shielding layer 158 overlap with each other.

A more detailed structure of the display device of one embodiment of the present invention will be described below with reference to FIG. 12 to FIG. 16.

Display Device 100A

Figure 12:
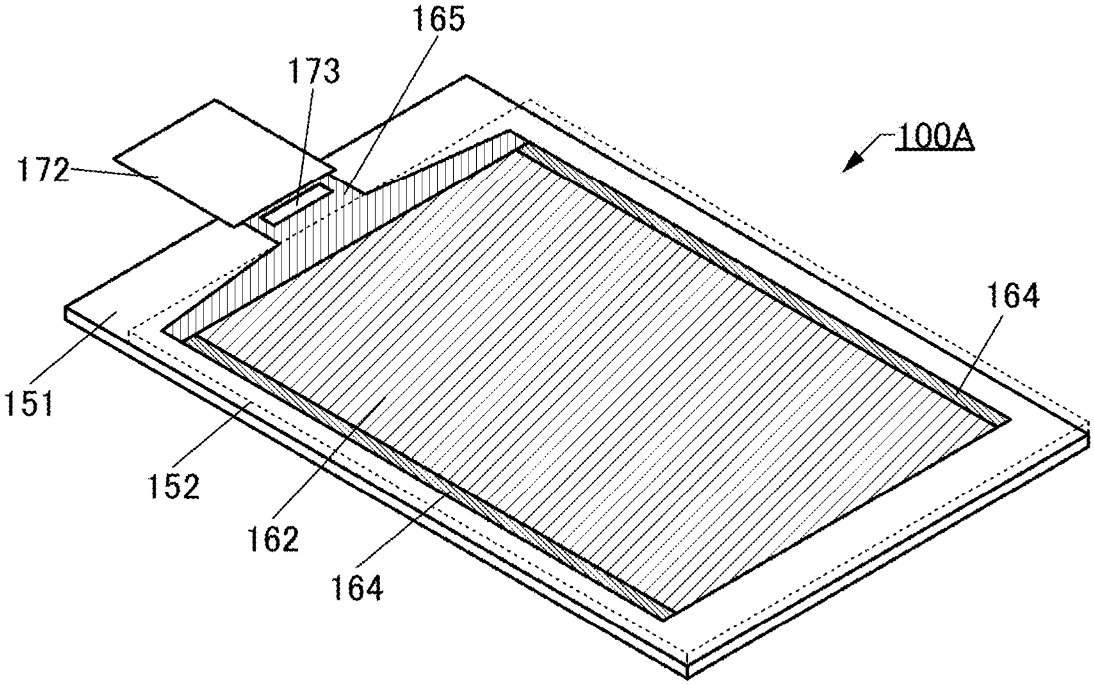
FIG. 12 is a perspective view illustrating an example of a display device.
Figure 13:
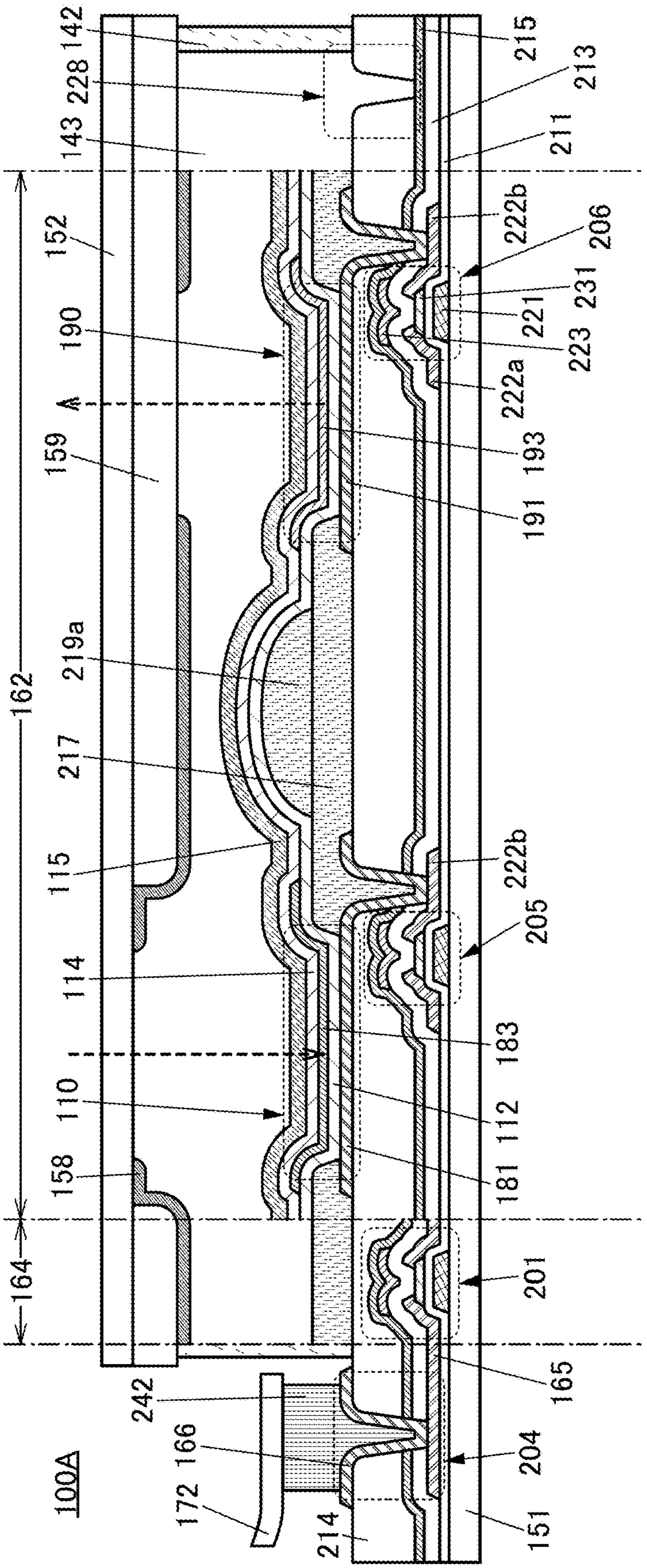
FIG. 13 is a cross-sectional view illustrating an example of the display device.

FIG. 12 illustrates a perspective view of a display device 100A, and FIG. 13 illustrates a cross-sectional view of the display device 100A.

The display device 100A has a structure in which the substrate 152 and the substrate 151 are bonded to each other. In FIG. 12, the substrate 152 is denoted by a dashed line.

The display device 100A includes a display portion 162, a circuit 164, a wiring 165, and the like. FIG. 12 illustrates an example in which the display device 100A is provided with an IC (integrated circuit) 173 and an FPC 172. Thus, the structure illustrated in FIG. 12 can be regarded as a display module including the display device 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or from the IC 173.

FIG. 12 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display device 100A and the display module may have a structure that is not provided with an IC. The IC may be implemented on the FPC by a COF method or the like.

FIG. 13 illustrates an example of a cross section of part of a region including the FPC 172, part of the circuit 164, part of the display portion 162, and part of a region including an end portion of the display device 100A.

The display device 100A in FIG. 13 includes a transistor 201, a transistor 205, a transistor 206, the light-emitting element 190, the light-receiving element 110, and the like between the substrate 151 and the substrate 152.

The resin layer 159 and the insulating layer 214 are bonded to each other with the adhesive layer 142. A solid sealing structure, a hollow sealing structure, or the like can be employed to seal the light-emitting element 190 and the light-receiving element 110. In FIG. 13, a hollow sealing structure is employed in which the space 143 surrounded by the substrate 152, the adhesive layer 142, and the substrate 151 is filled with an inert gas (e.g., nitrogen or argon). The adhesive layer 142 may overlap with the light-emitting element 190 and the light-receiving element 110. The space 143 surrounded by the substrate 152, the adhesive layer 142, and the substrate 151 may be filled with a resin different from that of the adhesive layer 142.

The light-emitting element 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222*b* included in the transistor 206 through an opening provided in the insulating layer 214.

An end portion of the pixel electrode 191 is covered with the partition wall 217. The pixel electrode 191 includes a material that reflects visible light, and the common electrode 115 includes a material that transmits visible light.

The light-receiving element 110 has a stacked-layer structure in which the pixel electrode 181, the common layer 112, the active layer 183, the common layer 114, and the common electrode 115 are stacked in this order from the insulating layer 214 side. The pixel electrode 181 is electrically connected to the conductive layer 222*b* included in the transistor 205 through an opening provided in the insulating layer 214. An end portion of the pixel electrode 181 is covered with the partition wall 217. The pixel electrode 181 includes a material that reflects visible light, and the common electrode 115 includes a material that transmits visible light.

Light emitted from the light-emitting element 190 is emitted toward the substrate 152 side. Light enters the light-receiving element 110 through the substrate 152 and the space 143. For the substrate 152, a material having a high visible-light-transmitting property is preferably used.

The pixel electrode 181 and the pixel electrode 191 can be formed using the same material in the same step. The common layer 112, the common layer 114, and the common electrode 115 are used in both the light-receiving element 110 and the light-emitting element 190. The light-receiving element 110 and the light-emitting element 190 can have common components except the active layer 183 and the light-emitting layer 193. Thus, the light-receiving element 110 can be incorporated into the display device 100A without a significant increase in the number of manufacturing steps.

The resin layer 159 and the light shielding layer 158 are provided on a surface of the substrate 152 on the substrate 151 side. The resin layer 159 is provided in a position overlapping with the light-emitting element 190 and is not provided in a position overlapping with the light-receiving element 110. The light shielding layer 158 is provided to cover the surface of the substrate 152 on the substrate 151 side, a side surface of the resin layer 159, and a surface of the resin layer 159 on the substrate 151 side. The light shielding layer 158 has openings in a position overlapping with the light-receiving element 110 and in a position overlapping with the light-emitting element 190. Providing the light shielding layer 158 can control the range where the light-receiving element 110 senses light. Furthermore, with the light shielding layer 158, light can be inhibited from entering the light-receiving element 110 from the light-emitting element 190 without through an object. Hence, a sensor with less noise and high sensitivity can be obtained. Providing the resin layer 159 allows the distance from the light shielding layer 158 to the light-emitting element 190 to be shorter than the distance from the light shielding layer 158 to the light-receiving element 110. Accordingly, viewing angle dependence of display can be inhibited while noise of the sensor is reduced. Thus, both the display quality and imaging quality can be increased.

The structures of the partition wall 217 and the light shielding layer 219*a* in the display device 100A are similar to those in the display device 10Q (FIG. 11A).

The partition wall 217 covers an end portion of the pixel electrode 181 and an end portion of the pixel electrode 191. The light shielding layer 219*a* is provided over the partition wall 217. The light shielding layer 219*a* is positioned between the light-receiving element 110 and the light-emitting element 190. The partition wall 217 and the light shielding layer 219*a* preferably absorb light having a wavelength that is sensed by the light-receiving element 110. This can inhibit stray light from entering the light-receiving element 110.

The transistor 201, the transistor 205, and the transistor 206 are formed over the substrate 151. These transistors can be fabricated using the same material in the same step.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistor are not limited and either a single layer or two or more layers may be employed.

A material through which impurities such as water and hydrogen do not easily diffuse is preferably used for at least one of the insulating layers that cover the transistors. Thus, such an insulating layer can serve as a barrier layer. Such a structure can effectively inhibit diffusion of impurities into the transistors from the outside and increase the reliability of a display device.

An inorganic insulating film is preferably used as each of the insulating layer 211, the insulating layer 213, and the insulating layer 215. As the inorganic insulating film, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that its end portion is positioned on the inner side compared to the end portion of the display device 100A, to prevent the organic insulating film from being exposed at the end portion of the display device 100A.

An organic insulating film is suitable for the insulating layer 214 functioning as a planarization layer. Examples of materials which can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 13, an opening is formed in the insulating layer 214. This can inhibit entry of impurities into the display portion 162 from the outside through the insulating layer 214 even when an organic insulating film is used as the insulating layer 214. Consequently, the display device 100A can have higher reliability.

Each of the transistor 201, the transistor 205, and the transistor 206 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, and the transistor 206. The two gates may be connected to each other and supplied with the same signal to operate the transistor. Alternatively, by supplying a potential for controlling the threshold voltage to one of the two gates and a potential for driving to the other, the threshold voltage of the transistor may be controlled.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be inhibited.

It is preferable that a semiconductor layer of a transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1 or a composition in the vicinity thereof, In:M:Zn=1:1:1.2 or a composition in the vicinity thereof, In:M:Zn=2:1:3 or a composition in the vicinity thereof, In:M:Zn=3:1:2 or a composition in the vicinity thereof, In:M:Zn=4:2:3 or a composition in the vicinity thereof, In:M:Zn=4:2:4.1 or a composition in the vicinity thereof, In:M:Zn=5:1:3 or a composition in the vicinity thereof, In:M:Zn=5:1:6 or a composition in the vicinity thereof, In:M:Zn=5:1:7 or a composition in the vicinity thereof, In:M:Zn=5:1:8 or a composition in the vicinity thereof, In:M:Zn=6:1:6 or a composition in the vicinity thereof, and In:M:Zn=5:2:5 or a composition in the vicinity thereof. Note that a composition in the vicinity includes ±30% of an intended atomic ratio.

For example, in the case where the atomic ratio is described as In:Ga:Zn=4:2:3 or a composition in the vicinity thereof, the case is included where the atomic proportion of Ga is greater than or equal to 1 and less than or equal to 3 and the atomic proportion of Zn is greater than or equal to 2 and less than or equal to 4 with the atomic proportion of In being 4. In the case where the atomic ratio is described as In:Ga:Zn=5:1:6 or a composition in the vicinity thereof, the case is included where the atomic proportion of Ga is greater than 0.1 and less than or equal to 2 and the atomic proportion of Zn is greater than or equal to 5 and less than or equal to 7 with the atomic proportion of In being 5. In the case where the atomic ratio is described as In:Ga:Zn=1:1:1 or a composition in the vicinity thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 151 not overlapping with the substrate 152. In the connection portion 204, the wiring 165 is electrically connected to the FPC 172 through a conductive layer 166 and a connection layer 242. On a top surface of the connection portion 204, the conductive layer 166 obtained by processing the same conductive film as the pixel electrode 181 is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film suppressing the attachment of stain, a hard coat film inhibiting generation of a scratch caused by the use, a shock absorbing layer or the like may be arranged on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the display device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting element 190 may be of a top emission type, a bottom emission type, a dual emission type, or the like. A conductive film that transmits visible light is used as the electrode through which light is extracted. A conductive film that reflects visible light is preferably used as the electrode through which no light is extracted.

The light-emitting element 190 includes at least the light-emitting layer 193. The light-emitting element 190 may further include, as a layer other than the light-emitting layer 193, a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like. For example, the common layer 112 preferably includes one or both of a hole-injection layer and a hole-transport layer. For example, the common layer 114 preferably includes one or both of an electron-transport layer and an electron-injection layer.

The hole-injection layer is a layer injecting holes from an anode to a light-emitting element, and a layer containing a material with a high hole-injection property. As the material with a high hole-injection property, an aromatic amine compound and a composite material containing a hole-transport material and an acceptor material (electron-accepting material) can be used.

In the light-emitting element, the hole-transport layer is a layer transporting holes, which are injected from the anode by the hole-injection layer, to the light-emitting layer. In the light-receiving element, the hole-transport layer is a layer transporting holes, which are generated in the active layer on the basis of incident light, to the anode. The hole-transport layer is a layer including a hole-transport material. As the hole-transport material, a substance having a hole mobility of greater than or equal to $10^{-6}$ $cm^2/Vs$ is preferable. Note that other substances can also be used as long as they have a property of transporting more holes than electrons. As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer transporting electrons, which are injected from the cathode by the electron-injection layer, to the light-emitting layer. In the light-receiving element, the electron-transport layer is a layer transporting electrons, which are generated in the active layer on the basis of incident light, to the cathode. The electron-transport layer is a layer including an electron-transport material. As the electron-transport material, a substance having an electron mobility of greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a x-electron deficient heteroaromatic compound such as a nitrogen-containing heteroaromatic compound.

The electron-injection layer is a layer injecting electrons from a cathode to a light-emitting element, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

Either a low molecular compound or a high molecular compound can be used for the common layer 112, the light-emitting layer 193, and the common layer 114 and an inorganic compound may also be contained. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 is a layer containing a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

The active layer 183 of the light-receiving element 110 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 of the light-emitting element 190 and the active layer 183 of the light-receiving element 110 can be formed by the same method (e.g., a vacuum evaporation method) and thus the same manufacturing apparatus can be used.

Examples of an n-type semiconductor material included in the active layer 183 are electron-accepting organic semiconductor materials such as fullerene (e.g., $C_{60}$ and $C_{70}$) and derivatives thereof. As a p-type semiconductor material included in the active layer 183, an electron-donating organic semiconductor material such as copper(II) phthalocyanine (CuPc), tetraphenyldibenzoperiflanthene (DBP), or zinc phthalocyanine (ZnPc) can be given. As a p-type semiconductor material, tin phthalocyanine (SnPc) may be used.

For example, the active layer 183 is preferably formed by co-evaporation of an n-type semiconductor and a p-type semiconductor.

As materials that can be used for a gate, a source, and a drain of a transistor and conductive layers such as a variety of wirings and electrodes included in a display device, metals such as aluminum, titanium, chromium, nickel, copper, yttrium, zirconium, molybdenum, silver, tantalum, and tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used for the conductive layers. For example, when a stacked film of indium tin oxide and an alloy of silver and magnesium, or the like is used, the conductivity can be increased, which is preferable. They can also be used for conductive layers such as a variety of wirings and electrodes included in a display device, and conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

Display Device 100B

FIG. 14A illustrates a cross-sectional view of a display device 100B.

The display device 100B is different from the display device 100A mainly in that the display device 100B includes the protective layer 116 and has a solid sealing structure.

Providing the protective layer 116 covering the light-receiving element 110 and the light-emitting element 190 can inhibit entry of impurities such as water into the light-receiving element 110 and the light-emitting element 190, so that the reliability of the light-receiving element 110 and the light-emitting element 190 can be increased.

In the region 228 in the vicinity of an end portion of the display device 100B, the insulating layer 215 and the protective layer 116 are preferably in contact with each other through an opening in the insulating layer 214. In particular, the inorganic insulating film included in the insulating layer 215 and the inorganic insulating film included in the protective layer 116 are preferably in contact with each other. Thus, entry of impurities from the outside into the display portion 162 through the organic insulating film can be inhibited. Consequently, the display device 100B can have higher reliability.

FIG. 14B illustrates an example in which the protective layer 116 has a three-layer structure. In FIG. 18B, the protective layer 116 includes an inorganic insulating layer **116*a* over the common electrode 115, an organic insulating layer 116*b* over the inorganic insulating layer 116*a*, and an inorganic insulating layer 116*c* over the organic insulating layer 116*b***.

An end portion of the inorganic insulating layer **116*a* and an end portion of the inorganic insulating layer 116*c* extend beyond an end portion of the organic insulating layer 116*b* and are in contact with each other. The inorganic insulating layer 116*a* is in contact with the insulating layer 215 (inorganic insulating layer) through the opening in the insulating layer 214 (organic insulating layer). Accordingly, the light-receiving element 110 and the light-emitting element 190 can be surrounded by the insulating layer 215 and the protective layer 116, whereby the reliability of the light-receiving element 110 and the light-emitting element 190** can be increased.

As described above, the protective layer 116 may have a stacked-layer structure of an organic insulating film and an inorganic insulating film. In that case, an end portion of the inorganic insulating film preferably extends beyond an end portion of the organic insulating film.

In the display device 100B, the protective layer 116 and the substrate 152 are bonded to each other with the adhesive layer 142. The adhesive layer 142 is provided to overlap with the light-receiving element 110 and the light-emitting element 190; that is, the display device 100B employs a solid sealing structure.

Display Device 100C

Figure 15:
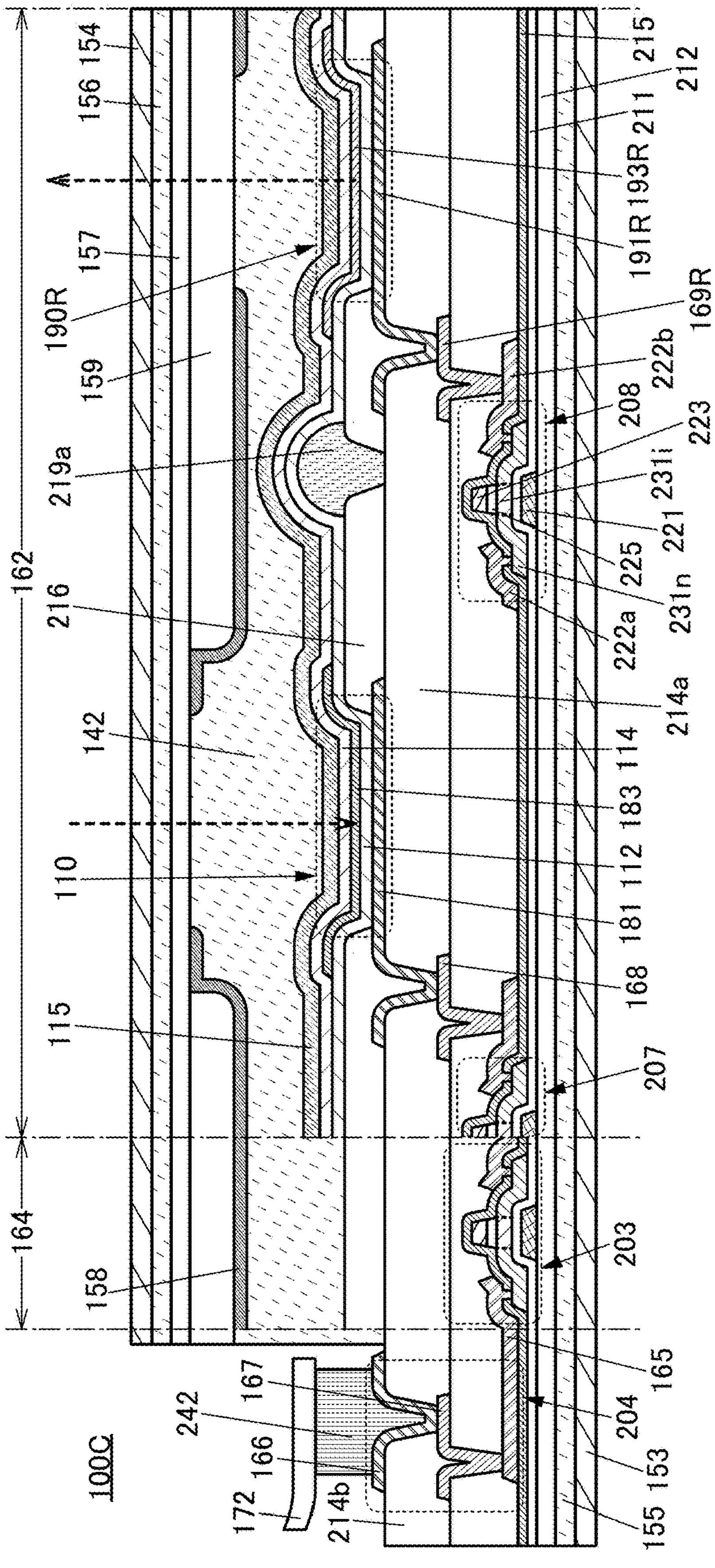
FIG. 15 is a cross-sectional view illustrating an example of a display device.
Figure 16A:
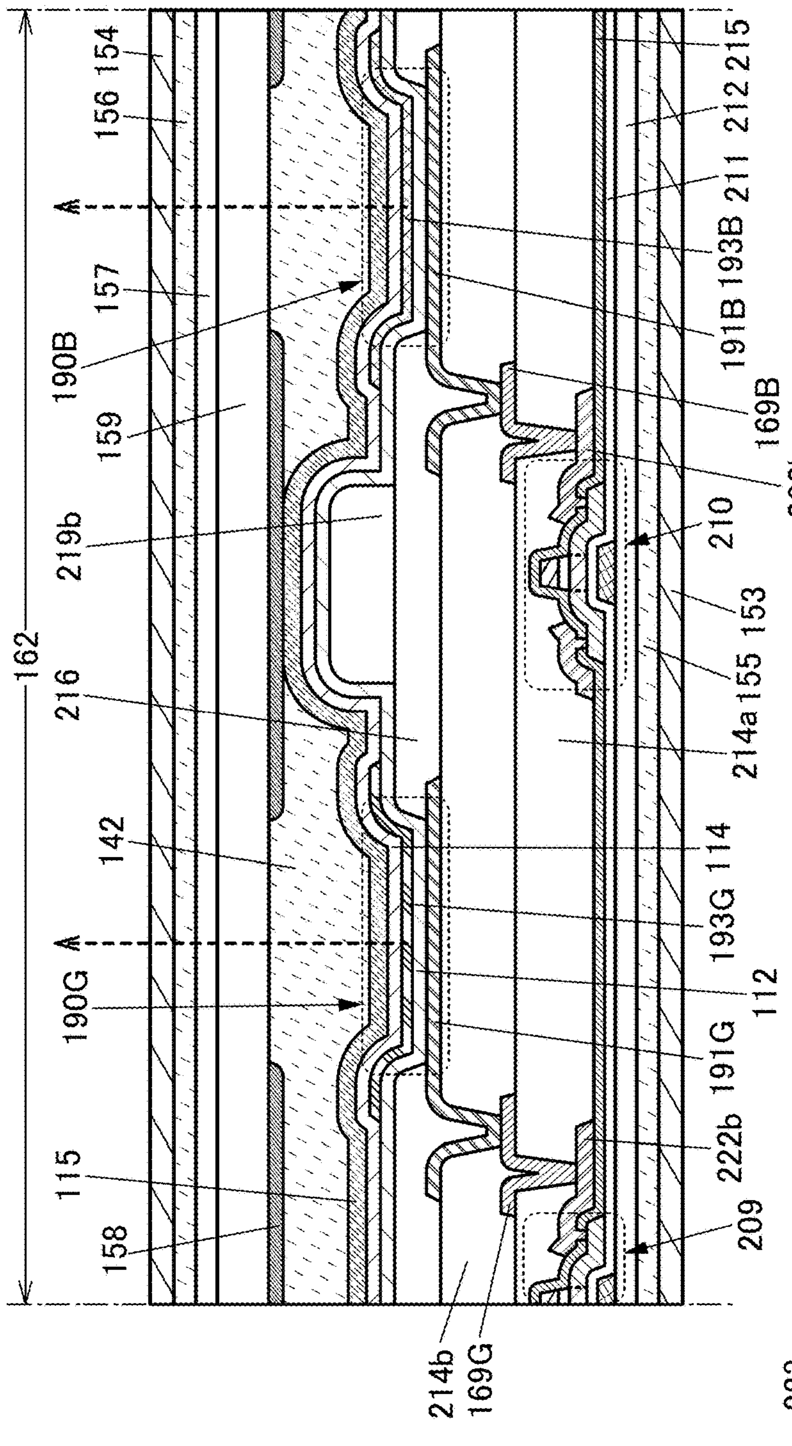
FIG. 16A is a cross-sectional view illustrating an example of the display device.

FIG. 15 and FIG. 16A illustrate cross-sectional views of a display device 100C. A perspective view of the display device 100C is similar to that of the display device 100A (FIG. 12). FIG. 15 illustrates an example of cross sections of part of a region including the FPC 172, part of the circuit 164, and part of the display portion 162 in the display device 100C. FIG. 16A illustrates an example of a cross section of part of the display portion 162 in the display device 100C. FIG. 15 specifically illustrates an example of a cross section of a region including the light-receiving element 110 and the light-emitting element 190R that emits red light in the display portion 162. FIG. 16A specifically illustrates an example of a cross section of a region including the light-emitting element 190G that emits green light and the light-emitting element 190B that emits blue light in the display portion 162.

The display device 100C illustrated in FIG. 15 and FIG. 16A includes a transistor 203, a transistor 207, a transistor 208, a transistor 209, a transistor 210, the light-emitting element 190R, the light-emitting element 190G, the light-emitting element 190B, the light-receiving element 110, and the like between the substrate 153 and the substrate 154.

The resin layer 159 and the common electrode 115 are bonded to each other with the adhesive layer 142, and the display device 100C employs a solid sealing structure.

The substrate 153 and the insulating layer 212 are bonded to each other with the adhesive layer 155. The substrate 154 and the insulating layer 157 are bonded to each other with an adhesive layer 156.

To fabricate the display device 100C, first, a first formation substrate provided with the insulating layer 212, the transistors, the light-receiving element 110, the light-emitting elements, and the like and a second formation substrate provided with the insulating layer 157, the resin layer 159, the light shielding layer 158, and the like are bonded to each other with the adhesive layer 142. Then, the substrate 153 is bonded to a surface exposed by separation of the first formation substrate, and the substrate 154 is bonded to a surface exposed by separation of the second formation substrate, whereby the components formed over the first formation substrate and the second formation substrate are transferred to the substrate 153 and the substrate 154. The substrate 153 and the substrate 154 are preferably flexible. Accordingly, the flexibility of the display device 100C can be increased.

The inorganic insulating film that can be used as the insulating layer 211, the insulating layer 213, and the insulating layer 215 can be used as the insulating layer 212 and the insulating layer 157.

The light-emitting element 190R has a stacked-layer structure in which the pixel electrode 191R, the common layer 112, the light-emitting layer 193R, the common layer 114, and the common electrode 115 are stacked in this order from an insulating layer 214*b* side. The pixel electrode 191R is connected to a conductive layer 169R through an opening provided in the insulating layer 214*b*. The conductive layer 169R is connected to the conductive layer 222*b* included in the transistor 208 through an opening provided in an insulating layer 214*a*. The conductive layer 222*b* is connected to a low-resistance region 231*n* through an opening provided in the insulating layer 215. That is, the pixel electrode 191R is electrically connected to the transistor 208. The transistor 208 has a function of controlling the driving of the light-emitting element 190R.

Similarly, the light-emitting element 190G has a stacked-layer structure in which the pixel electrode 191G, the common layer 112, the light-emitting layer 193G, the common layer 114, and the common electrode 115 are stacked in this order from the insulating layer 214*b* side. The pixel electrode 191G is electrically connected to the low-resistance region 231*n* of the transistor 209 through a conductive layer 169G and the conductive layer 222*b* of the transistor 209. That is, the pixel electrode 191G is electrically connected to the transistor 209. The transistor 209 has a function of controlling the driving of the light-emitting element 190G.

In addition, the light-emitting element 190B has a stacked-layer structure in which the pixel electrode 191B, the common layer 112, the light-emitting layer 193B, the common layer 114, and the common electrode 115 are stacked in this order from the insulating layer 214*b* side. The pixel electrode 191B is electrically connected to the low-resistance region 231*n* of the transistor 210 through a conductive layer 169B and the conductive layer 222*b* of the transistor 210. That is, the pixel electrode 191B is electrically connected to the transistor 210. The transistor 210 has a function of controlling the driving of the light-emitting element 190B.

The light-receiving element 110 has a stacked-layer structure in which the pixel electrode 181, the common layer 112, the active layer 183, the common layer 114, and the common electrode 115 are stacked in this order from the insulating layer 214*b* side. The pixel electrode 181 is electrically connected to the low-resistance region 231*n* of the transistor 207 through a conductive layer 168 and the conductive layer 222*b* of the transistor 207. That is, the pixel electrode 181 is electrically connected to the transistor 207.

End portions of the pixel electrodes 181, 191R, 191G, and 191B are covered with the partition wall 216. The pixel electrodes 181, 191R, 191G, and 191B include a material that reflects visible light, and the common electrode 115 includes a material that transmits visible light.

Light emitted from the light-emitting elements 190R, 190G, and 190B is emitted toward the substrate 154 side. Light enters the light-receiving element 110 through the substrate 154 and the adhesive layer 142. For the substrate 154, a material having a high visible-light-transmitting property is preferably used.

The pixel electrode 181 and the pixel electrode 191 can be formed using the same material in the same step. The common layer 112, the common layer 114, and the common electrode 115 are used in common in the light-receiving element 110 and the light-emitting elements 190R, 190G, and 190B. The light-receiving element 110 and the light-emitting elements of each color can have common components except the active layer 183 and the light-emitting layer. Thus, the light-receiving element 110 can be incorporated into the display device 100C without a significant increase in the number of manufacturing steps.

The resin layer 159 and the light shielding layer 158 are provided on a surface of the insulating layer 157 on the substrate 153 side. The resin layer 159 is provided in positions overlapping with the light-emitting elements 190R, 190G, and 190B and is not provided in a position overlapping with the light-receiving element 110. The light shielding layer 158 is provided to cover the surface of the insulating layer 157 on the substrate 153 side, a side surface of the resin layer 159, and a surface of the resin layer 159 on the substrate 153 side. The light shielding layer 158 has openings in a position overlapping with the light-receiving element 110 and in positions overlapping with the light-emitting elements 190R, 190G, and 190B. Providing the light shielding layer 158 can control the range where the light-receiving element 110 senses light. Furthermore, with the light shielding layer 158, light can be inhibited from entering the light-receiving element 110 from the light-emitting elements 190R, 190G, and 190B without through an object. Hence, a sensor with less noise and high sensitivity can be obtained. Providing the resin layer 159 allows the distance from the light shielding layer 158 to the light-emitting element of each color to be shorter than the distance from the light shielding layer 158 to the light-receiving element 110. Accordingly, viewing angle dependence of display can be inhibited while noise of the sensor is reduced. Thus, both the display quality and imaging quality can be increased.

The structures of the partition wall 216, the light shielding layer 219*a*, and the spacer 219*b* in the display device 100C are similar to those in the display device 10K (FIG. 6B and FIG. 7A).

In FIG. 15, the partition wall 216 has an opening between the light-receiving element 110 and the light-emitting element 190R. The light shielding layer 219*a* is provided to fill the opening. The light shielding layer 219*a* is positioned between the light-receiving element 110 and the light-emitting element 190R. The light shielding layer 219*a* absorbs light emitted from the light-emitting element 190R. This can inhibit stray light from entering the light-receiving element 110.

The spacer 219*b* is positioned between the light-emitting element 190G and the light-emitting element 190B. The top surface of the spacer 219*b* is preferably closer to the light shielding layer 158 than the top surface of the light shielding layer 219*a* is. For example, the sum of the height (thickness) of the partition wall 216 and the height (thickness) of the spacer 219*b* is preferably larger than the height (thickness) of the light shielding layer 219*a*. Thus, filling with the adhesive layer 142 can be facilitated. As illustrated in FIG. 16A, the light shielding layer 158 may be in contact with the common electrode 115 (or the protective layer) in a portion where the spacer 219*b* and the light shielding layer 158 overlap with each other.

The connection portion 204 is provided in a region of the substrate 153 not overlapping with the substrate 154. In the connection portion 204, the wiring 165 is electrically connected to the FPC 172 through a conductive layer 167, the conductive layer 166, and the connection layer 242. The conductive layer 167 can be obtained by processing the same conductive film as the conductive layer 168. On the top surface of the connection portion 204, the conductive layer 166 obtained by processing the same conductive film as the pixel electrode 181 is exposed. Thus, the connection portion 204 and the FPC 172 can be electrically connected to each other through the connection layer 242.

Each of the transistor 207, the transistor 208, the transistor 209, and the transistor 210 includes the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are each connected to the low-resistance region 231*n* through openings provided in the insulating layer 215. One of the conductive layer 222*a* and the conductive layer 222*b* serves as a source, and the other serves as a drain.

In FIG. 15, the insulating layer 225 overlaps with the channel formation region 231*i* of the semiconductor layer 231 and does not overlap with the low-resistance regions 231*n*. The structure illustrated in FIG. 15 can be obtained by processing the insulating layer 225 with the conductive layer 223 as a mask, for example. In FIG. 15, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, the protective layer 116 covering the transistor may be provided.

Figure 16B:
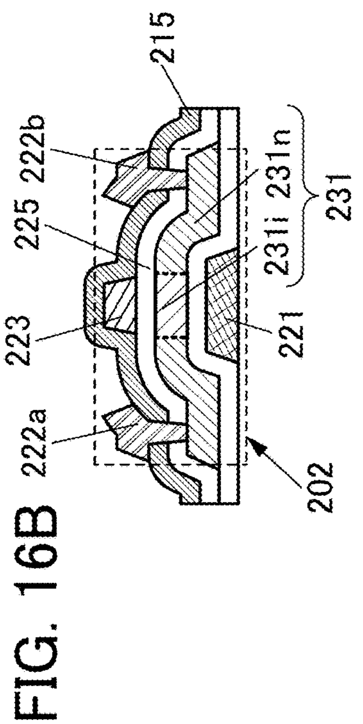
FIG. 16B is a cross-sectional view illustrating an example of a transistor.

In contrast, FIG. 16B illustrates an example of a transistor 202 in which the insulating layer 225 covers a top surface and a side surface of the semiconductor layer. The conductive layer 222*a* and the conductive layer 222*b* are each connected to the corresponding low-resistance region 231*n* through openings provided in the insulating layer 225 and the insulating layer 215.

Metal Oxide

A metal oxide that can be used for the semiconductor layer will be described below. Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) or CAC (Cloud-Aligned Composite) may be stated. CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an indium-gallium-zinc oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

As described above, the display device of this embodiment includes a light-receiving element and a light-emitting element in a display portion, and the display portion has both a function of displaying an image and a function of sensing light. Thus, the size and weight of an electronic device can be reduced as compared to the case where a sensor is provided outside a display portion or outside a display device. Moreover, an electronic device having more functions can be obtained by a combination of the display device of this embodiment and a sensor provided outside the display portion or outside the display device.

In the light-receiving element, at least one of the layers provided between a pair of electrodes can be shared with the light-emitting element (EL element). For example, in the light-receiving element, all of the layers other than the active layer can be shared with the layers in the light-emitting element (EL element). In other words, with only the addition of the step of forming the active layer to the manufacturing process of the light-emitting element, the light-emitting element and the light-receiving element can be formed over one substrate. In the light-receiving element and the light-emitting element, their pixel electrodes can be formed using the same material in the same step, and their common electrodes can be formed using the same material in the same steps. When a circuit electrically connected to the light-receiving element and a circuit electrically connected to the light-emitting element are formed using the same material in the same steps, the manufacturing process of the display device can be simplified. In such a manner, a display device that incorporates a light-receiving element and is highly convenient can be manufactured without complicated steps.

In the display device of this embodiment, on a surface where the light shielding layer is formed, a component is provided so that the distance from the light shielding layer to the light-receiving element is long and the distance from the light shielding layer to the light-emitting element is short. Accordingly, noise of the sensor can be reduced, the image-capturing resolution can be increased, and viewing angle dependence of display can be inhibited. Thus, both the display quality and imaging quality of the display device can be increased.

This embodiment can be combined with the other embodiments as appropriate. In this specification, in the case where a plurality of structure examples are shown in one embodiment, the structure examples can be combined as appropriate.

Embodiment 2

In this embodiment, a display device of one embodiment of the present invention will be described with reference to FIG. 17 and FIG. 18.

Pixel Circuit Example 1

A display device of one embodiment of the present invention includes first pixel circuits including a light-receiving element and second pixel circuits including a light-emitting element. The first pixel circuits and the second pixel circuits are arranged in a matrix.

Figure 17A:
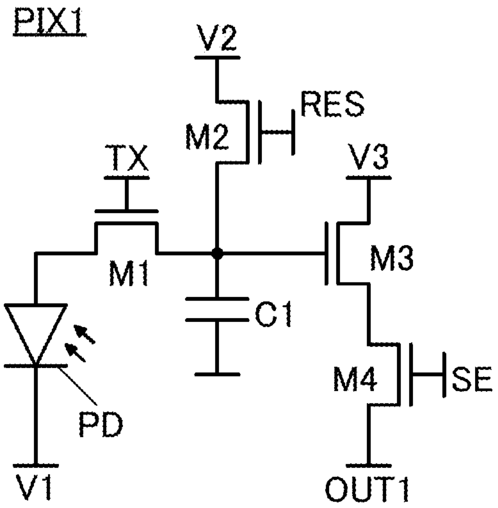
FIG. 17A and FIG. 17B are circuit diagrams illustrating examples of pixel circuits.
Figure 17B:
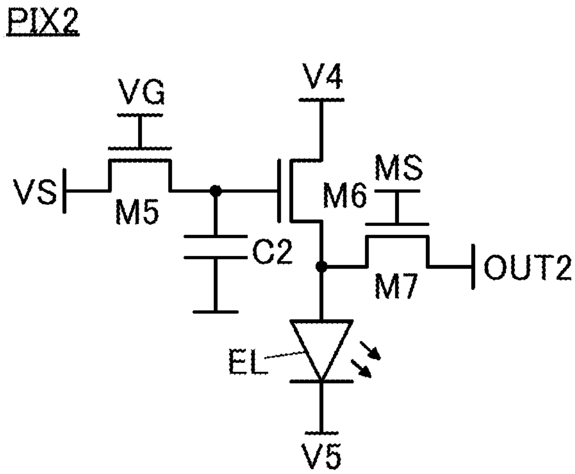

FIG. 17A illustrates an example of the first pixel circuit including a light-receiving element. FIG. 17B illustrates an example of the second pixel circuit including a light-emitting element.

A pixel circuit PIX1 illustrated in FIG. 17A includes the light-receiving element PD, a transistor M1, a transistor M2, a transistor M3, a transistor M4, and a capacitor C1. Here, an example in which a photodiode is used as the light-receiving element PD is illustrated.

A cathode of the light-receiving element PD is electrically connected to a wiring V1, and an anode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential is supplied to the wiring V1, the wiring V2, and the wiring V3. When the light-receiving element PD is driven with a reverse bias, the wiring V2 can be supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 17B includes a light-emitting element EL, a transistor M5, a transistor M6, a transistor M7, and a capacitor C2. Here, an example in which a light-emitting diode is used as the light-emitting element EL is illustrated. In particular, an organic EL element is preferably used as the light-emitting element EL.

A gate of the transistor M5 is electrically connected to a wiring VG, one of a source and a drain is electrically connected to a wiring VS, and the other of the source and the drain is electrically connected to one electrode of the capacitor C2 and a gate of the transistor M6. One of a source and a drain of the transistor M6 is electrically connected to a wiring V4, and the other of the source and the drain is electrically connected to an anode of the light-emitting element EL and one of a source and a drain of the transistor M7. A gate of the transistor M7 is electrically connected to a wiring MS, and the other of the source and the drain is electrically connected to a wiring OUT2. A cathode of the light-emitting element EL is electrically connected to a wiring V5.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

Here, a transistor in which a metal oxide (an oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charges accumulated in a capacitor that is connected in series with the transistor for a long time. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 17A and FIG. 17B, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuits PIX1 and the transistors included in the pixel circuits PIX2 be periodically arranged in one region.

One or more layers including one or both of the transistor and the capacitor are preferably provided to overlap with the light-receiving element PD or the light-emitting element EL. Thus, the effective area of each pixel circuit can be reduced, and a high-resolution light-receiving portion or display portion can be achieved.

Pixel Circuit Example 2

Figure 18A:
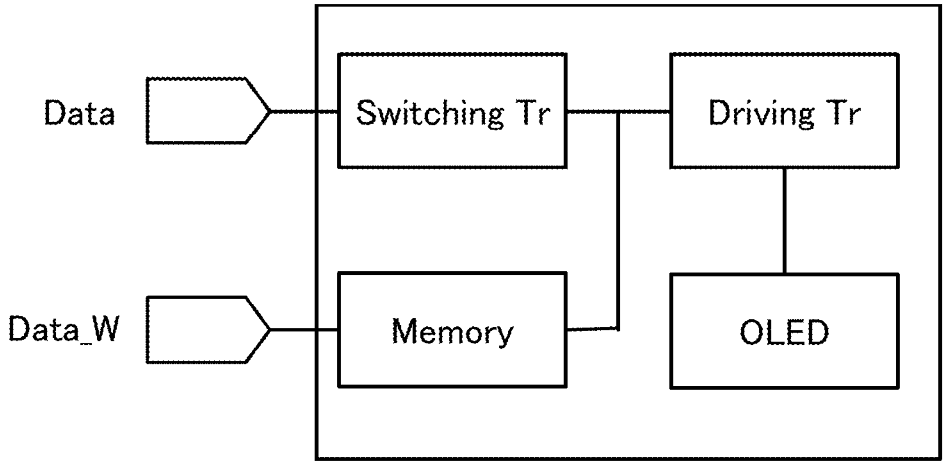
FIG. 18A is a block diagram illustrating an example of a pixel.
Figure 18B:
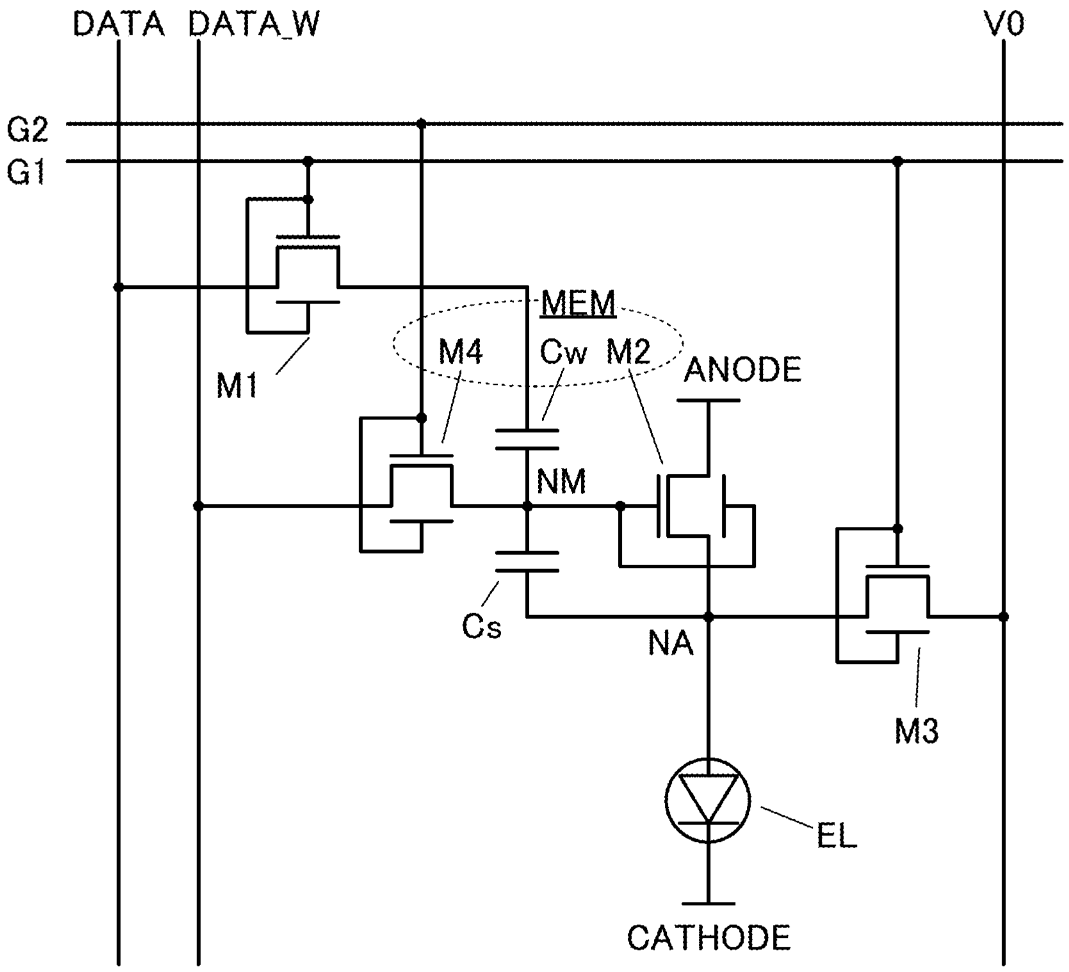
FIG. 18B is a circuit diagram illustrating an example of a pixel circuit.

FIG. 18A illustrates a block diagram of a pixel. The pixel illustrated in FIG. 18A includes a memory (Memory) in addition to a switching transistor (Switching Tr), a driving transistor (Driving Tr), and a light-emitting element (OLED).

Data Data_W is supplied to the memory. When the data Data_W is supplied to the pixel in addition to display data Data, a current flowing through the light-emitting element is large, so that the display device can have high luminance.

The display device of one embodiment of the present invention captures images in such a manner that light reflected by a subject is sensed by the light-receiving element with the use of light emitted from the light-emitting element as a light source. The light-emitting element used as the light source is driven on the basis of the display data Data and the data Data_W, whereby the light-emitting element can emit light with high luminance. Higher luminance of the light-emitting element results in a higher S/N ratio. Accordingly, the light detection sensitivity of the light-receiving element can be increased.

FIG. 18B illustrates a specific circuit diagram of the pixel circuit.

The pixel illustrated in FIG. 18B includes the transistor M1, the transistor M2, the transistor M3, the transistor M4, a capacitor Cs, a capacitor Cw, and the light-emitting element EL.

One of the source and the drain of the transistor M1 is electrically connected to one electrode of the capacitor Cw. The other electrode of the capacitor Cw is electrically connected to one of the source and the drain of the transistor M4. The one of the source and the drain of the transistor M4 is electrically connected to the gate of the transistor M2. The gate of the transistor M2 is electrically connected to one electrode of the capacitor Cs. The other electrode of the capacitor Cs is electrically connected to one of the source and the drain of the transistor M2. The one of the source and the drain of the transistor M2 is electrically connected to one of the source and the drain of the transistor M3. One of the source and the drain of the transistor M3 is electrically connected to one electrode of the light-emitting element EL. The transistors illustrated in FIG. 18B each include a back gate electrically connected to its gate; however, the connection of the back gate is not limited thereto. The transistor does not necessarily include the back gate.

Here, a node to which the other electrode of the capacitor Cw, the one of the source and the drain of the transistor M4, the gate of the transistor M2, and the one electrode of the capacitor Cs are connected is referred to as a node NM. Moreover, a node to which the other electrode of the capacitor Cs, the one of the source and the drain of the transistor M2, the one of the source and the drain of the transistor M3, and the one electrode of the light-emitting element EL are connected is referred to as a node NA.

The gate of the transistor M1 is electrically connected to a wiring G1. The gate of the transistor M3 is electrically connected to the wiring G1. The gate of the transistor M4 is electrically connected to a wiring G2. The other of the source and the drain of the transistor M1 is electrically connected to a wiring DATA. The other of the source and the drain of the transistor M3 is electrically connected to a wiring V0. The other of the source and the drain of the transistor M4 is electrically connected to a wiring DATA_W.

The other of the source and the drain of the transistor M2 is electrically connected to a wiring ANODE (the high potential side). The other electrode of the light-emitting element EL is electrically connected to a wiring CATHODE (the low potential side).

The wiring G1 and the wiring G2 can have a function as signal lines for controlling the operation of the transistors. The wiring DATA can have a function as a signal line for supplying an image signal to the pixel. The wiring DATA_W can have a function as a signal line for writing data to a memory circuit MEM. The wiring DATA_W can have a function as a signal line for supplying a correction signal to the pixel. The wiring V0 has a function as a monitor line for obtaining the electrical characteristics of the transistor M4. A specific potential is supplied from the wiring V0 to the other electrode of the capacitor Cs through the transistor M3, whereby writing of an image signal can be stable.

The memory circuit MEM is formed of the transistor M2, the transistor M4, and the capacitor Cw. The node NM is a storage node; when the transistor M4 is turned on, a signal supplied to the wiring DATA_W can be written to the node NM. The use of a transistor with an extremely low off-state current as the transistor M4 allows the potential of the node NM to be retained for a long time.

As the transistor M4, a transistor containing a metal oxide in its channel formation region (hereinafter, OS transistor) can be used, for example. Thus, the off-state current of the transistor M4 can be extremely low, and the potential of the node NM can be retained for a long time. In this case, OS transistors are preferably used as the other transistors included in the pixel. For the specific example of the metal oxide, Embodiment 1 can be referred to.

An OS transistor has a large energy gap and thus has an extremely low off-state current. Unlike in a transistor in which Si is included in the channel formation region (hereinafter, Si transistor), impact ionization, avalanche breakdown, short-channel effects, and the like do not occur in an OS transistor; accordingly, a highly reliable circuit can be configured.

Furthermore, a Si transistor may be used as the transistor M4. In this case, Si transistors are preferably used as the other transistors included in the pixel.

Examples of the Si transistor include a transistor containing amorphous silicon, a transistor containing crystalline silicon (typically, low-temperature polysilicon), and a transistor containing single crystal silicon.

One pixel may include both an OS transistor and a Si transistor.

In the pixel, the signal written to the node NM is capacitively coupled to the image signal supplied from the wiring DATA, and the resulting data can be output to the node NA. Note that the transistor M1 can have a function of selecting a pixel.

In other words, when a desired correction signal is stored in the node NM in advance, the correction signal can be added to the supplied image signal. Note that the correction signal is sometimes attenuated by a component on the transmission path; hence, the signal is preferably produced in consideration of the attenuation.

When the light-emitting element emits light with the use of the image signal and the correction signal, the amount of current flowing through the light-emitting element can be increased, and high luminance can be achieved. A voltage higher than or equal to the output voltage of a source driver can be applied to the gate voltage of the driving transistor, so that the power consumption of the source driver can be reduced. Since high-luminance light can be used for a light source, the sensitivity of the sensor can be increased.

This embodiment can be combined with the other embodiment as appropriate.

Embodiment 3

In this embodiment, electronic devices of one embodiment of the present invention will be described with reference to FIG. 19 to FIG. 21.

An electronic device in this embodiment is provided with the display device of one embodiment of the present invention. For example, the display device of one embodiment of the present invention can be used in a display portion of the electronic device. The display device of one embodiment of the present invention has a function of sensing light, and thus can perform biological authentication with the display portion or detect touch (contact or a near touch) on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 19A:
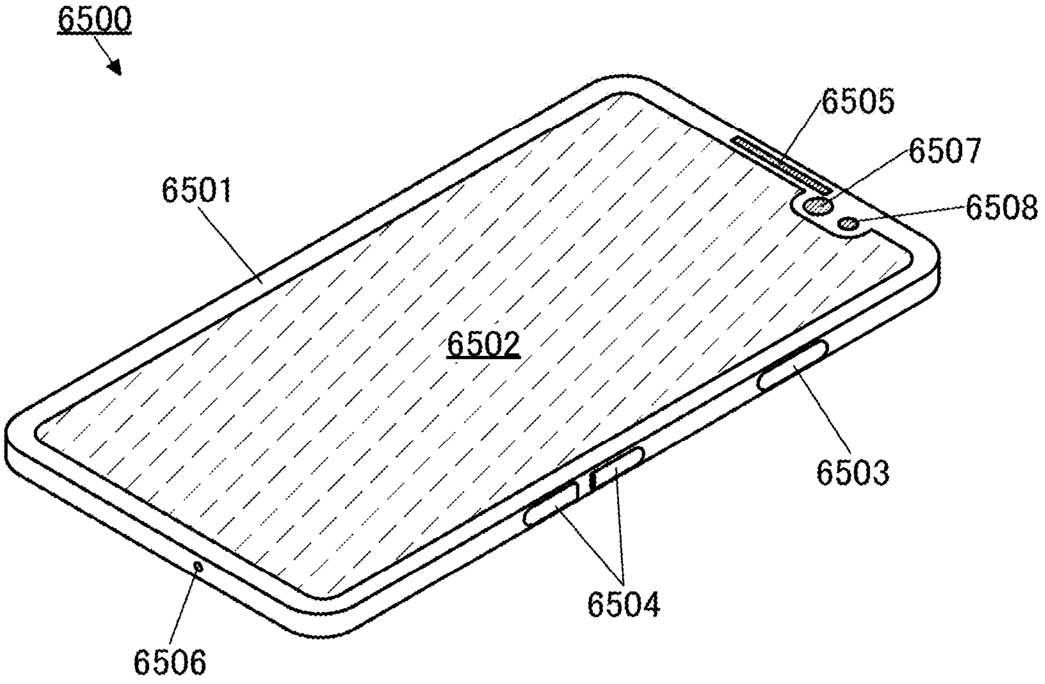
FIG. 19A and FIG. 19B are diagrams illustrating examples of an electronic device.

An electronic device 6500 illustrated in FIG. 19A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 19B:
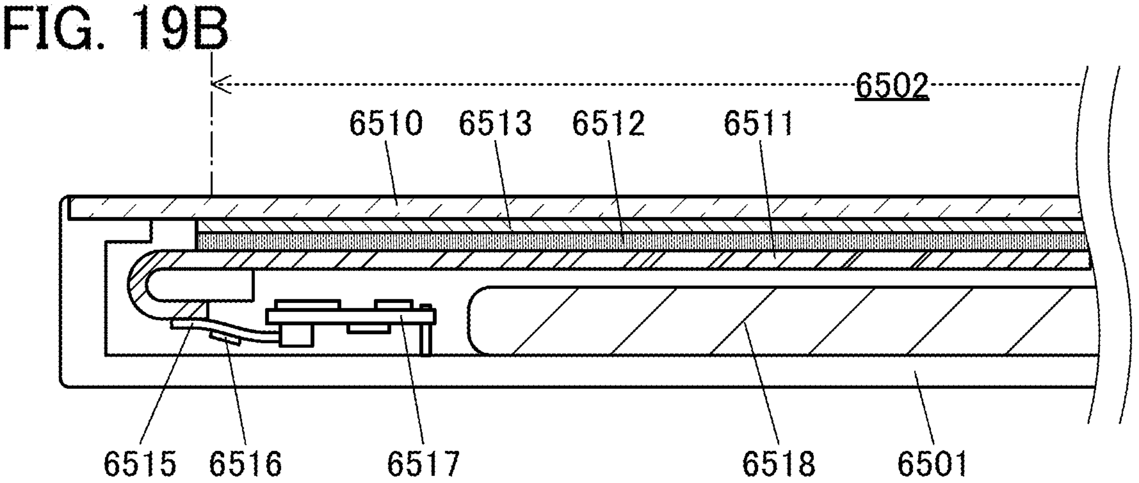

FIG. 19B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 20A:
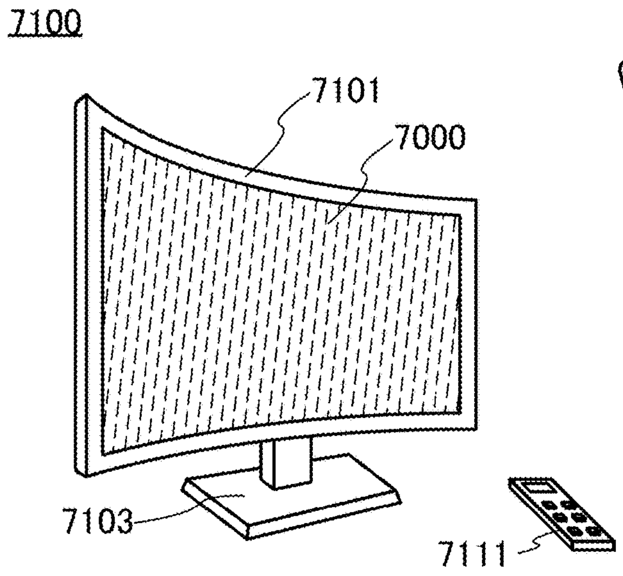
FIG. 20A to FIG. 20D are diagrams illustrating examples of electronic devices.

FIG. 20A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 20A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 20B:
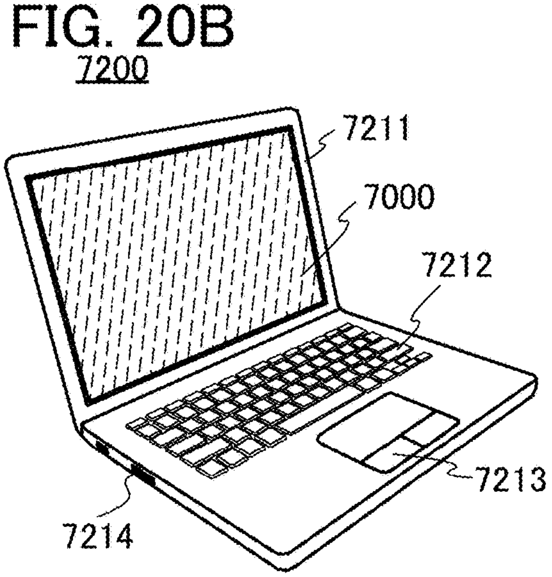

FIG. 20B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 20C:
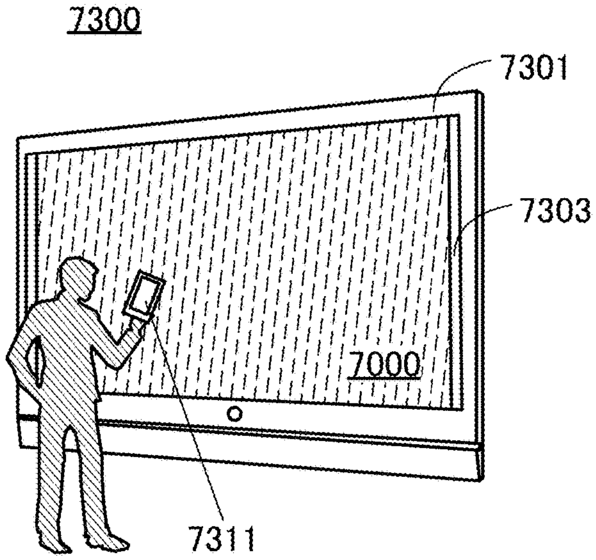
Figure 20D:
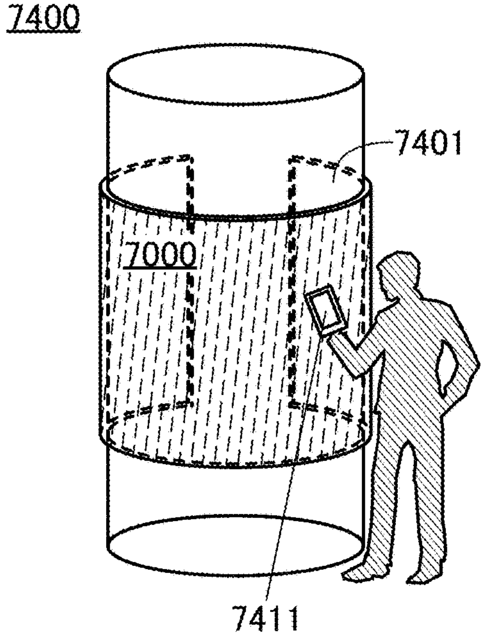

FIG. 20C and FIG. 20D illustrate examples of digital signage.

Digital signage 7300 illustrated in FIG. 20C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 20D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 20C and FIG. 20D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 20C and FIG. 20D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 21A to FIG. 21F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 21A to FIG. 21F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 21A to FIG. 21F are described below.

Figure 21A:
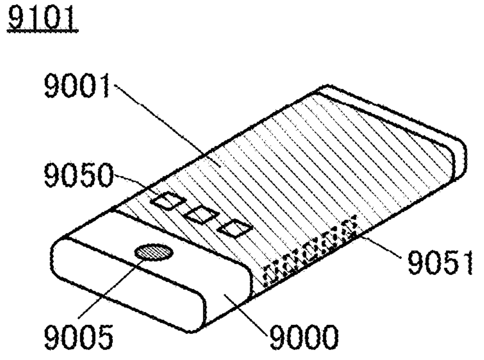
FIG. 21A to FIG. 21F are diagrams illustrating examples of electronic devices.

FIG. 21A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 21A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the radio field intensity. Alternatively, the icon 9050 or the like may be displayed in the position where the information 9051 is displayed.

Figure 21B:
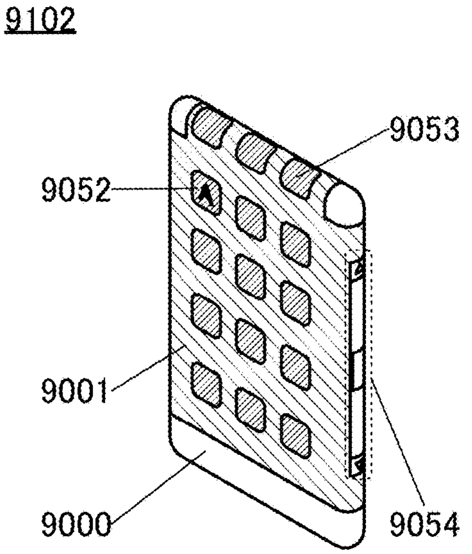

FIG. 21B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 21C:
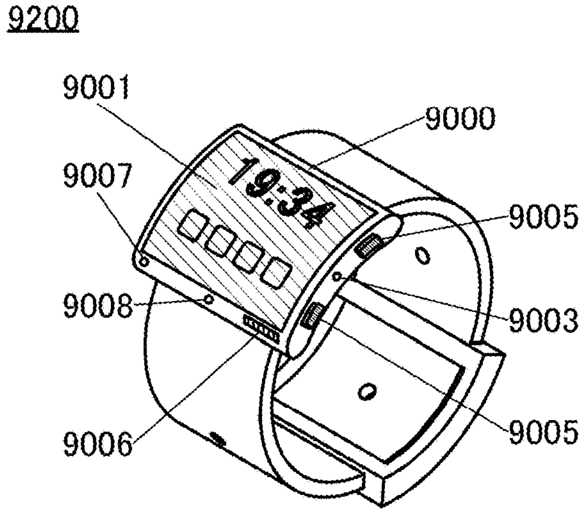

FIG. 21C is a perspective view illustrating a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 21D:
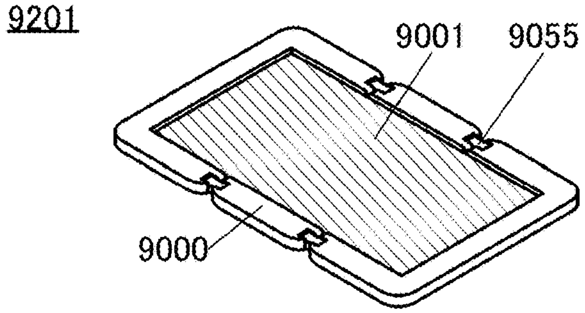
Figure 21E:
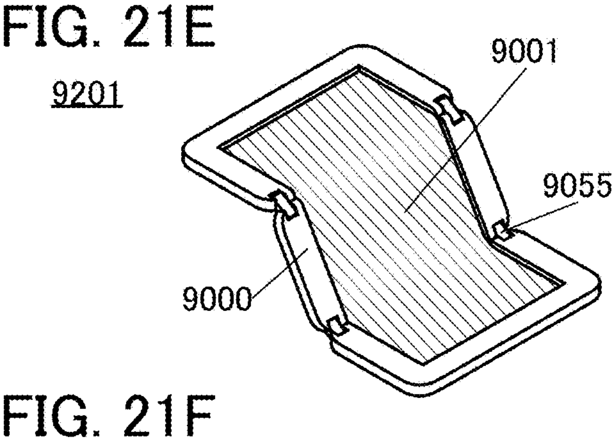
Figure 21F:
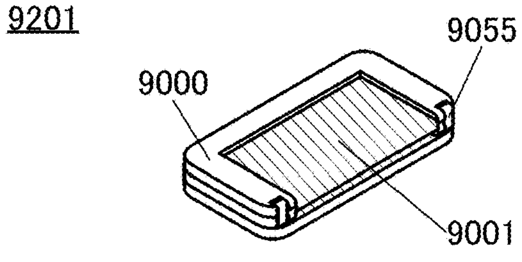

FIG. 21D to FIG. 21F are perspective views illustrating a foldable portable information terminal 9201. FIG. 21D is a perspective view of an opened state of the portable information terminal 9201, FIG. 21F is a perspective view of a folded state thereof, and FIG. 21E is a perspective view of a state in the middle of change from one of FIG. 21D and FIG. 21F to the other. The portable information terminal 9201 is highly portable in the folded state and is highly browsable in the opened state because of a seamless large display region. The display portion 9001 of the portable information terminal 9201 is supported by three housings

9000 joined by hinges 9055. For example, the display portion 9001 can be folded with a radius of curvature greater than or equal to 0.1 mm and less than or equal to 150 mm.

This embodiment can be combined with the other embodiments and the examples as appropriate.

Example 1

In this example, results of fabrication and observation of evaluation devices including the light shielding layers 219*a* will be described. In this example, evaluation devices including the light shielding layers 219*a* included in the display device 10K (FIG. 6B), the display device 10N (FIG. 9A and FIG. 9B), the display device 10P (FIG. 10B), and the display device 10Q (FIG. 11A) described in Embodiment 1 were fabricated. Furthermore, a display device to which the structure of the display device 10P was employed was fabricated and display thereof was observed.

First, fabrication results of an evaluation device 30N including the light shielding layer 219*a* included in the display device 10N will be described. The evaluation device 30N was fabricated in such a manner that from the transistor to the light shielding layer 219*a* or the spacer 219*b* were formed over the substrate 151 (FIG. 7A and FIG. 9B).

Figure 22:
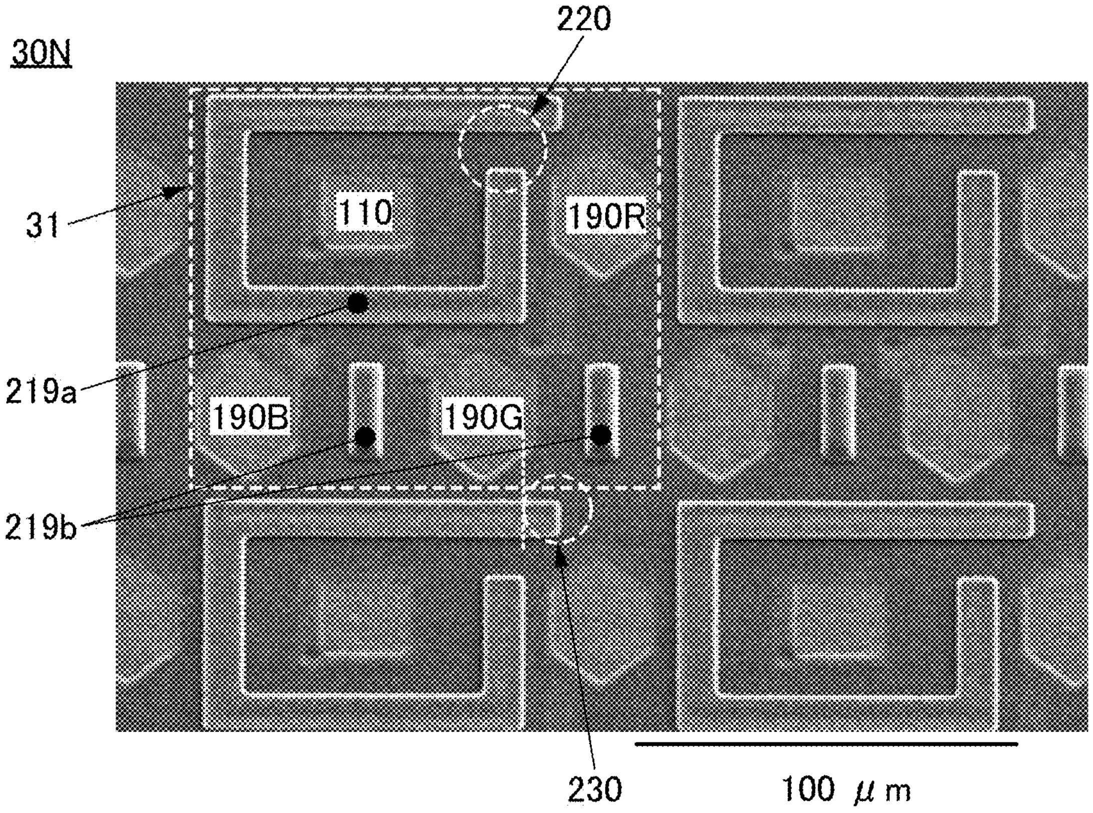
FIG. 22 is a top view photograph of an evaluation device in Example 1.

FIG. 22 shows a top view photograph of a pixel portion of the evaluation device 30N. As shown in FIG. 22, the structure in FIG. 9A was employed for the pixel portion of the evaluation device 30N.

A pixel 31 includes the light-receiving element 110, a red light-emitting element 190R, a green light-emitting element 190G, and a blue light-emitting element 190B.

As shown in FIG. 22, the top surface shape of the light shielding layer 219*a* has a structure in which the light shielding layer 219*a* surrounds the four sides of the light-receiving element 110 and has one end and the other end apart from each other. The gap 220 of the light shielding layer 219*a* is positioned on the red light-emitting element 190R side. Moreover, as shown in the region 230, one end of the light shielding layer 219*a* extends toward the red light-emitting element 190R more than the green light-emitting element 190G does. In this example, the evaluation device 30N was fabricated on the assumption that the green light-emitting element 190G is used as a light source for sensing. Thus, the green light-emitting element 190G and the gap 220 were designed so that to be positioned away from each other. This probably inhibits stray light from the green light-emitting element 190G from entering the light-receiving element 110 and also inhibits the influence of noise in the sensing.

The spacer 219*b* was provided between the green light-emitting element 190G and the blue light-emitting element 190B.

Figure 23A:
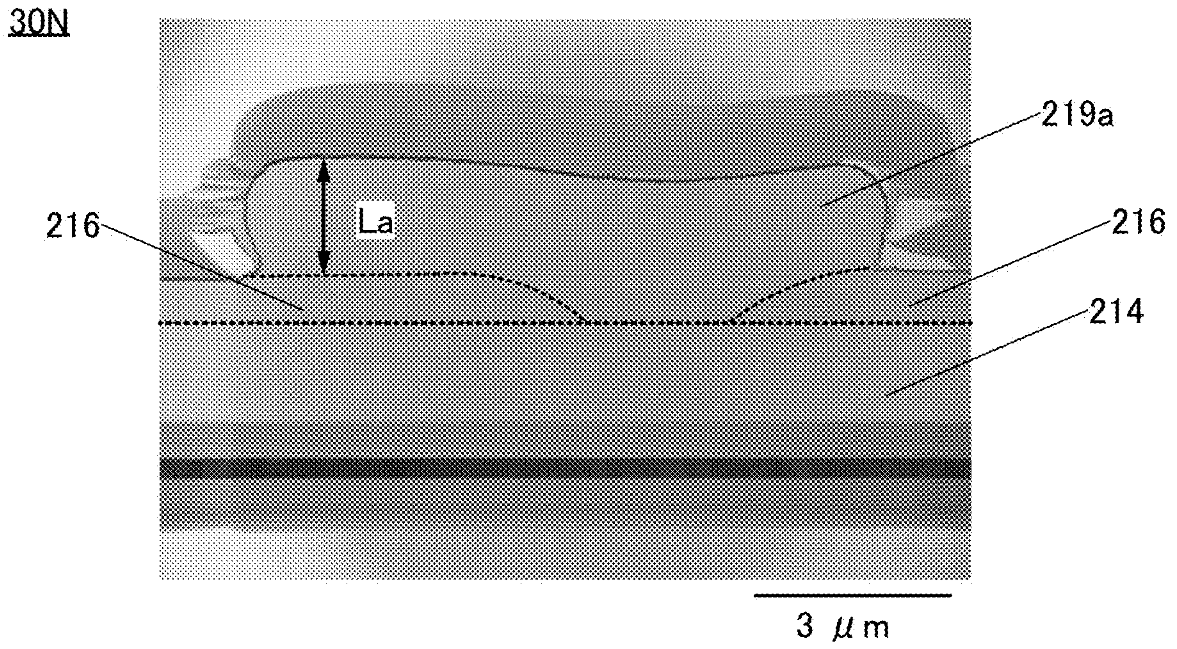
FIG. 23A and FIG. 23B are observation photographs of cross sections of evaluation devices in Example 1.

FIG. 23A shows a cross-sectional photograph of the evaluation device 30N including the light shielding layer 219*a*.

The light shielding layer 219*a* was formed using a red color filter material. The light shielding layer 219*a* had a thickness La of approximately 2.2 μm.

As shown in FIG. 23A, the cross-sectional shape of the light shielding layer 219*a* is an inverse tapered shape. In the case of the inverse tapered shape, if the light shielding layer 219*a* surrounds all the four sides of the light-receiving element 110, the common electrode 115 might be broken by the light shielding layer 219*a* and the common electrode 115 might be separated into a portion on the inner side of the light shielding layer 219*a* and a portion on the outer side thereof. The separation of the common electrode 115 can be probably inhibited when the light shielding layer 219*a* has the gap 220 as shown in FIG. 22

Next, fabrication results of an evaluation device 30P including the light shielding layer 219*a* included in the display device 10P will be described.

Figure 23B:
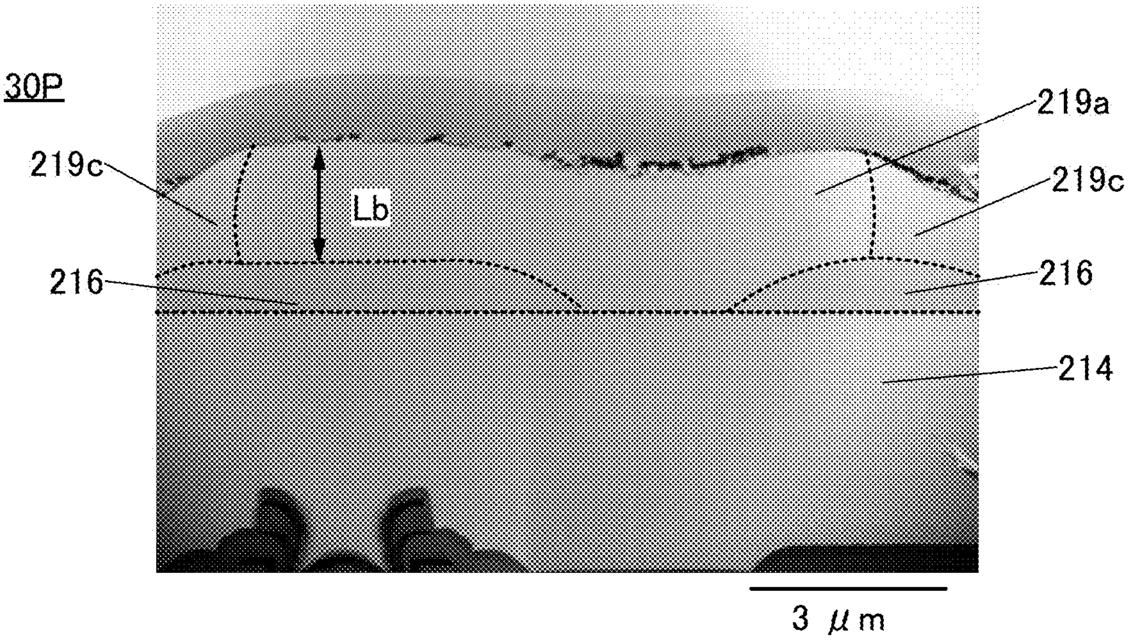
Figure 24:
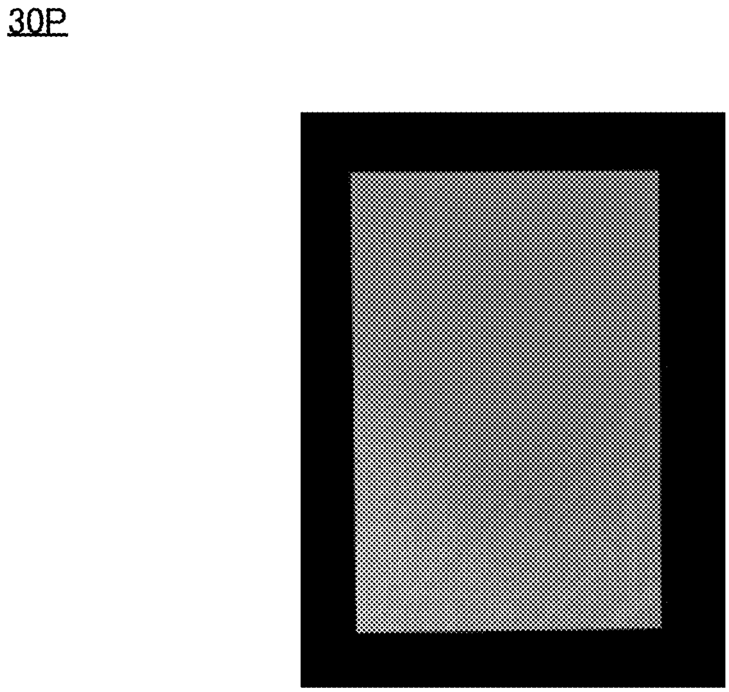
FIG. 24 is a photograph showing a display result of a display device in Example 1.

FIG. 23B shows a cross-sectional photograph of the evaluation device 30P including the light shielding layer 219*a*. FIG. 24 shows a display result of the display device to which the structure of the display device 10P was employed.

The light shielding layer 219*a* was formed using a red color filter material. The light shielding layer 219*a* had a thickness Lb of approximately 2.1 μm.

When the light shielding layer 219*a* has an inverse tapered shape, coverage with an organic film, the common electrode 115, and the like formed over the light shielding layer 219*a* might be decreased to prevent light emission of the light-emitting element.

As shown in FIG. 23B, providing the sidewall 219*c* in contact with the side surface of the inverse tapered light shielding layer 219*a* makes it possible to improve the coverage with the organic film, the common electrode 115, and the like and increase the display quality of the display device.

As shown in FIG. 24, employing the structure of the display device 10P could offer a favorable display result with few defects.

Next, fabrication results of an evaluation device 30K including the light shielding layer 219*a* included in the display device 10K will be described.

Figure 25A:
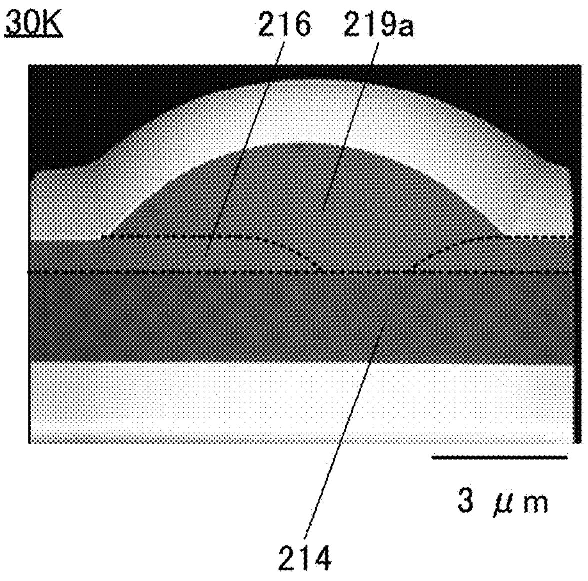
FIG. 25A and FIG. 25B are observation photographs of cross sections of evaluation devices in Example 1.

FIG. 25A shows a cross-sectional photograph including the light shielding layer 219*a* in the evaluation device 30K.

In the evaluation device 30K, the light shielding layer 219*a* having a forward tapered shape was formed so as to fill an opening provided in the partition wall 216. As the partition wall 216, a resin layer that transmits visible light was formed using a polyimide resin. As the light shielding layer 219*a*, a resin layer that blocks visible light was formed using a brown resist material. Next, fabrication results of an evaluation device 30Q including the light shielding layer 219*a* included in the display device 10Q will be described.

Figure 25B:
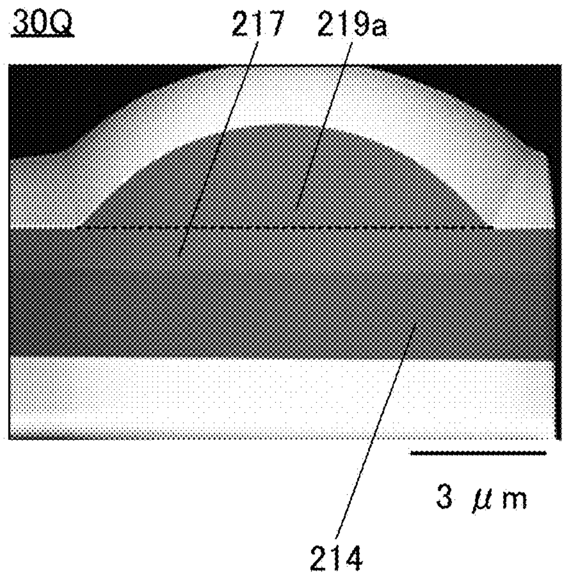

FIG. 25B shows a cross-sectional photograph of the evaluation device 30Q including the light shielding layer 219*a*.

In the evaluation device 30Q, the light shielding layer 219*a* having a forward tapered shape was provided over the partition wall 217. As each of the partition wall 217 and the light shielding layer 219*a*, a resin layer that blocks visible light was formed using a brown resist material.

As described above, the evaluation devices each including the light shielding layer 219*a* were able to be fabricated in this example.

Example 2

In this example, fabrication results of a display device including a light-receiving element and a light-emitting element in a display portion will be described.

Device Structure

Figure 26:
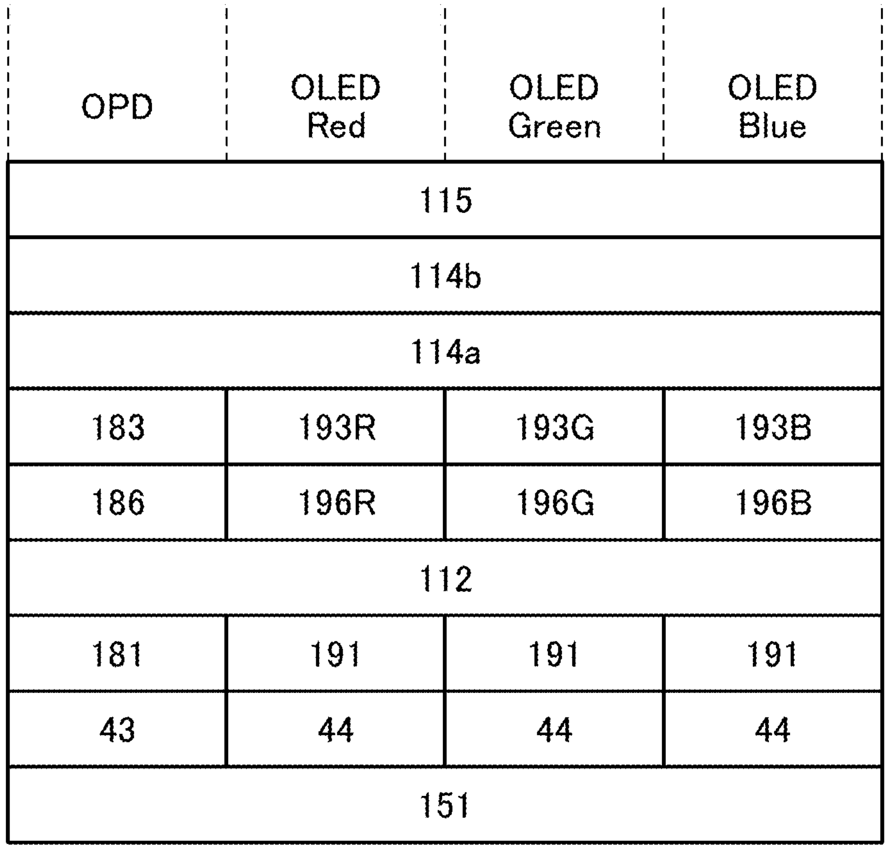
FIG. 26 is a diagram illustrating a device structure forming a pixel in a display device in Example 2.

FIG. 26 illustrates a device structure forming a pixel of a display device.

One pixel of the display device fabricated in this example includes four elements, which are composed of organic EL elements OLED of three colors, Red (R), Green (G), and Blue (B) and one organic photodiode OPD, and circuits (driver circuits 43 and 44) for driving these four elements independently.

The four elements are each provided over the substrate 151. In this example, a display device using a glass substrate as the substrate 151 and a flexible display device using a resin substrate as the substrate 151 were fabricated. Furthermore, over the substrate 151, the driver circuit 43 electrically connected to the pixel electrode 181 of the organic photodiode OPD and the driver circuits 44 electrically connected to each pixel electrode 191 of the organic EL element OLED are provided. The organic photodiode OPD has a structure for sensing light incident from a counter substrate side (the common electrode 115 side in FIG. 22). Each organic EL element OLED has a top-emission structure for sensing light toward the counter substrate side. The pixel electrode 181 and the pixel electrode 191 each have a function of reflecting visible light.

In the four elements, respective hole-transport layers are separately formed. Furthermore, light-emitting layers of the organic EL elements OLED of respective colors and an active layer of the organic photodiode OPD are separately formed. Specifically, the organic photodiode OPD includes a hole-transport layer 186 and the active layer 183; the red organic EL element OLED includes a hole-transport layer 196R and the light-emitting layer 193R; the green organic EL element OLED includes a hole-transport layer 196G and the light-emitting layer 193G; and the blue organic EL element OLED includes a hole-transport layer 196B and the light-emitting layer 193B.

Common layers 112, 114*a*, and 114*b* and the common electrode 115 are common between the four elements and formed using a common mask. The common layer 112 functions as a hole-injection layer of the organic EL element OLED and functions as a hole-transport layer of the organic photodiode OPD. The common layer 114*a* functions as an electron-transport layer of the organic EL element OLED and the organic photodiode OPD. The common layer 114*b* functions as an electron-injection layer of the organic EL element OLED and functions as an electron-transport layer of the organic photodiode OPD. The common electrode 115 has a function of transmitting visible light and a function of reflecting visible light.

In the above manner, only by a change in structure from separate formation of the light-emitting elements of three colors, R, G, and B, to separate formation of the four-type elements including the organic photodiode OPD, photosensors can be formed on an entire surface of a display portion of an organic EL display. The structure of the display device of this example is superior in a process, cost, and design to the case where a photosensor is incorporated as a separate module, which facilitates the display device to downsize and have flexibility. An imaging method in the display device of this example is described with reference to FIG. 1C. Imaging by the display device of this example is performed in such a manner that reflected light from an object is sensed by the organic photodiode OPD with the use of light emitted from the organic EL elements OLED as a light source.

In the case of taking an image of a fingerprint of the finger 52 touching the substrate 59 (counter substrate) as illustrated in FIG. 1C, light emitted from the organic EL elements OLED is reflected by the finger 52 on the substrate 59, and the organic photodiode OPD senses the reflected light. At this time, a difference of reflectance due to ridges and valleys of the fingerprint is utilized, so that imaging of the fingerprint can be conducted.

Imaging of fingerprints can be performed by sensing only monochromatic light, and color imaging is not necessary. However, in the display device of this example, the organic EL elements of R, G, and B are sequentially made to emit light, and their reflective light are sensed in time division, whereby color imaging is also possible. For example, it is possible to scan color images arranged over the counter substrate. In the case of using this method, organic photodiodes OPD having sensitivity with respect to a whole region of visible light are only have to be arranged, and it is not necessary to arrange individual organic photodiodes OPD for R, G, and B; this method is advantageous for high definition.

Structure of Display Device

In this example, an active matrix display device with a screen size of 3.07 inches in diagonal, a pixel count of 360 (H)×540 (V), a pixel pitch of 120 μm×120 μm, and a resolution of 212 ppi was fabricated. A gate driver was incorporated, and an external IC as a source driver was implanted by a COG method. A read circuit was set to output an analog voltage sequentially.

In the display device of this example, a transistor using a crystalline oxide semiconductor for a semiconductor layer was used as a switching element. The transistor using a crystalline oxide semiconductor for a semiconductor layer has a feature of an extremely low off-state current. Owing to this feature, there is an advantage in that imaging with a global shutter system is possible in terms of sensing. In addition, in terms of a still image, the number of image rewrites can be reduced, and a driving leading low power consumption (IDS driving) becomes possible.

Note that IDS driving is idling stop driving for operation with a lower frame frequency than normal operation. In the IDS driving, rewriting of image data is stopped after writing processing of image data is performed. Increasing the interval between writing of image data and subsequent writing of image data can reduce the power that would be consumed by writing of image data in that interval. The frame frequency in the IDS driving can be higher than or equal to 1/100 and lower than or equal to 1/10 of that in the normal operation (typically, higher than or equal to 60 Hz and lower than or equal to 240 Hz). Video signals for a still image are the same between consecutive frames. Thus, the IDS driving mode is particularly effective in displaying a still image.

The image rewriting operation normally causes noise with respect to a sensor, which makes a reduction in the S/N ratio. However, in the IDS driving, sensing can be performed under the following condition: the image rewriting operation is stopped while displaying an image is kept. Thus, sensing can be performed without being affected by noise due to the image rewrites, and a reduction in the S/N ratio can be inhibited.

In the display device of this example, one frame was divided into a display period and a sensing period. During the sensing period, rewriting an image was not performed by using IDS driving, so that noise generated in sensing was reduced. For fingerprint identification and scanning of images, light emitted from the organic EL element OLED was used as a light source; thus, it is necessary to keep luminance of light emitted from the organic EL element OLED constant. In this case, by employing IDS driving, noise can be reduced and sensing can be performed favorably.

Here, the S/N ratio can be improved as the luminance of the organic EL element OLED is higher. The display device of this example employs the pixel circuit including a memory illustrated in FIG. 18B. Accordingly, in the display device of this example, the organic EL element OLED can emit light with high luminance. When the luminance of the pixel is selectively improved in the sensing, the sensitivity of the sensor can be increased. Specifically, in the display device of this example, light emission with a maximum luminance of 2000 cd/cm$^2$ can be obtained at the time of displaying a single color of green.

The structure of the display device 10K (FIG. 6B and FIG. 7A) was employed as a cross-sectional structure of the display device fabricated in this example.

Display Result

Figure 27A:
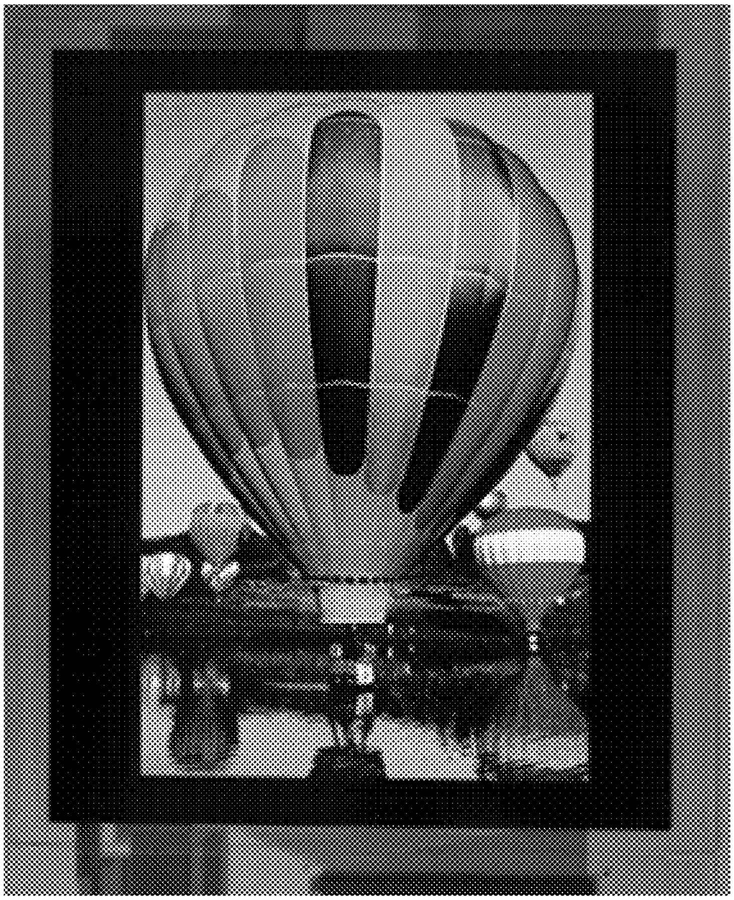
FIG. 27A and FIG. 27B are photographs showing display results of display devices in Example 2.
Figure 27B:
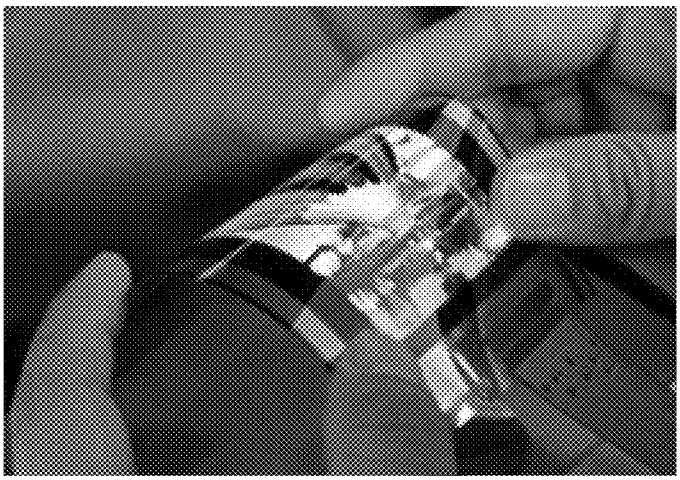

FIG. 27A and FIG. 27B show display results of the display device of this example. FIG. 27A shows a display result of the display device using a glass substrate as the substrate 151. FIG. 27B shows a display result of the flexible display device using a resin substrate as the substrate 151. As shown in FIG. 27A and FIG. 27B, it was confirmed that an image can be favorably displayed the display device including the light-receiving element and the light-emitting element in a display portion. Furthermore, as shown in FIG. 27B, it was confirmed that the display portion including the light-receiving element and the light-emitting element can have higher flexibility and an image can be favorably displayed even in a state where the display is bent.

Imaging Optical System

In the display device of this example, the organic photodiode OPD senses light that is emitted from the organic EL element OLED and reflected by an object. However, in some cases, light emitted from the organic EL element OLED is reflected inside the display device and enters the organic photodiode OPD without through an object. Such stray light ends up as noise in capturing an image, causing a reduction in the S/N ratio. In the display device of this example, a light shielding layer was positioned on both the counter substrate side and a support substrate side so that the influence of stray light can be inhibited.

First, it was confirmed whether the influence of stray light was inhibited when the light shielding layer was positioned on both the counter substrate side and the support substrate side. Here, a structure excluding the light shielding layer 158 from the structure of the display device 10D illustrated in FIG. 4A (hereinafter referred to as the display device 10D for simplicity) was used as a structure including no light shielding layer, and the structure of the display device 10P illustrated in FIG. 10B including the light shielding layer 158 and the light shielding layer 219*a* was used as a structure including a light shielding layer. The light shielding layer 219*a* was formed to have a thickness of 2.0 μm.

Only one green pixel was made to emit light as a light source without providing a subject over the display device 10D or the display device 10P, and detection intensity of the organic photodiode OPD around the pixel, which was made to emit light, was measured. Since no subject was provided, the light sensed by the organic photodiode OPD was only a noise component such as stray light. Note that the detection intensity of the organic photodiode OPD was measured in advance in a state where the entire surface emits no light. Then, in order to consider the influence of stray light from the organic EL element OLED which serves a light source, a difference between the detection intensity in a state where the entire surface emits no light and the light detection intensity in a state where only one pixel emits light was obtained. In addition, the measurement results of the display device 10P were normalized by peak intensity of the measurement results of the display device 10D.

Figure 28:
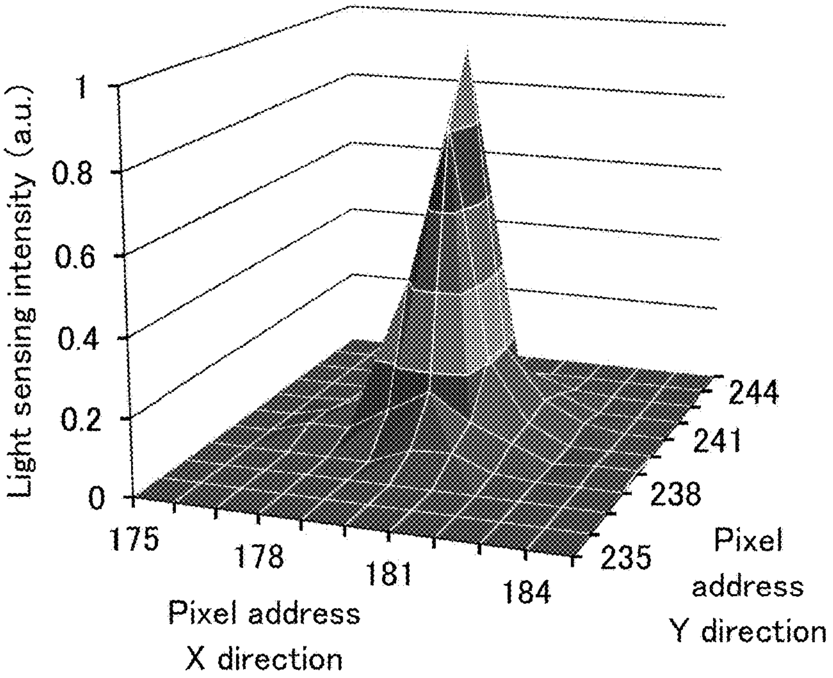
FIG. 28 is a graph showing sensing results of stray light in a display device in Example 2.
Figure 29:
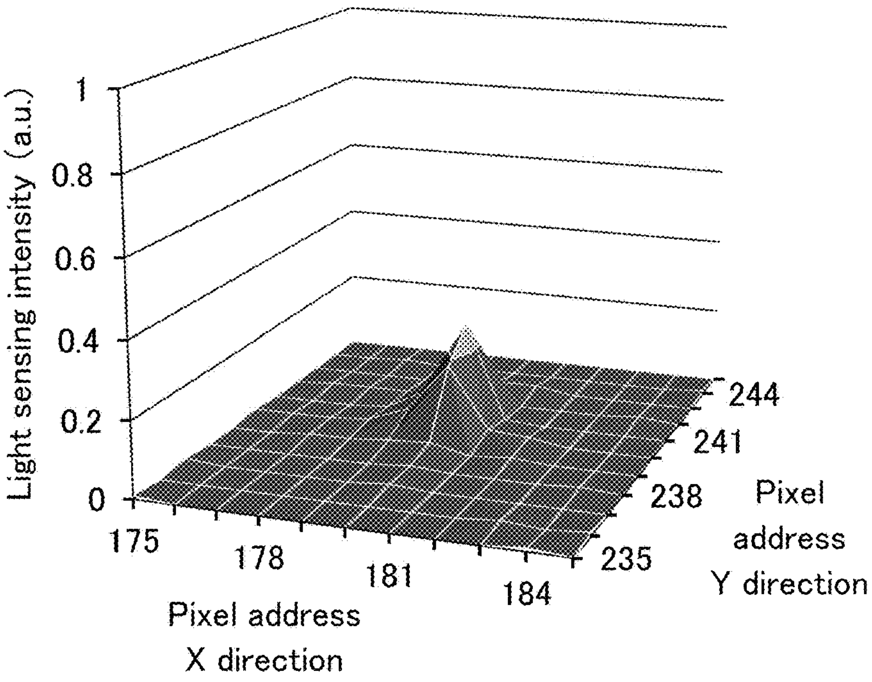
FIG. 29 is a graph showing sensing results of stray light in a display device in Example 2.

FIG. 28 shows the measurement results of the display device 10D and FIG. 29 shows the measurement results of the display device 10P. In each of FIG. 28 and FIG. 29, z-axis represents light detection intensity, and x-axis and y-axis represent pixel addresses. It was found from FIG. 28 and FIG. 29 that the maximum value of the detection intensity was reduced to about half by provision of the light shielding layer 219*a*. Furthermore, although the detection intensity is high in a range of approximately 4×4 pixels in FIG. 28, the detection intensity is high in a range of approximately 2×2 pixels in FIG. 29. It was found that providing the light shielding layer 219*a* can reduce a pixel range where the detection intensity increases. From the above, it was found that noise intensity due to stray light can be inhibited and a range where the noise due to stray light is detected can be narrowed when a light shielding layer is provided on the support substrate side. Thus, it was found that providing the light shielding layer on both the counter substrate side and the support substrate side can inhibit the influence of stray light and improve the S/N ratio.

For capturing a clear image of a subject, it is necessary to narrow the region where image-capturing ranges of two organic photodiodes OPDs in adjacent pixels overlap with each other. A relation between the image-capturing ranges of the organic photodiode OPD and a variety of parameters will be described with reference to FIG. 30.

Figure 30:
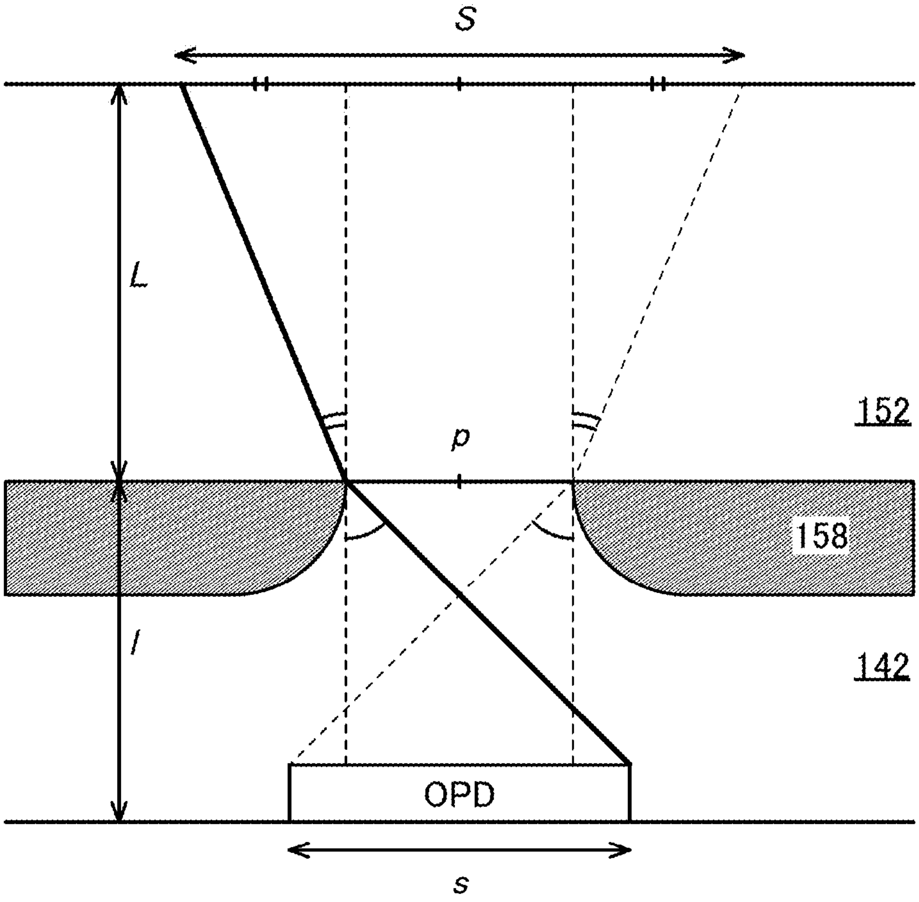
FIG. 30 is a diagram showing an imaging optical system of a display device in Example 2.

FIG. 30 shows an image-capturing range S of one organic photodiode OPD, a thickness L of the counter substrate (the substrate 152), an opening diameter p of the light shielding layer 158, a distance l from a bottom portion of an opening of the light shielding layer 158 (a surface of the substrate 152 on the organic photodiode OPD side) to the organic photodiode OPD, and a width s of the organic photodiode OPD. It is found from FIG. 30 that the opening diameter p, the length L, and the like affect the image-capturing range S of the organic photodiode OPD.

The image-capturing range S can be obtained by Formula (1) below. In Formula (1), $n_1$ is a refractive index of the adhesive layer 142, and $n_2$ is a refractive index of the substrate 152. In a flexible display device, a resin substrate is used as the substrate 152; thus, the refractive index of a sealing resin used for the adhesive layer 142 and the refractive index of the resin substrate used as the substrate 152 can be regarded as being substantially the same. Thus, Formula (2) below can be obtained when $n_1=n_2$.

[Formula 1]

$$S = p + L(p+s)\left\{\left(\frac{n_2}{n_1}\right)^2 l^2 + \left[\left(\frac{n_2}{n_1}\right)^2 - 1\right]\left(\frac{p+s}{2}\right)^2\right\}^{-\frac{1}{2}} \tag{1}$$

$$S = p + \frac{L}{l}(p+s) \tag{2}$$

Figure 31:
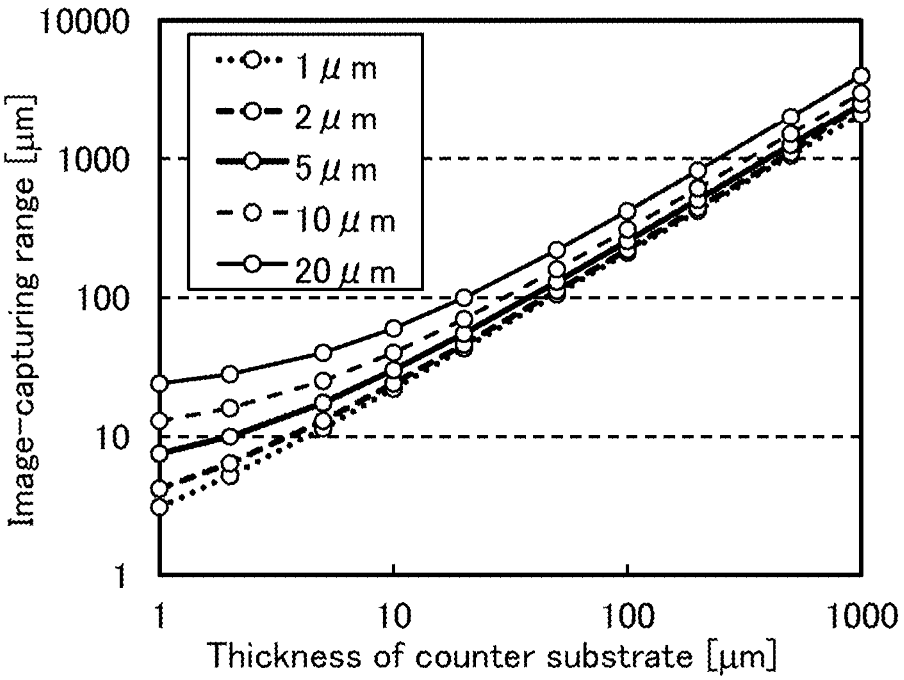
FIG. 31 is a graph showing calculation results of an image-capturing range in a display device in Example 2.

FIG. 31 shows the results of the image-capturing range S obtained using Formula (2) above. FIG. 31 shows a relation between the thickness L of the substrate 152 and the image-capturing range S of the organic photodiode OPD in the case where l=10 μm, s=20 μm, $n_1=n_2$, and p=1 μm, 2 μm, 5 μm, 10 μm, or 20 μm.

FIG. 31 shows that as the opening diameter p is smaller, the image-capturing range S of the organic photodiode OPD is narrowed. In addition, it is found that as the thickness L of the substrate 152 is thinner, the image-capturing range S of the organic photodiode OPD is narrowed. In other words, the image-capturing range S of the organic photodiode OPD can be controlled by adjusting the opening diameter p or the thickness L of the substrate 152. Formula (2) also indicates that the larger the distance l is or the smaller the width s is, the narrower the image-capturing range S of the organic photodiode OPD is.

Figure 32A:
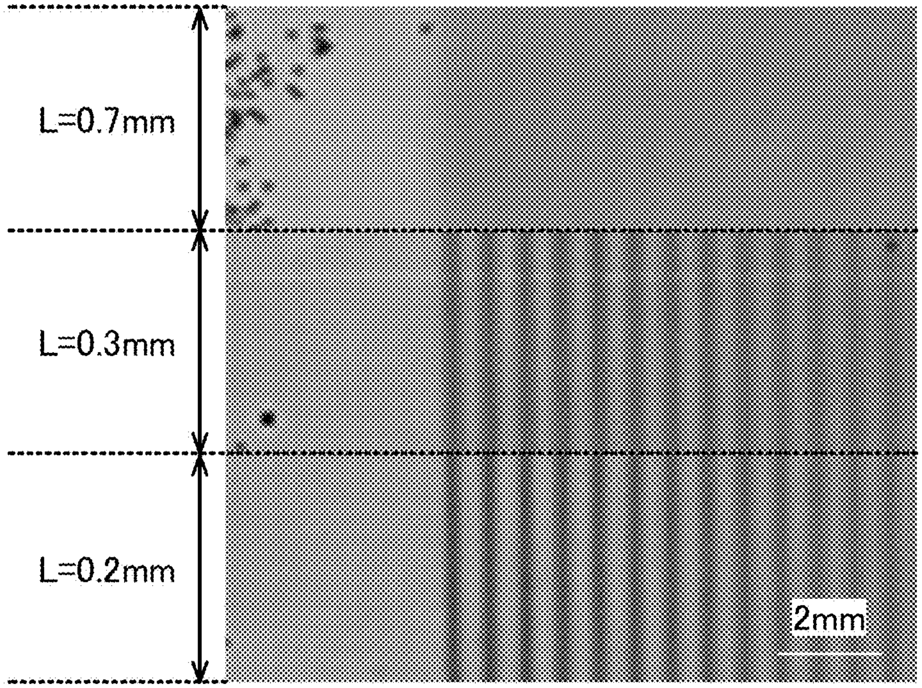
FIG. 32A and FIG. 32B are photographs showing imaging results of display devices in Example 2.
Figure 32B:
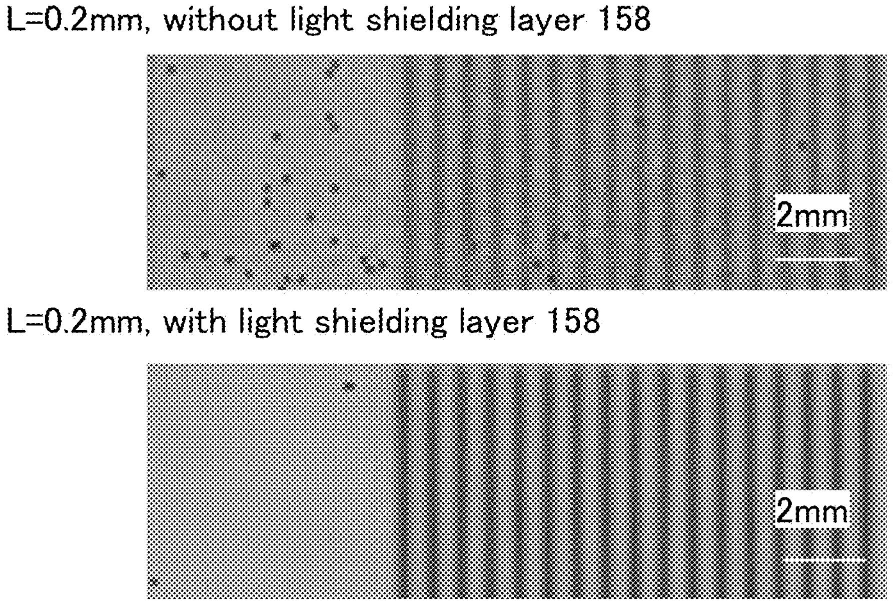
Figure 33:
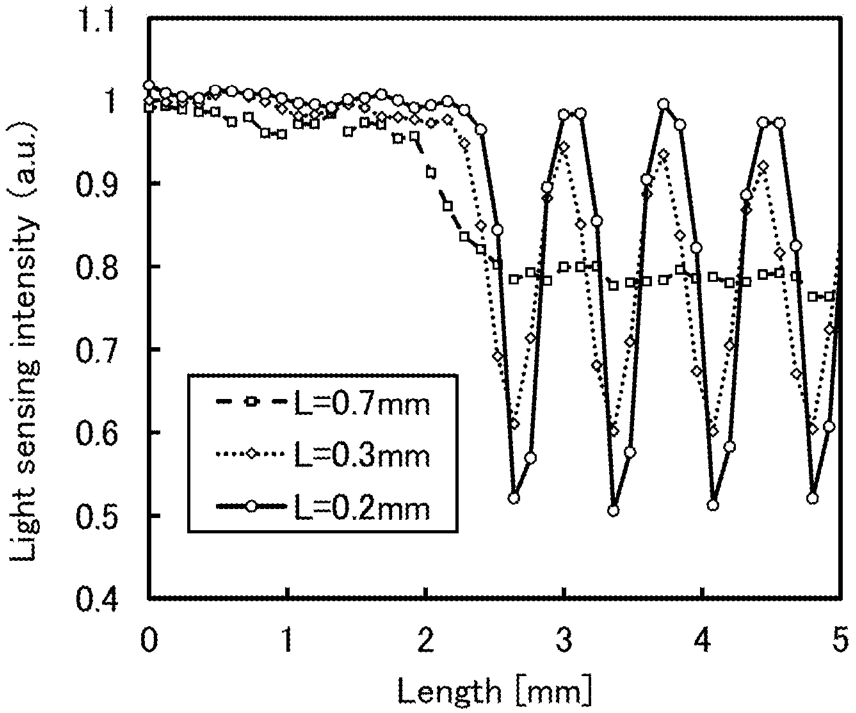
FIG. 33 is a graph showing imaging results of display devices in Example 2.

FIG. 32 and FIG. 33 show results of comparing the image-capturing resolutions of the display devices that have different thickness L of the substrate 152 and includes or does not include the light-blocking layer (light shielding layer) 158. For the imaging, a subject in which black lines each having a width of 0.12 mm and a total light reflectance of 10% are printed on a reflective plate with a total light reflectance of 80% at a pitch of 0.72 mm was placed over the display device. The display device was designed so that p=19 μm, l=8 μm, and s=21 μm.

FIG. 32A and FIG. 32B each are an enlarged view of a captured image. FIG. 32A shows that a clear image can be obtained as the thickness Z of the substrate 152 is smaller and the black lines are blurred as the thickness L of the substrate 152 is larger. Although FIG. 32B shows that the black lines can be captured regardless of whether the light shielding layer 158 is provided or not, a higher contrast between the black lines and the background region was obtained with the light shielding layer 158. This indicates that providing the light shielding layer 158 can narrow the image-capturing range of the organic photodiode OPD to inhibit detection of the peripheral background region.

FIG. 33 shows results of extracting profiles in a horizontal direction from the imaging results. Note that the results in FIG. 33 are normalized by a black plate value and a white background value obtained by capturing the black plate with low reflectance on the white background in advance. From FIG. 33, it was found that as the thickness L of the substrate 152 is larger, detection intensity for the black lines is increased to reduce the detection intensity for a background region between the black lines. This is because the image-capturing range of the organic photodiode OPD becomes large when the thickness L of the substrate 152 increases; therefore, every organic photodiode OPD detects both the black lines and the background region so that the difference therebetween is unlikely to occur.

From the above results, in this example, both a display device using a glass substrate as the substrate 151 and a display device using a resin substrate as the substrate 151 were designed so that L=0.2 mm in addition to the values of p, l, and s and fabricated using the light shielding layer 158.

Imaging Results

Imaging results in the display device of this example, which were obtained by using the organic photodiode OPD with light emitted from the organic EL element OLED used as a light source, are shown. In this example, imaging of fingerprints and scanning of color images were performed.

Figure 34A:
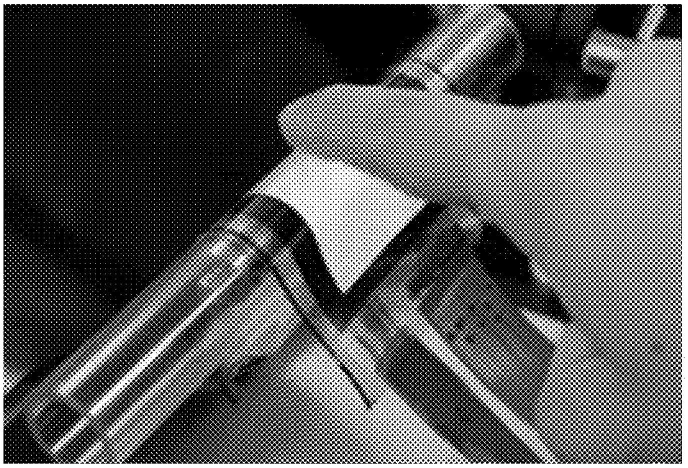
FIG. 34A is a photograph showing an imaging state of a display device in Example 2.

First, a finger was put on the display device using a glass substrate as the substrate 151, imaging of a fingerprint was performed by making the green organic EL element OLED emit light, whereby a pattern due to ridges and valleys of the fingerprint was able to be favorably captured. From this, it was confirmed that a high-resolution image with substantially the same level as that of the fingerprint was able to be captured by using the display device of this example. As shown in FIG. 34A, imaging of a fingerprint was also performed in the following manner: a display portion of the flexible display device using a resin substrate as the substrate 151 was bent, a finger was put on the bent portion, and the green organic EL element OLED was made to emit light. The radius of curvature of the display portion was set to 10 mm. The pattern due to ridges and valleys of the fingerprint was able to be captured favorably also in the bent portion of the display portion. Sensing can be performed favorably on the bent portion of the display portion; therefore, in the portable information terminals illustrated in FIG. 21A and FIG. 21B, for example, an application such as fingerprint identification performed on a side end portion or a side surface of the portable information terminal can be expected.

Figure 34B:
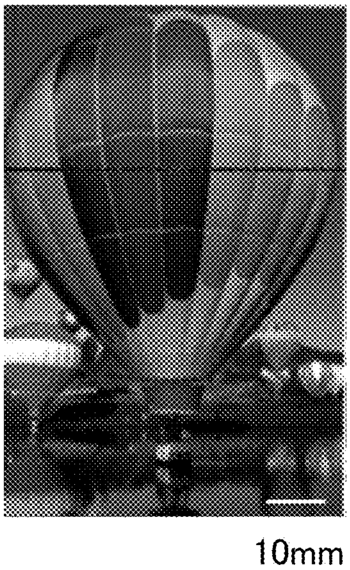
FIG. 34B is a photograph showing imaging results of a display device in Example 2.

Next, capturing color images was performed. FIG. 34B shows the result obtained by printing an image on paper, placing the paper over the display device so that a printed side of the paper faces the display device, and performing capturing. Note that, image correction was conducted on the captured image with values of sensed white display and black display, which were measured in advance, as reference values. In the image correction, a portion in the captured image, where a sensed value is an outlier from the reference value, was corrected to have the value of black display.

In this example, an organic photodiode OPD having absorption in a wide range of a visible region was used. Thus, color images were obtained in the following manner: the organic EL elements OLED of R, G, and B were sequentially turned on with time division, a single color image data of R, G, and B was captured using the organic photodiode OPD, and three pieces of image data were combined. In this example, the color images were obtained at ½ Hz by performing high-luminance emission using the memory function illustrated in FIG. 18B by a global shutter system. The images were captured under the conditions where the luminance of red display was 750 cd/$m^2$, the luminance of green display was 1650 cd/$m^2$, the luminance of blue display was 370 cd/$m^2$, and the exposure time and the read time for each color were 1.6 msec and 250 msec, respectively. As shown in FIG. 34B, it was confirmed that the color images can be favorably captured by using the display device of this example.

Figure 35A:
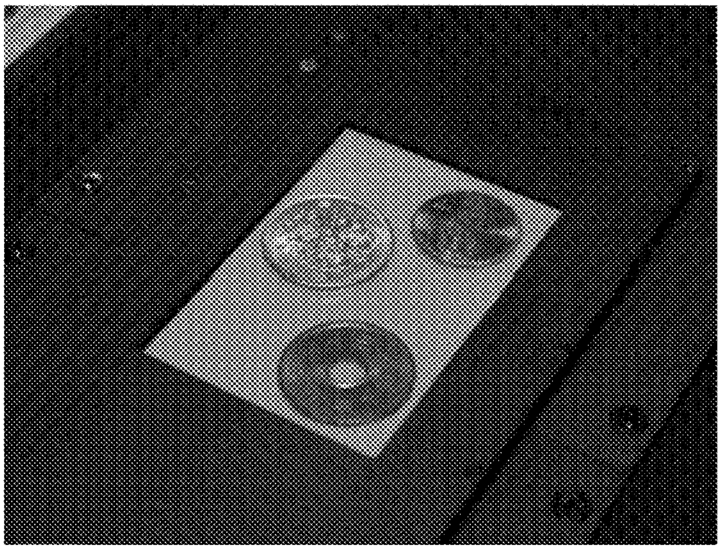
FIG. 35A is a photograph showing an imaging state of a display device in Example 2.
Figure 35B:
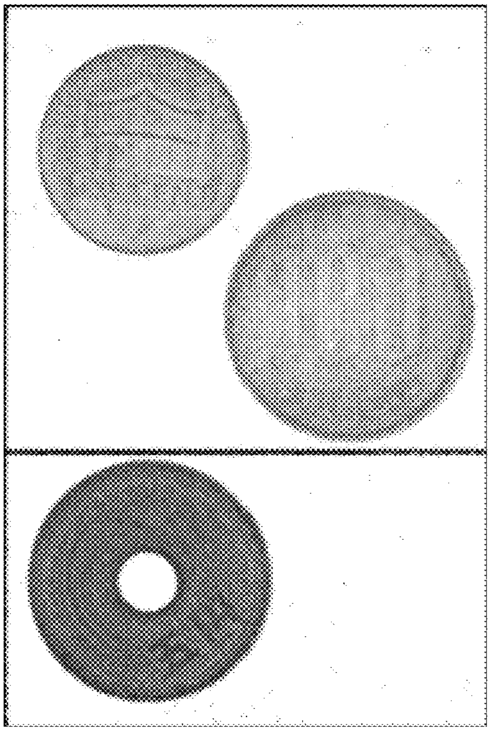
FIG. 35B is a photograph showing imaging results of display device in Example 2.

Next, images of coins were captured. FIG. 35A is a photograph showing a state where the imaging is performed. FIG. 35B shows imaging results of the coins placed over the display device.

The details of the imaging method are similar to those of capturing color images. The images were captured under the conditions where the luminance of red display was 340 cd/$m^2$, the luminance of green display was 1700 cd/$m^2$, the luminance of blue display was 150 cd/$m^2$, and the exposure time for each color was 1.85 msec. As shown in FIG. 34B, it was confirmed that patterns of the coins can be favorably captured by using the display device of this example.

Example 3

In this example, evaluation results of the characteristics of fabricated light-receiving elements will be described.

In this example, a device 1 and a comparative device 2 were fabricated as the light-receiving elements. A structure of the device 1 is in common with that of a light-emitting element, which is a stacked structure that can be fabricated by replacing a light-emitting layer of the light-emitting element with an active layer of the light-receiving element. Note that the structure of the device 1 was also employed to the organic photodiode OPD included in the display device in Example 2. The comparative device 2 whose structure is nothing in common with that of the light-emitting element has a stacked structure suitable for an image sensor.

Chemical formulae of materials used in this example are shown below.

[Chemical Formula 1]

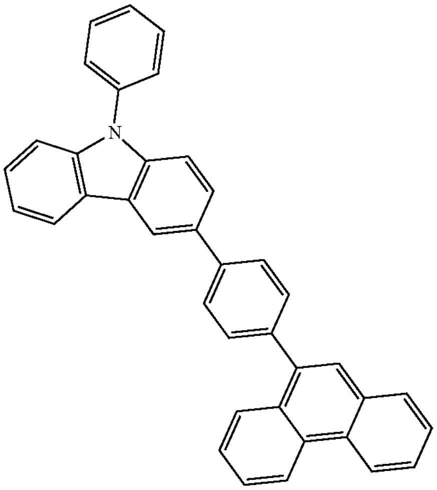

PCPPn

-continued

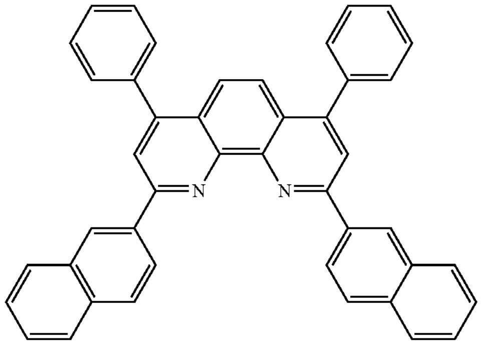

NBPhen

Table 1 shows an element structure of the light-receiving element of this example. The device 1 and the comparative device 2 will be described with reference to Table 1.

TABLE 1

| | First electrode | First buffer layer | | Active layer | Second buffer layer | | | Second electrode | |
|---|---|---|---|---|---|---|---|---|---|
| Device 1 | APC\ITSO 100\100 nm | PCPPn:MoOx (=2:1) 15 nm | PCPPn 40 nm | $C_{70}$:DBP = 9:1 60 nm | 2 mDBT BPDBq-II 10 nm | NBPhen 10 nm | LiF 1 nm | Ag:Mg (=10:1) 9 nm | ITO 40 nm |
| Comparative device 2 | Ti\Al\Ti 50\200\5 nm | $C_{70}$ 10 nm | | | MoOx 60 nm | | | ITO 40 nm | |

-continued

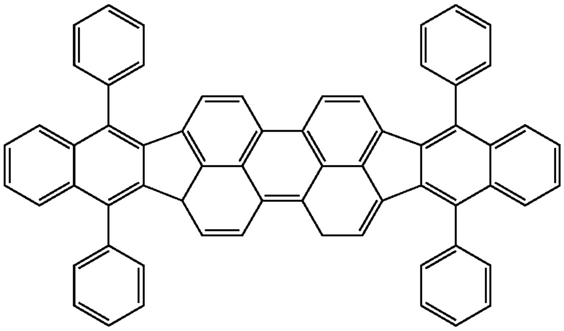

DBP

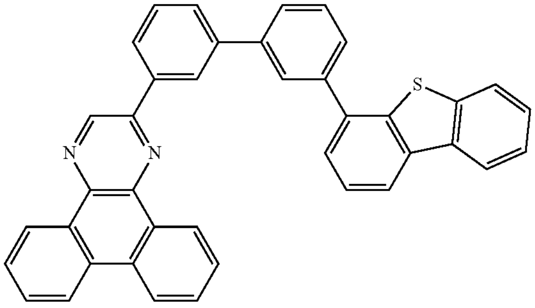

2mDBTBPDBq-II

Device 1

As shown in Table 1, a first electrode of the device 1 has a two-layer structure including an alloy film of silver (Ag), palladium (Pd), and copper (Cu) (Ag—Pd—Cu (APC)) with a thickness of approximately 100 nm and a film of indium tin oxide containing silicon oxide (ITSO) with a thickness of approximately 100 nm.

A first buffer layer of the device 1 is a layer corresponding to a hole-injection layer and a hole-transport layer of the light-emitting element.

First, a layer corresponding to a hole-injection layer was formed by co-evaporating 3-[4-(9-phenanthryl)-phenyl]-9-phenyl-9H-carbazole (abbreviation: PCPPn) and molybdenum oxide with a weight ratio of PCPPn:molybdenum oxide=2:1. The layer corresponding to a hole-injection layer was formed to have a thickness of approximately 15 nm.

Next, a layer corresponding to a hole-transport layer was formed by evaporation using PCPPn to have a thickness of approximately 40 nm.

An active layer of the device 1 was formed by co-evaporating fullerene ($C_{70}$) and tetraphenyldibenzoperiflanthene (abbreviation: DBP) with a weight ratio of $C_{70}$:DBP=9:1. The active layer was formed to have a thickness of approximately 60 nm.

A second buffer layer of the device 1 is a layer corresponding to an electron-transport layer and an electron-injection layer of the light-emitting element.

First, a layer corresponding to an electron-transport layer was formed in the following manner: 2-[3'-(dibenzothiophen-4-yl)biphenyl-3-yl]dibenzo[f,h]quinoxaline (abbreviation: 2mDBTBPDBq-II) and 2,9-bis(naphthalen-2-yl)-4,7-diphenyl-1,10-phenanthroline (abbreviation: NBPhen) were sequentially deposited by evaporation to have thicknesses of approximately 10 nm and approximately 10 nm, respectively.

Next, a layer corresponding to an electron-injection layer was formed to have a thickness of approximately 1 nm by evaporating lithium fluoride (LiF).

A second electrode of the device 1 was formed in the following manner: silver (Ag) and magnesium (Mg) was co-evaporated with a volume ratio of 10:1 to have a thickness of approximately 9 nm; and then indium tin oxide (ITO) was deposited by a sputtering method to have a thickness of approximately 40 nm.

In this manner, the device 1 was fabricated.

Comparative Device 2

As shown in Table 1, a first electrode of the comparative device 2 has a three-layer structure including a titanium film with a thickness of approximately 50 nm, an aluminum film with a thickness of approximately 200 nm, and a titanium film with a thickness of approximately 5 nm.

A first buffer layer of the comparative device 2 was formed to have a thickness of approximately 10 nm by evaporating fullerene ($C_{70}$).

An active layer of the comparative device 2 was formed by co-evaporating fullerene ($C_{70}$) and DBP with a weight ratio of $C_{70}$:DBP=9:1 as in the case of the device 1. The active layer was formed to have a thickness of approximately 60 nm.

A second buffer layer of the comparative device 2 was formed to have a thickness of approximately 60 nm by evaporating molybdenum oxide.

A second electrode of the comparative device 2 was formed to have a thickness of approximately 40 nm using ITO by a sputtering method.

In this manner, the comparative device 2 was fabricated.

Current Density—Voltage Characteristics

Figure 36:
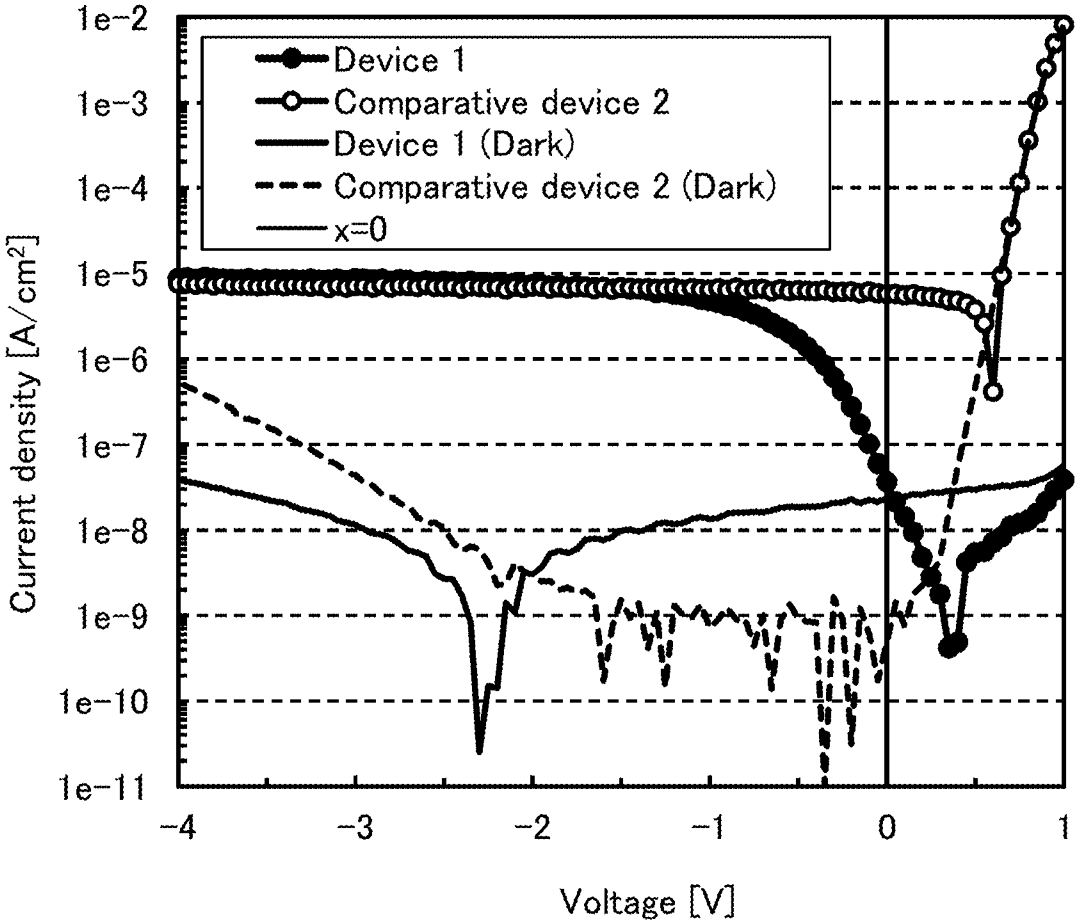
FIG. 36 is a graph showing current density-voltage characteristics of devices in Example 3.

FIG. 36 shows evaluation results of current density-voltage characteristics of the device 1 and the comparative device 2. In FIG. 36, the vertical axis represents voltage (V) and the horizontal axis represents current density (A/$cm^2$).

A light-receiving region of the light-receiving element in this example was 2 mm×2 mm.

The light-receiving element in this example was irradiated with light with a wavelength λ=550 nm at 12.5 μW/$cm^2$, and the current density-voltage characteristics were measured. Note that the applied voltage is a value in the case where a bias usually applied to an EL element is positive. In other words, the positive bias is applied when the first electrode side has a high potential and the second electrode side has a low potential.

As shown in FIG. 36, when the voltage was lower than or equal to −2 V, it was found that photocurrent values of the device 1 and the comparative device 2 were equal to each other and favorable values were obtained. It was also found that the device 1 has a lower dark current (Dark) than the comparative device 2.

As described above, in this example, favorable current density-voltage characteristics were able to be obtained by using the light-receiving element having a structure in common with the light-emitting element.

Note that as described in Example 2 above, it was confirmed that imaging was favorably performed in the display device of one embodiment of the present invention fabricated by employing the structure of the device 1 of this example to the organic photodiode OPD.

Example 4

In this example, evaluation results of the characteristics of fabricated light-receiving elements will be described.

In this example, a device 3, a device 4, a device 5, and a device 6 were fabricated as the light-receiving elements. A structure of the device 1 is in common with that of a light-emitting element, which is a stacked structure that can be fabricated by replacing a light-emitting layer of the light-emitting element with an active layer of the light-receiving element.

Table 2 shows specific structures of the devices used in this example. Note that the structures of the devices in this example are similar to the structure of the device 1 in Example 3, and for the fabrication method, Example 3 can be referred to. Chemical formulae of materials used in this example are shown below.

TABLE 2

| | First electrode | First buffer layer | Active layer | Second buffer layer | | | Second electrode | |
|---|---|---|---|---|---|---|---|---|
| Device | APC\ITSO 100\40 nm | * | $C_{70}$:DBP = 9:1 60 nm | 2 mDBT BPDBq-II 10 nm | NBPhen 10 nm | LiF 1 nm | Ag:Mg (=10:1) 10 nm | ITO 40 nm |

| * | First buffer layer | |
|---|---|---|
| Device 3 | PCPPn:MoOx (=2:1) 15 nm | PCPPn 40 nm |
| Device 4 | PCPPn:MoOx (=2:1) 15 nm | BPAFLP 40 nm |
| Device 5 | PCPPn:MoOx (=2:1) 15 nm | DBT3P-II 40 nm |
| Device 6 | BBABnf:ALD-MP001Q (=10:1) 15 nm | BBABnf 40 nm |

[Chemical Formula 2]

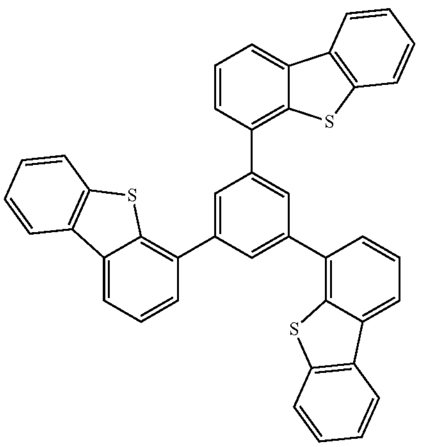

DBT3P-II

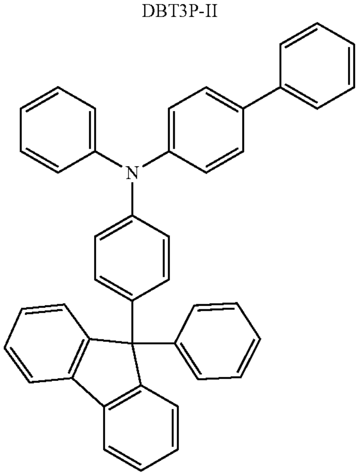

BPAFLP

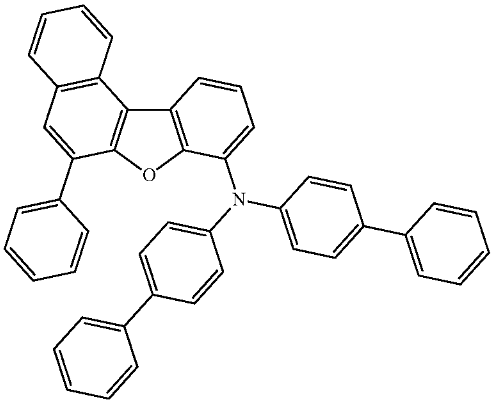

BBABnf

As shown in Table 2, the four devices in this example have different materials used for the first buffer layer. In each of the devices, the first buffer layer includes two layers.

In each of the device 3, the device 4, and the device 5, a first layer of the first buffer layer was formed by co-evaporating PCPPn and molybdenum oxide with a weight ratio of PCPPn:molybdenum oxide=2:1. The first layer was formed to have a thickness of approximately 15 nm.

A second layer of the first buffer layer of the device 3 was formed to have a thickness of approximately 40 nm by evaporating PCPPn.

A second layer of the first buffer layer of the device 4 was formed to have a thickness of approximately 40 nm by evaporating 4-phenyl-4'-(9-phenylfluoren-9-yl)triphenylamine (abbreviation: BPAFLP).

A second layer of the first buffer layer of the device 5 was formed to have a thickness of approximately 40 nm by evaporating 1,3,5-tri(dibenzothiophen-4-yl)-benzene (abbreviation: DBT3P-II).

A first layer of a first buffer layer of the device 6 was formed by co-evaporating N,N-bis(4-biphenyl)-6-phenylbenzo[b]naphtho[1,2-d]furan-8-amine (abbreviation: BBABnf) and ALD-MP001Q (produced by Analysis Atelier Corporation, material serial No. 1S20180314) with a weight ratio of BBABnf:ALD-MP001Q=10:1. The first layer was formed to have a thickness of approximately 15 nm. ALD-MP001Q has an electron-accepting property with respect to BBABnf.

A second layer of the first buffer layer of the device 6 was formed to have a thickness of approximately 40 nm by evaporating BBABnf.

Current Density—Voltage Characteristics

Figure 37A:
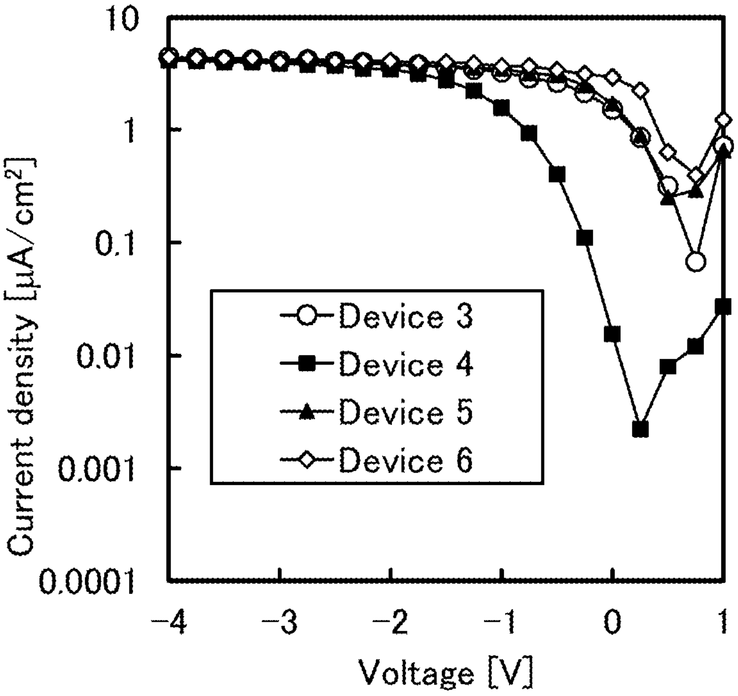
FIG. 37A and FIG. 37B are graphs showing current density-voltage characteristics of devices in Example 4.
Figure 37B:
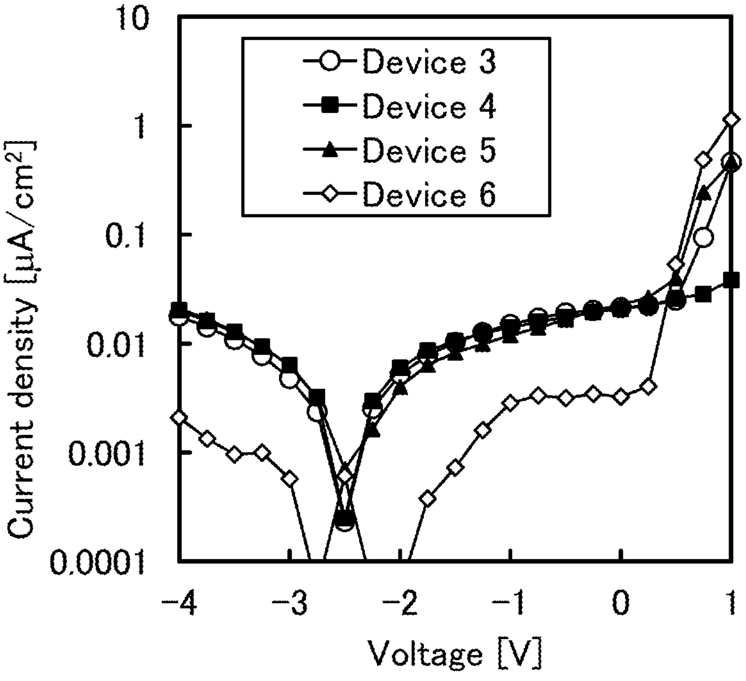

FIG. 37A and FIG. 37B show evaluation results of current density-voltage characteristics of the device 3 to the device 6. In FIG. 37A and FIG. 37B, the vertical axis represents voltage (V) and the horizontal axis represents current density ($\mu A/cm^2$).

A light-receiving region of the light-receiving element in this example was 2 mm×2 mm.

The light-receiving element in this example was irradiated with light with a wavelength was 550 nm at 12.5 $\mu W/cm^2$, and the current density-voltage characteristics were measured. FIG. 37A shows the measurement results. Note that the applied voltage is a value in the case where a bias usually applied to an EL element is positive. In other words, the positive bias is applied when the first electrode side has a high potential and the second electrode side has a low potential.

Moreover, current density-voltage characteristics were measured also under a condition where the light-receiving element was not irradiated with light (0 $\mu W/cm^2$). FIG. 37B shows the measurement results.

As shown in FIG. 37A and FIG. 37B, a change in the material of the first buffer layer causes a difference in the driving voltage of the light-receiving element; however, there was no significant change in saturation current. These revealed that the emission efficiency of the light-receiving element fabricated in this example is hardly affected by the materials of the first buffer layer.

Wavelength Dependence of External Quantum Efficiency

Figure 38A:
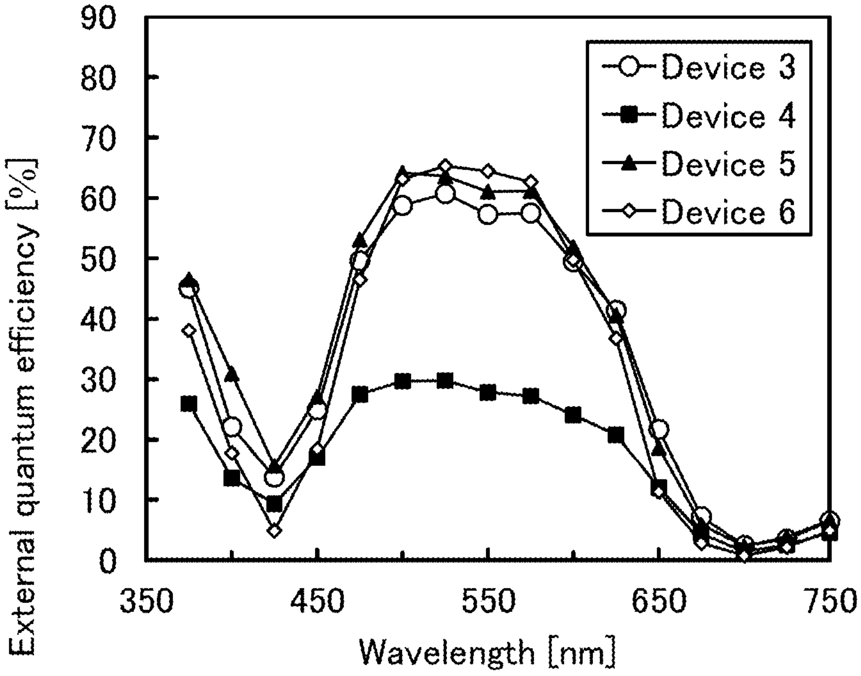
FIG. 38A and FIG. 38B are graphs showing wavelength dependence of external quantum efficiency of devices in Example 4.
Figure 38B:
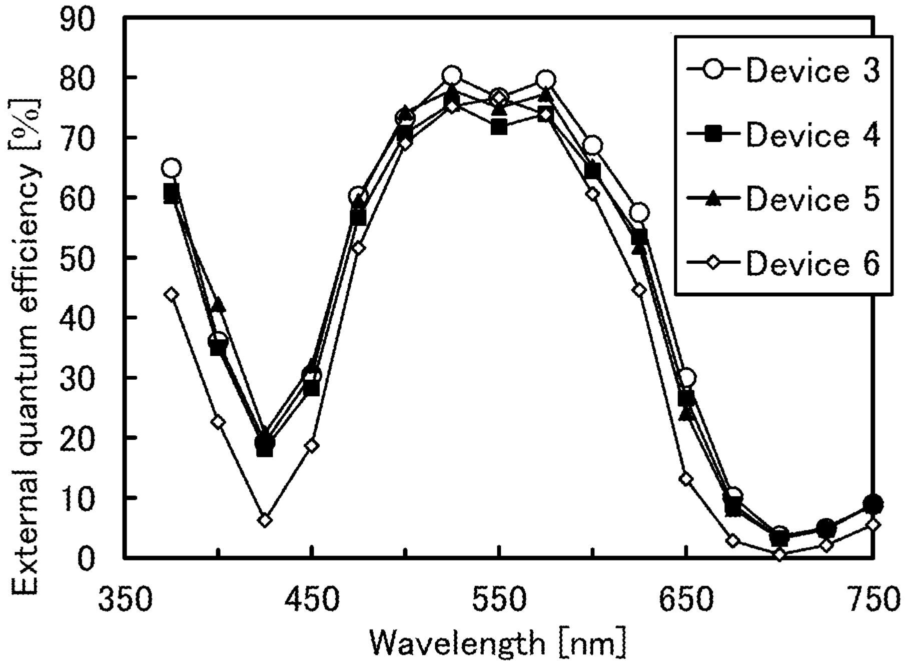

FIG. 38A and FIG. 38B show evaluation results of wavelength dependence of external quantum efficiency of the device 3 to the device 6. In FIG. 38A and FIG. 38B, the vertical axis represents external quantum efficiency (%) and the horizontal axis represents wavelength (nm).

The light-receiving element in this example was irradiated with light with a wavelength of 375 nm to 750 nm every 25 nm at 12.5 $\mu W/cm^2$, and the wavelength dependence of external quantum efficiency was obtained. FIG. 38A shows results at a voltage of −1 V and FIG. 38B shows results at a voltage of −4 V.

As shown in FIG. 38A and FIG. 38B, there was no significant difference in the external quantum efficiency even when the material of the first buffer layer was changed.

As described above, from the results of this example, a light-receiving element with favorable characteristics was able to be obtained regardless of the materials of the first buffer layer. Thus, it was found that the light-receiving element used in the display device of one embodiment of the present invention can have a structure in common with a variety of light-emitting elements and can obtain favorable characteristics.

Example 5

In this example, evaluation results of the characteristics of a fabricated light-receiving element will be described.

A structure of the light-receiving element fabricated in this example is in common with that of a light-emitting element, which is a stacked structure that can be fabricated by replacing a light-emitting layer of the light-emitting element with an active layer of the light-receiving element.

The light-receiving element fabricated in this example has a structure similar to that of the device 1 fabricated in Example 3 (see Table 1).

In the evaluation of this example, the light-receiving element in this example was irradiated with light with a wavelength of 375 nm to 750 nm every 25 nm at 12.5 μW/cm$^2$, and the wavelength dependence of external quantum efficiency was obtained. The voltage was set to −4 V. In addition, the temperature dependence of external quantum efficiency was calculated under the seven conditions where the measurement was performed for every 10° C. in a range from 20° C. to 80° C.

Figure 39:
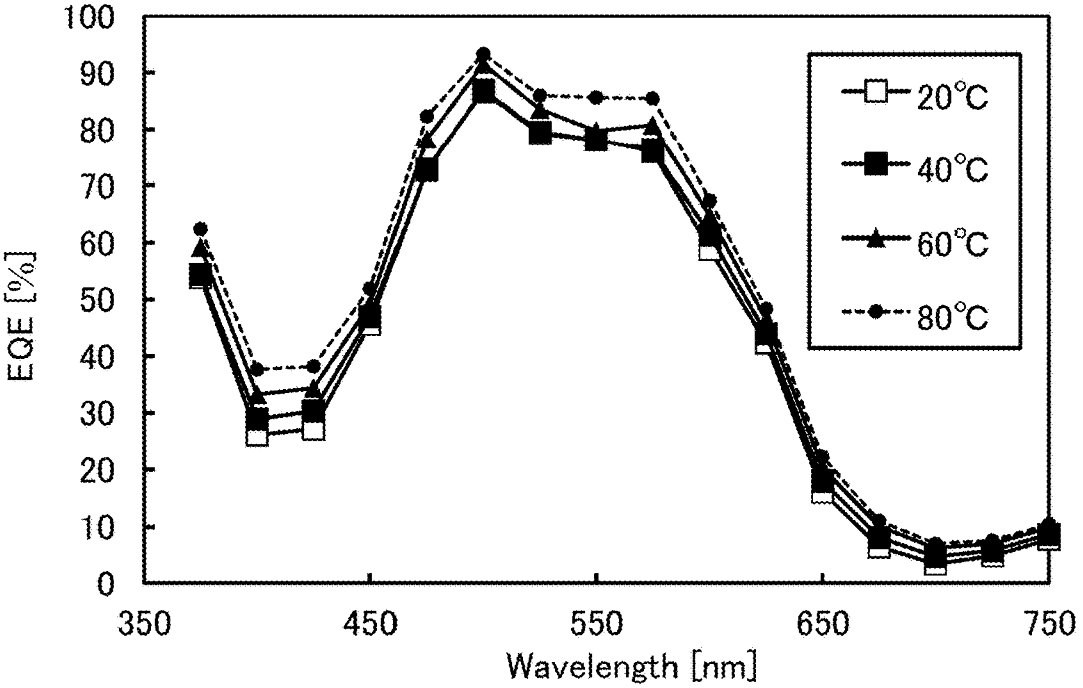
FIG. 39 is a graph showing wavelength dependence of external quantum efficiency of a device in Example 5.
Figure 40:
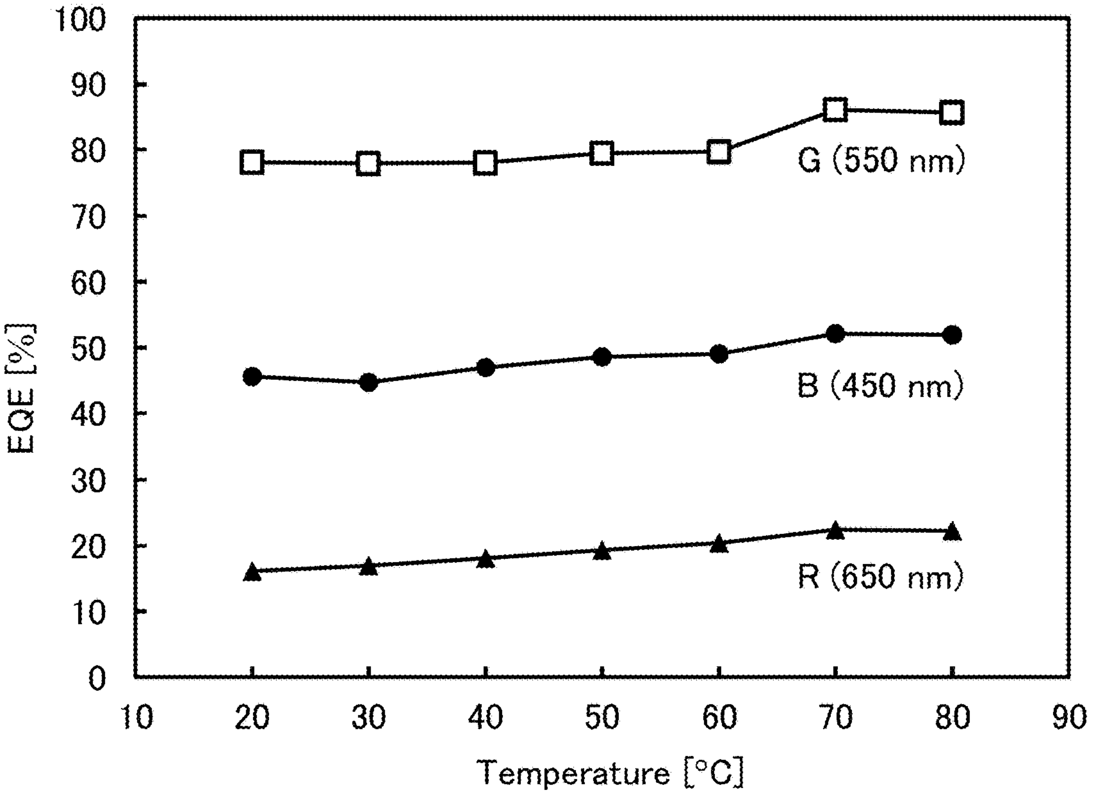
FIG. 40 is a graph showing temperature dependence of external quantum efficiency of a device in Example 5.

FIG. 39 shows the wavelength dependence of light sensitivity of the light-receiving element. FIG. 40 shows the temperature dependence of the light sensitivity of the light-receiving element. Note that in FIG. 39 and FIG. 40, the vertical axis represents external quantum efficiency (EQE).

From the results in this example, it was confirmed that the external quantum efficiency of the light-receiving element in this example tends to increase gradually as the temperature increases. In a range from 20° C. to 80° C., normal operation of the light-receiving element in this example was observed without rapid change of efficiency.

As described above, in this example, a light-receiving element having a structure in common with a structure of a light-emitting element (organic EL element) was fabricated and confirmed to be usable in a wide temperature range.

Example 6

In this example, evaluation results of the characteristics of a fabricated light-receiving element will be described.

A structure of the light-receiving element fabricated in this example is in common with that of a light-emitting element, which is a stacked structure that can be fabricated by replacing a light-emitting layer of the light-emitting element with an active layer of the light-receiving element.

Table 3 shows specific structures of the light-receiving element used in this example. Although the light-receiving elements fabricated in Example 3 to Example 5 (see Table 1 and Table 2) each have a structure in which light is received from the second electrode side, the light-receiving element fabricated in this example receives light from a first electrode side.

The light-receiving element fabricated in this example is different from the device 1 fabricated in Example 3 (see Table 1) mainly in that the first electrode is an indium tin oxide (ITO) film with a thickness of approximately 70 nm and a second electrode is an aluminum (Al) film with a thickness of approximately 150 nm. The materials used for a first buffer layer, an active layer, and a second buffer layer are the same as those in the device 1; in contrast, the thicknesses of the layers were different from the conditions of the device 1.

TABLE 3

| First electrode | First buffer layer | | Active layer | Second buffer layer | | | Second electrode |
|---|---|---|---|---|---|---|---|
| ITO 70 nm | PCPPn:MoOx (=2:1) 20 nm | PCPPn 20 nm | $C_{70}$:DBP = 9:1 50 nm | 2 mDBTBPDBq-II 20 nm | NBPhen 15 nm | LiF 1 nm | Al 150 nm |

In the evaluation of this example, the light-receiving element in this example was irradiated with light with a wavelength of 375 nm to 900 nm at 12.5 μW/cm$^2$, and the wavelength dependence of external quantum efficiency was obtained. Note that the irradiation with the light was performed every 25 nm when the wavelength is in a range from 375 nm to 750 nm and every 10 nm when the wavelength is in a range from 750 nm to 900 nm. The irradiation with the light was performed at every 0.25 V in a range from −6 V to 1 V.

Figure 41:
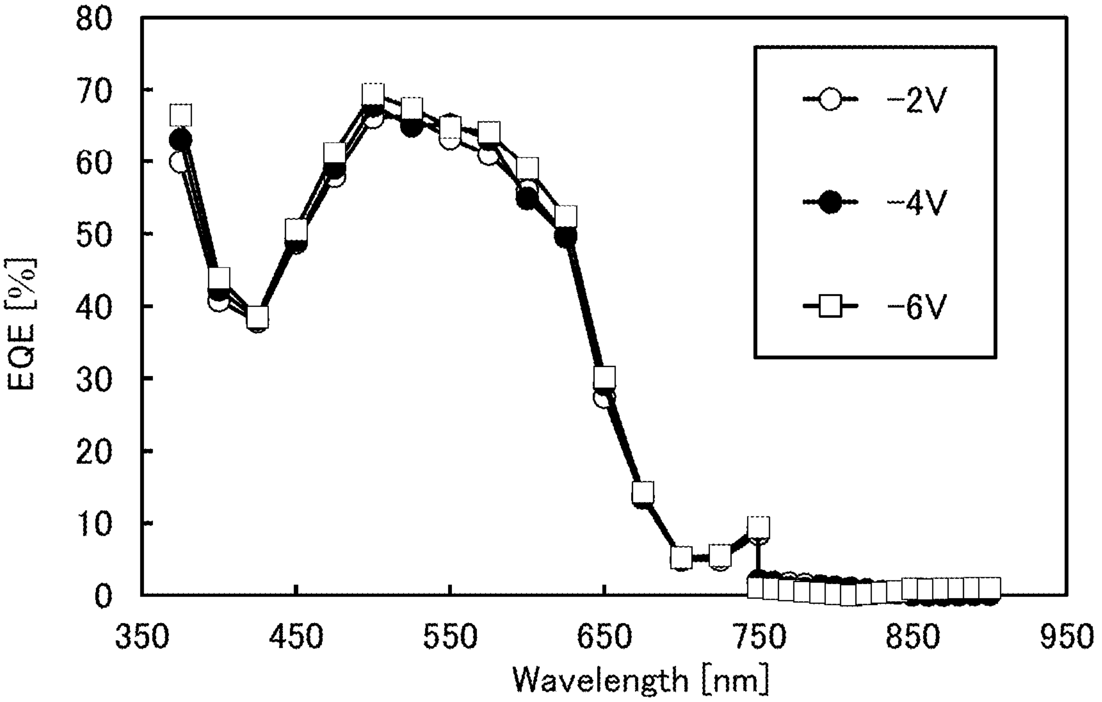
FIG. 41 is a graph showing wavelength dependence of external quantum efficiency of a device in Example 6.
Figure 42:
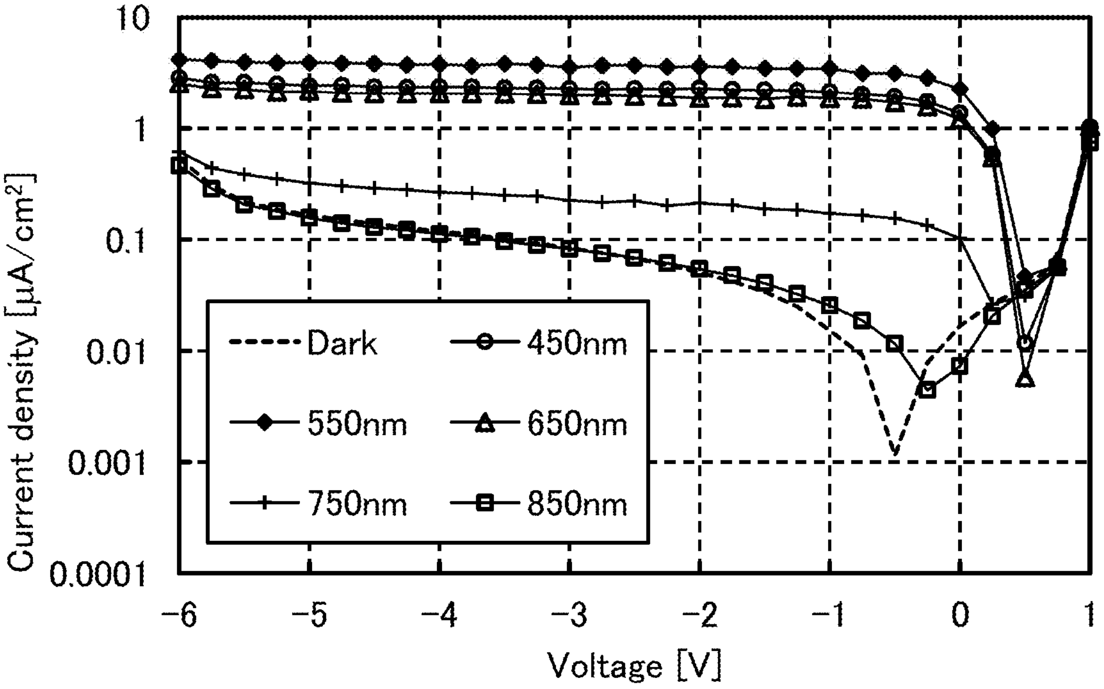
FIG. 42 is a graph showing current density-voltage characteristics of a device in Example 6.

FIG. 41 shows the wavelength dependence of light sensitivity of the light-receiving element. Note that in FIG. 41, the vertical axis represents external quantum efficiency (EQE). FIG. 42 shows the current density-voltage characteristics of the light-receiving element.

In this example, materials for a visible light sensor were used for the active layer. From the results in this example, it was confirmed that a visible light (greater than or equal to 450 nm and less than or equal to 650 nm) region has light sensitivity. It was confirmed that the light-receiving element in this example operates normally as a visible light sensor.

As described above, in this example, the light-receiving element having a structure in common with a structure of the light-emitting element (organic EL element) and a structure in which light is received from the first electrode side was fabricated, and favorable characteristics thereof were able to be obtained.

Example 7

In this example, evaluation results of the characteristics of a fabricated light-receiving element will be described.

A structure of the light-receiving element fabricated in this example is in common with that of a light-emitting element, which is a stacked structure that can be fabricated by replacing a light-emitting layer of the light-emitting element with an active layer of the light-receiving element.

Table 4 shows specific structures of the light-receiving element used in this example. The light-receiving element fabricated in this example receives light from a first electrode side. The light-receiving element fabricated in this example has a structure similar to that of the light-receiving element fabricated in Example 6 (see Table 3) except for the thicknesses of some of the layers.

TABLE 4

| First electrode | First buffer layer | | Active layer | Second buffer layer | | | Second electrode |
|---|---|---|---|---|---|---|---|
| ITO 70 nm | PCPPn:MoOx (=2:1) 15 nm | PCPPn 40 nm | $C_{70}$:DBP = 9:1 60 nm | 2 mDBT BPDBq-II 10 nm | NBPhen 10 nm | LiF 1 nm | Al 150 nm |

In this example, a continuous driving test was performed while the fabricated light-receiving element was irradiated with light and illuminance dependence of reliability was evaluated. The continuous driving test was performed under the three conditions of light irradiation (hereinafter also referred to as stress illuminance): 20 klx, 40 klx, and 100 klx; voltage was −4 V; temperature was 25° C.; driving time was 210 hr; and a light source was a white LED. Note that a plurality of elements were evaluated under the same conditions. Eleven elements (n=11) were evaluated for 20 klx; 5 elements (n=5), 40 klx; and 6 elements (n=6), 100 klx.

Figure 43A:
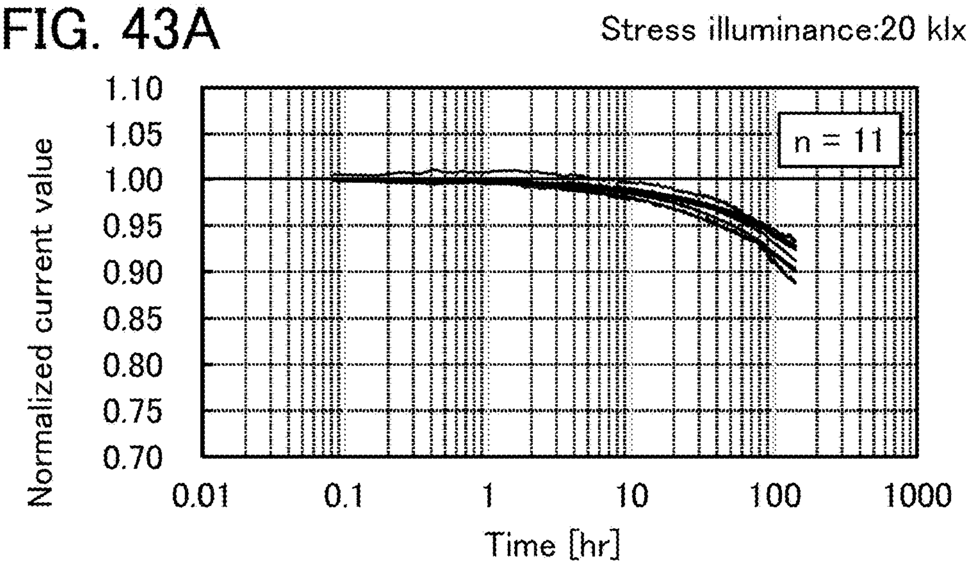
FIG. 43A to FIG. 43C are graphs showing results of reliability tests of a device in Example 7.
Figure 43B:
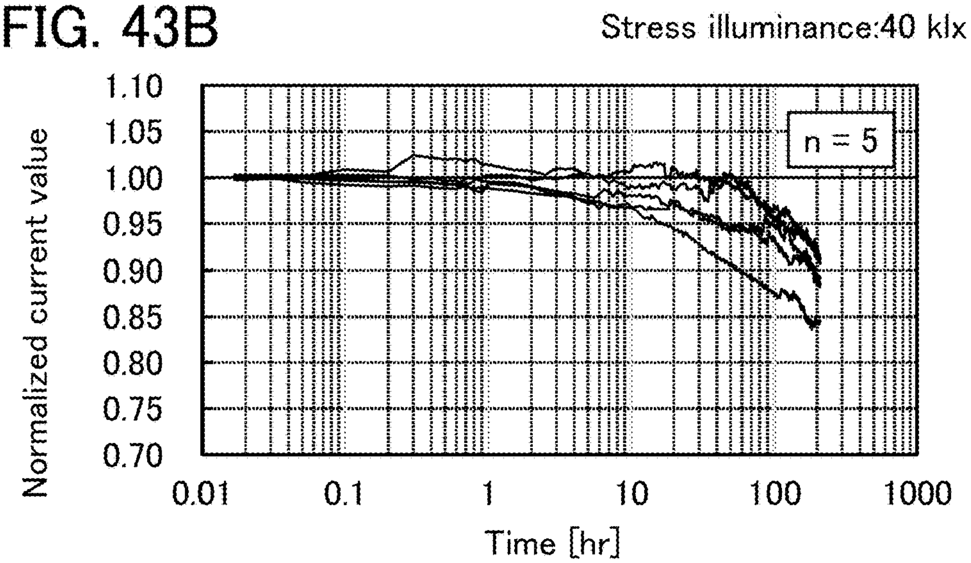
Figure 43C:
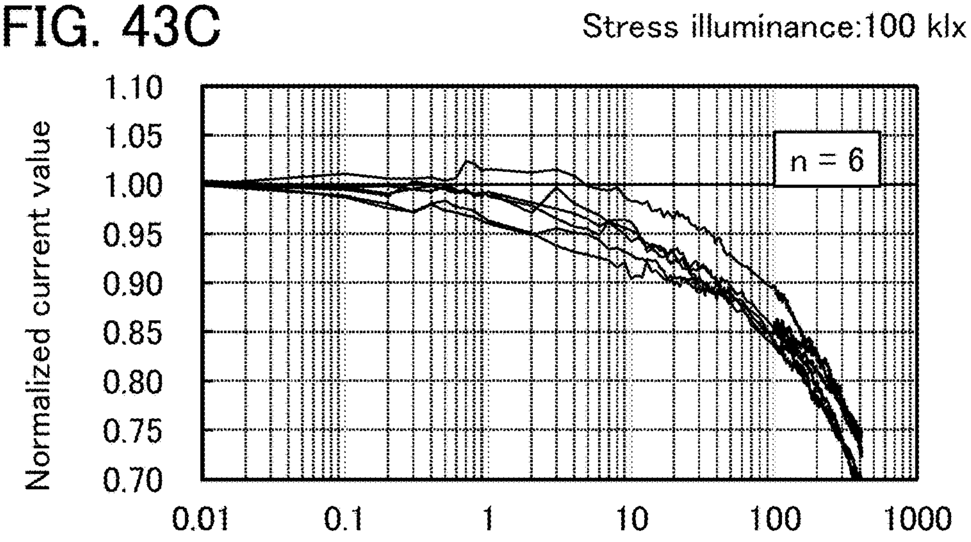

FIG. 43A to FIG. 43C show normalized current value-time characteristics of the light-receiving element. FIG. 43A shows the results at a stress illuminance of 20 klx, FIG. 43B shows the results at a stress illuminance of 40 klx, and FIG. 43C shows the results at a stress illuminance of 100 klx.

Figure 44:
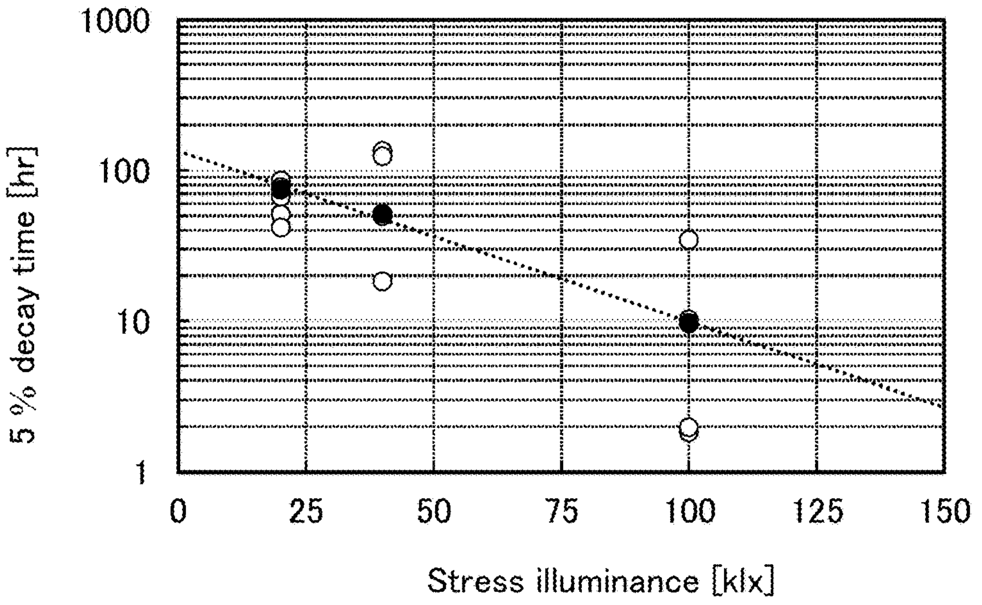
FIG. 44 is a graph showing results of a reliability test of devices in Example 7.

FIG. 44 shows a relation between the stress illuminance and the time until when the current value is decreased by 5%.

FIG. 43 and FIG. 44 reveal that as the stress illuminance increased, a reduction in current tends to be promoted in continuous driving.

Figure 45:
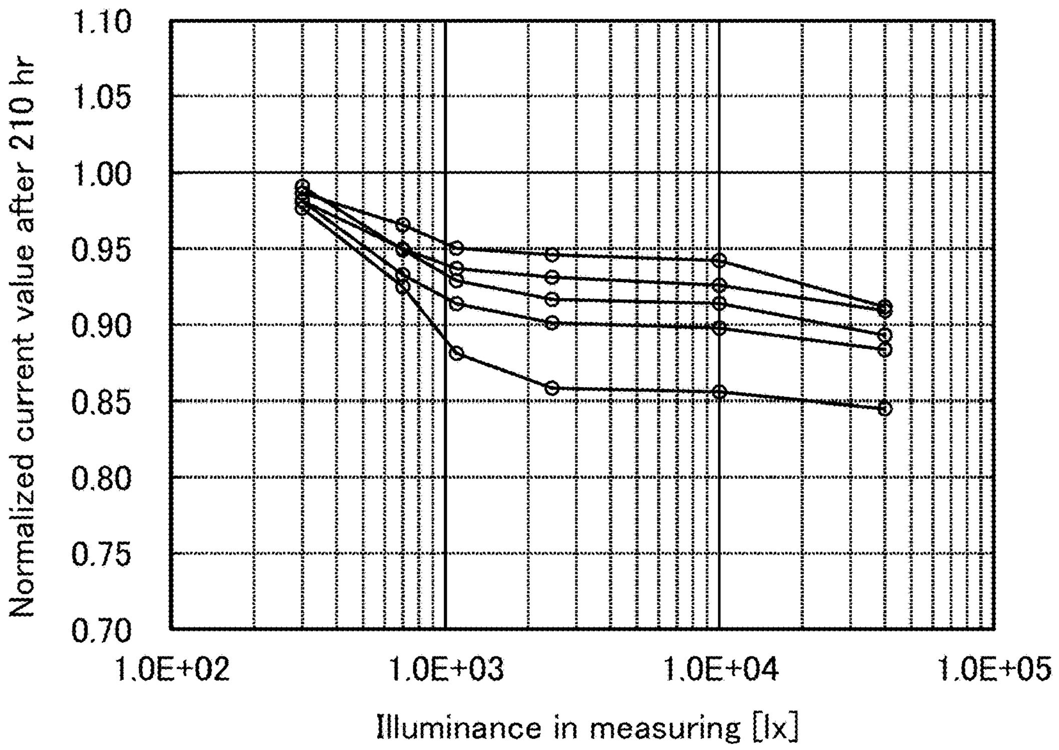
FIG. 45 is a graph showing results of a reliability test of devices in Example 7.

Next, a current change of the light-receiving element before and after the continuous driving test was observed. FIG. 45 shows normalized current value-measured illuminance characteristics after the continuous driving test. With the current value before the continuous driving test set to 1, a normalized current value after the continuous driving test was performed under the condition where the stress illuminance was 40 klx was obtained. Under the same condition, 5 elements (n=5) were evaluated.

FIG. 45 shows that the current value changes largely before and after the continuous driving test in a region with high measured illuminance, whereas the current value does not change largely before and after the continuous driving test in a region with low measured illuminance (especially, lower than or equal to 1 klx). This means that in the light-receiving element in this example, the characteristics in a region with low measured illuminance are unlikely to change compared to the characteristics in a region with high measured illuminance even when deterioration is caused by illuminance stress. It was suggested that the light-receiving element in this example has a favorable reliability in a region having low measured illuminance and thus can be favorably used for applications with a relatively low illuminance in measuring such as fingerprint imaging.

REFERENCE NUMERALS

C1: capacitor, C2: capacitor, G1: wiring, G2: wiring, L1: shortest distance, L2: shortest distance, L3: thickness, L4: total thickness, M1: transistor, M2: transistor, M3: transistor, M4: transistor, M5: transistor, M6: transistor, M7: transistor, OUT1: wiring, OUT2: wiring, PD: light-receiving element, PIX1: pixel circuit, PIX2: pixel circuit, V0: wiring, V1: wiring, V2: wiring, V3: wiring, V4: wiring, V5: wiring, 10A: display device, 10B: display device, 10C: display device, 10D: display device, 10E: display device, 10F: display device, 10G: display device, 10H: display device, 10J: display device, 10K: display device, 10L: display device, 10M: display device, 10N: display device, 10P: display device, 10Q: display device, 21: light emission, 21B: light, 21G: light, 21R: light, 22: light, 23*a*: stray light, 23*b*: stray light, 23*c*: stray light, 23*d*: stray light, 30K: evaluation device, 30N: evaluation device, 30P: evaluation device, 30Q: evaluation device, 31: pixel, 41: transistor, 42: transistor, 42B: transistor, 42G: transistor, 42R: transistor, 43: drive circuit, 44: drive circuit, 50A: display device, 50B: display device, 51: substrate, 52: finger, 53: layer including a light-receiving element, 55: layer including a transistor, 57: layer including a light-emitting element, 59: substrate, 100A: display device, 100B: display device, 100C: display device, 110: light-receiving element, 112: common layer, 113: light-emitting layer, 114: common layer, 114*a*: common layer, 114*b*: common layer, 115: common electrode, 116: protective layer, 116*a*: inorganic insulating layer, 116*b*: organic insulating layer, 116*c*: inorganic insulating layer, 142: adhesive layer, 143: space, 146: lens array, 149: lens, 151: substrate, 152: substrate, 153: substrate, 154: substrate, 155: adhesive layer, 156: adhesive layer, 157: insulating layer, 158: light shielding layer, 159: resin layer, 159*p*: opening, 160: space, 162: display portion, 164: circuit, 165: wiring, 166: conductive layer, 167: conductive layer, 168: conductive layer, 169B: conductive layer, 169G: conductive layer, 169R: conductive layer, 172: FPC, 173: IC, 181: pixel electrode, 182: buffer layer, 183: active layer, 184: buffer layer, 186: hole-transport layer, 190: light-emitting element, 190B: light-emitting element, 190G: light-emitting element, 190R: light-emitting element, 191: pixel electrode, 191B: pixel electrode, 191G: pixel electrode, 191R: pixel electrode, 192: buffer layer, 193: light-emitting layer, 193B: light-emitting layer, 193G: light-emitting layer, 193R: light-emitting layer, 194: buffer layer, 196B: hole-transport layer, 196G: hole-transport layer, 196R: hole-transport layer, 197: optical adjustment layer, 197B: optical adjustment layer, 197G: optical adjustment layer, 201: transistor, 202: transistor, 203: transistor, 204: connection portion, 205: transistor, 206: transistor, 207: transistor, 208: transistor, 209: transistor, 210: transistor, 211: insulating layer, 212: insulating layer, 213: insulating layer, 214: insulating layer, 214*a*: insulating layer, 214*b*: insulating layer, 215: insulating layer, 216: partition wall, 217: partition wall, 219*a*: light shielding layer, 219*b*: spacer, 219*c*: sidewall, 220: gap, 221: conductive layer, 222*a*: conductive layer, 222*b*: conductive layer, 223: conductive layer, 225: insulating layer, 228: region, 231: semiconductor layer, 230: region, 231*i*: channel formation region, 231*n*: low-resistance region, 242: connection layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516:

IC, 6517: printed circuit, 6518: battery, 7000: display portion, 7100: television device, 7101: housing, 7103: stand, 7111: separate remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: cylindrical pillar, 7411: information terminal, 9000: housing, 9001: display portion, 9003: speaker, 9005: operation key, 9006: connect terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:

a first substrate;

a second substrate;

a light-receiving element;

a light-emitting element; and a resin layer, wherein the light-receiving element, the light-emitting element, and the resin layer are each positioned between the first substrate and the second substrate, wherein the light-receiving element comprises a first pixel electrode over the first substrate, an active layer over the first pixel electrode, and a common electrode over the active layer, wherein the light-emitting element comprises a second pixel electrode over the first substrate, a light-emitting layer over the second pixel electrode, and the common electrode over the light-emitting layer, wherein the resin layer is provided between the light-receiving element and the light-emitting element, wherein a cross-sectional shape of the resin layer comprises an inverse tapered shape, and wherein the common electrode comprises a portion overlapping with the resin layer.

2. The display device according to claim 1, further comprising an adhesive layer, wherein the adhesive layer is positioned between the common electrode and the second substrate.

3. The display device according to claim 1, further comprising a common layer, wherein the common layer comprises a portion positioned between the first pixel electrode and the common electrode, and a portion positioned between the second pixel electrode and the common electrode.

4. The display device according to claim 1, wherein the resin layer is configured to absorb at least part of light emitted from the light-emitting element.

5. The display device according to claim 1, wherein the light-receiving element is surrounded by the resin layer in a top view of the display device.

6. The display device according to claim 1, wherein the active layer comprises an organic compound.

7. A display device comprising:

a first substrate;

a second substrate;

a light-receiving element;

a first light-emitting element;

a second light-emitting element; and a resin layer, wherein the light-receiving element, the first light-emitting element, the second light-emitting element, and the resin layer are each positioned between the first substrate and the second substrate, wherein the light-receiving element comprises a first pixel electrode over the first substrate, an active layer over the first pixel electrode, and a common electrode over the active layer, wherein the first light-emitting element comprises a second pixel electrode over the first substrate, a first light-emitting layer over the second pixel electrode, and the common electrode over the first light-emitting layer, wherein the second light-emitting element comprises a third pixel electrode over the first substrate, a second light-emitting layer over the third pixel electrode, and the common electrode over the second light-emitting layer, wherein the first light-emitting element is provided adjacent to the resin layer, wherein the second light-emitting element is provided adjacent to the resin layer, wherein the resin layer is provided between the light-receiving element and the first light-emitting element, wherein the resin layer is provided between the light-receiving element and the second light-emitting element, wherein a cross-sectional shape of the resin layer comprises an inverse tapered shape, and wherein the common electrode comprises a portion overlapping with the resin layer.

8. The display device according to claim 7, further comprising an adhesive layer, wherein the adhesive layer is positioned between the common electrode and the second substrate.

9. The display device according to claim 7, further comprising a common layer, wherein the common layer comprises a portion positioned between the first pixel electrode and the common electrode, a portion positioned between the second pixel electrode and the common electrode, and a portion positioned between the third pixel electrode and the common electrode.

10. The display device according to claim 7, wherein the resin layer is configured to absorb at least part of light emitted from the first light-emitting element.

11. The display device according to claim 7, wherein the light-receiving element is surrounded by the resin layer in a top view of the display device.

12. The display device according to claim 7, wherein the active layer comprises an organic compound.

13. A display device comprising:

a first substrate;

a second substrate;

a light-receiving element;

a first light-emitting element;

a second light-emitting element; and a resin layer, wherein the light-receiving element, the first light-emitting element, the second light-emitting element, and the resin layer are each positioned between the first substrate and the second substrate, wherein the light-receiving element comprises a first pixel electrode over the first substrate, an active layer over the first pixel electrode, and a common electrode over the active layer, wherein the first light-emitting element comprises a second pixel electrode over the first substrate, a first light-emitting layer over the second pixel electrode, and the common electrode over the first light-emitting layer, wherein the second light-emitting element comprises a third pixel electrode over the first substrate, a second light-emitting layer over the third pixel electrode, and the common electrode over the second light-emitting layer, wherein the first light-emitting element is provided adjacent to the resin layer, wherein the second light-emitting element is provided adjacent to the resin layer, wherein the resin layer is provided between the light-receiving element and the first light-emitting element, wherein the resin layer is not provided between the light-receiving element and at least part of the second light-emitting element, wherein a cross-sectional shape of the resin layer comprises an inverse tapered shape, and wherein the common electrode comprises a portion overlapping with the resin layer.

14. The display device according to claim 13, further comprising an adhesive layer, wherein the adhesive layer is positioned between the common electrode and the second substrate.

15. The display device according to claim 13, further comprising a common layer, wherein the common layer comprises a portion positioned between the first pixel electrode and the common electrode, a portion positioned between the second pixel electrode and the common electrode, and a portion positioned between the third pixel electrode and the common electrode.

16. The display device according to claim 13, wherein the resin layer is configured to absorb at least part of light emitted from the first light-emitting element.

17. The display device according to claim 13, wherein the light-receiving element is surrounded by the resin layer in a top view of the display device.

18. The display device according to claim 13, wherein the active layer comprises an organic compound.

* * * * *